US009188869B2

(12) United States Patent
Seshimo et al.

(10) Patent No.: US 9,188,869 B2
(45) Date of Patent: Nov. 17, 2015

(54) METHOD OF PRODUCING STRUCTURE CONTAINING PHASE-SEPARATION STRUCTURE, METHOD OF FORMING PATTERN, AND METHOD OF FORMING FINE PATTERN

(71) Applicant: Tokyo Ohka Kogyo Co., Ltd., Kawasaki-shi (JP)

(72) Inventors: Takehiro Seshimo, Kawasaki (JP); Takahiro Dazai, Kawasaki (JP); Takaya Maehashi, Kawasaki (JP); Ken Miyagi, Kawasaki (JP); Yoshiyuki Utsumi, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 0 days.

(21) Appl. No.: 14/445,556

(22) Filed: Jul. 29, 2014

(65) Prior Publication Data
US 2015/0034595 A1 Feb. 5, 2015

(30) Foreign Application Priority Data

Jul. 31, 2013 (JP) ................................ 2013-159897

(51) Int. Cl.
G03F 7/40 (2006.01)
G03F 7/20 (2006.01)
G03F 7/42 (2006.01)
C08L 3/00 (2006.01)
C08L 33/12 (2006.01)

(52) U.S. Cl.
CPC ... G03F 7/20 (2013.01); C08L 3/00 (2013.01); G03F 7/40 (2013.01); G03F 7/427 (2013.01); C08L 33/12 (2013.01)

(58) Field of Classification Search
CPC ........ C08L 53/00; C08L 53/005; C08L 33/12; C08L 25/02
See application file for complete search history.

(56) References Cited

U.S. PATENT DOCUMENTS

| 7,378,480 | B2 * | 5/2008 | Sato et al. ..................... 526/334 |
| 8,211,969 | B2 * | 7/2012 | Zou et al. ..................... 524/496 |
| 2009/0189317 | A1 | 7/2009 | Sato et al. |
| 2009/0197204 | A1 | 8/2009 | Shiono et al. |
| 2009/0263631 | A1 | 10/2009 | Sakamoto et al. |
| 2009/0317743 | A1 | 12/2009 | Shiono et al. |
| 2010/0310985 | A1 | 12/2010 | Mori et al. |
| 2011/0117499 | A1 | 5/2011 | Matsumiya et al. |
| 2014/0360975 | A1 * | 12/2014 | Hustad et al. .................. 216/49 |

FOREIGN PATENT DOCUMENTS

| JP | A-2007-072374 | 3/2007 |
| JP | A-2007-329276 | 12/2007 |

(Continued)

OTHER PUBLICATIONS

Hinsberg et al, "Self-Assembling Materials for Lithographic Patterning: Overview, Status and Moving Forward," Proceedings of SPIE, vol. 7637, 76370G-1 (2010).

*Primary Examiner* — Duy Deo
(74) *Attorney, Agent, or Firm* — Knobbe Martens Olson & Bear LLP

(57) ABSTRACT

A method of forming a structure containing a phase-separated structure, the method including: a step of forming a layer containing a block copolymer having a plurality of blocks bonded and a purity of 98% or more, and a step of phase-separating the layer containing the block copolymer.

11 Claims, 2 Drawing Sheets

(56) References Cited

FOREIGN PATENT DOCUMENTS

| | | |
|---|---|---|
| JP | A-2008-036491 | 2/2008 |
| JP | A-2008-246876 | 10/2008 |
| JP | A-2009-025723 | 2/2009 |
| JP | A-2010-002870 | 1/2010 |
| JP | A-2010-032994 | 2/2010 |
| JP | A-2010-277043 | 12/2010 |
| JP | A-2011-013569 | 1/2011 |
| JP | A-2011-128226 | 6/2011 |

\* cited by examiner

US 9,188,869 B2

METHOD OF PRODUCING STRUCTURE CONTAINING PHASE-SEPARATION STRUCTURE, METHOD OF FORMING PATTERN, AND METHOD OF FORMING FINE PATTERN

TECHNICAL FIELD

The present invention relates to a method of producing a structure containing a phase-separation structure, a method of forming a pattern, and a method of forming a fine pattern.

Priority is claimed on Japanese Patent Application No. 2013-159897, filed Jul. 31, 2013, the content of which is incorporated herein by reference.

DESCRIPTION OF RELATED ART

Recently, as further miniaturization of large scale integrated circuits (LSI) proceeds, a technology for processing a more delicate structure is demanded. In response to such demand, attempts have been started on forming a fine pattern using a phase-separated structure formed by self-assembly of block polymers having mutually incompatible blocks bonded together. (For example, Patent Literature 1).

For using a phase-separation structure of a block copolymer, it is necessary to form a self-organized nano structure by a microphase separation only in specific regions, and arrange the nano structure in a desired direction. For realizing position control and orientational control, processes such as graphoepitaxy to control phase-separated pattern by a guide pattern and chemical epitaxy to control phase-separated pattern by difference in the chemical state of the substrate are proposed (see, for example, Non-Patent Document 1).

For realizing position control and orientational control, in the formation of a guide pattern, a resist material containing a base component such as a resin is used. The aforementioned resist material can be classified into positive types and negative types. Resist materials in which the exposed portions exhibit increased solubility in a developing solution is called a positive type, and a resist material in which the exposed portions exhibit decreased solubility in a developing solution is called a negative type.

In the formation of a guide pattern for forming a fine pattern utilizing self-assembly of a block copolymer, a method using a negative-tone developing process has been proposed. The negative-tone development process is a process in which a positive type, chemically amplified resist composition is used in combination with a developing solution containing an organic solvent (hereafter, frequently referred to as "organic developing solution") (hereafter, the process using an organic developing solution is sometimes referred to as "solvent developing process" or "negative-tone solvent developing process"). In general, a positive type, chemically amplified resist composition exhibits increased solubility in an alkali developing solution upon exposure, but comparatively, the solubility in an organic solvent is decreased. Therefore, in a negative-tone solvent developing process, the unexposed portions of the resist film are dissolved and removed by an organic solvent-type developing solution to thereby form a resist pattern (see, for example, Patent Document 2).

DOCUMENTS OF RELATED ART

Patent Literature

[Patent Document 1] Japanese Unexamined Patent Application, First Publication No. 2008-36491

[Patent Document 2] Japanese Unexamined Patent Application, First Publication No. 2009-025723

Non-Patent Documents

[Non-Patent Document 1] Proceedings of SPIE (U.S.), vol. 7637, pp. 76730G-1 (2010)

SUMMARY OF THE INVENTION

As further progress is made in lithography techniques, miniaturization of patterns and reduction of shape defects are demanded for patterns formed by using phase-separation of a block copolymer.

The present invention takes the above circumstances into consideration, with an object of forming a pattern with reduced pattern defects.

A first aspect of the present invention is a method of forming a structure containing a phase-separated structure, the method including: a step of forming a layer containing a block copolymer having a plurality of blocks bonded and a purity of 98% or more, and a step of phase-separating the layer containing the block copolymer.

A second aspect of the present invention is a method of forming a pattern containing a block copolymer, the method including: a step of forming a layer containing a block copolymer having a plurality of blocks bonded and a purity of 98% or more on a substrate, a step of phase-separating the layer containing the block copolymer, and a step of selectively removing a phase of at least one block of the plurality of blocks constituting the block copolymer from the layer containing the block copolymer.

A third aspect of the present invention is a method of forming a fine pattern, the method including an etching step in which etching of a substrate is conducted using a pattern formed by the method of the second aspect as a mask.

In the present description and claims, the term "aliphatic" is a relative concept used in relation to the term "aromatic", and defines a group or compound that has no aromaticity.

The term "alkyl group" includes linear, branched or cyclic, monovalent saturated hydrocarbon, unless otherwise specified.

The term "alkylene group" includes linear, branched or cyclic, divalent saturated hydrocarbon, unless otherwise specified. The same applies for the alkyl group within an alkoxy group.

A "halogenated alkyl group" is a group in which part or all of the hydrogen atoms of an alkyl group is substituted with a halogen atom. Examples of the halogen atom include a fluorine atom, a chlorine atom, a bromine atom and an iodine atom.

A "fluorinated alkyl group" or a "fluorinated alkylene group" is a group in which part or all of the hydrogen atoms of an alkyl group or an alkylene group have been substituted with a fluorine atom.

The term "structural unit" refers to a monomer unit that contributes to the formation of a polymeric compound (resin, polymer, copolymer).

A "structural unit derived from an acrylate ester" refers to a structural unit that is formed by the cleavage of the ethylenic double bond of an acrylate ester.

An "acrylate ester" refers to a compound in which the terminal hydrogen atom of the carboxy group of acrylic acid ($CH_2$=CH—COOH) has been substituted with an organic group.

The acrylate ester may have the hydrogen atom bonded to the carbon atom on the α-position substituted with a substituent. The substituent that substitutes the hydrogen atom bonded to the carbon atom on the α-position is atom other than hydrogen or a group, and examples thereof include an alkyl group of 1 to 5 carbon atoms, a halogenated alkyl group of 1 to 5 carbon atoms and a hydroxyalkyl group. A carbon atom on the α-position of an acrylate ester refers to the carbon atom bonded to the carbonyl group, unless specified otherwise.

Hereafter, an acrylate ester having the hydrogen atom bonded to the carbon atom on the α-position substituted with a substituent is sometimes referred to as "α-substituted acrylate ester". Further, acrylate esters and α-substituted acrylate esters are collectively referred to as "(α-substituted) acrylate ester".

A "structural unit derived from hydroxystyrene or a hydroxystyrene derivative" refers to a structural unit that is formed by the cleavage of the ethylenic double bond of hydroxystyrene or a hydroxystyrene derivative.

The term "hydroxystyrene derivative" includes compounds in which the hydrogen atom at the α-position of hydroxystyrene has been substituted with another substituent such as an alkyl group or a halogenated alkyl group; and derivatives thereof. Examples of the derivatives thereof include hydroxystyrene in which the hydrogen atom of the hydroxy group has been substituted with an organic group and may have the hydrogen atom on the α-position substituted with a substituent; and hydroxystyrene which has a substituent other than a hydroxy group bonded to the benzene ring and may have the hydrogen atom on the α-position substituted with a substituent. Here, the α-position (carbon atom on the α-position) refers to the carbon atom having the benzene ring bonded thereto, unless specified otherwise.

As the substituent which substitutes the hydrogen atom on the α-position of hydroxystyrene, the same substituents as those described above for the substituent on the α-position of the aforementioned α-substituted acrylate ester can be mentioned.

A "structural unit derived from vinylbenzoic acid or a vinylbenzoic acid derivative" refers to a structural unit that is formed by the cleavage of the ethylenic double bond of vinylbenzoic acid or a vinylbenzoic acid derivative.

The term "vinylbenzoic acid derivative" includes compounds in which the hydrogen atom at the α-position of vinylbenzoic acid has been substituted with another substituent such as an alkyl group or a halogenated alkyl group; and derivatives thereof. Examples of the derivatives thereof include benzoic acid in which the hydrogen atom of the carboxy group has been substituted with an organic group and may have the hydrogen atom on the α-position substituted with a substituent; and benzoic acid which has a substituent other than a hydroxy group and a carboxy group bonded to the benzene ring and may have the hydrogen atom on the α-position substituted with a substituent. Here, the α-position (carbon atom on the α-position) refers to the carbon atom having the benzene ring bonded thereto, unless specified otherwise.

The term "styrene" is a concept including styrene and compounds in which the hydrogen atom at the α-position of styrene is substituted with other substituent such as an alkyl group and a halogenated alkyl group.

A "structural unit derived from styrene" or "structural unit derived from a styrene derivative" refers to a structural unit that is formed by the cleavage of the ethylenic double bond of styrene or a styrene derivative.

As the alkyl group as a substituent on the α-position, a linear or branched alkyl group is preferable, and specific examples include a methyl group, an ethyl group, a propyl group, an isopropyl group, an n-butyl group, an isobutyl group, a tert-butyl group, a pentyl group, an isopentyl group and a neopentyl group.

Specific examples of the halogenated alkyl group as the substituent on the α-position include groups in which part or all of the hydrogen atoms of the aforementioned "alkyl group as the substituent on the α-position" are substituted with halogen atoms. Examples of the halogen atom include a fluorine atom, a chlorine atom, a bromine atom and an iodine atom, and a fluorine atom is particularly desirable.

Specific examples of the hydroxyalkyl group as the substituent on the α-position include groups in which part or all of the hydrogen atoms of the aforementioned "alkyl group as the substituent on the α-position" are substituted with a hydroxy group. The number of hydroxy groups within the hydroxyalkyl group is preferably 1 to 5, and most preferably 1.

The term "exposure" is used as a general concept that includes irradiation with any form of radiation.

According to the present invention, a pattern may be formed with reduced pattern defects.

DETAILED DESCRIPTION OF THE INVENTION

Figure 1:
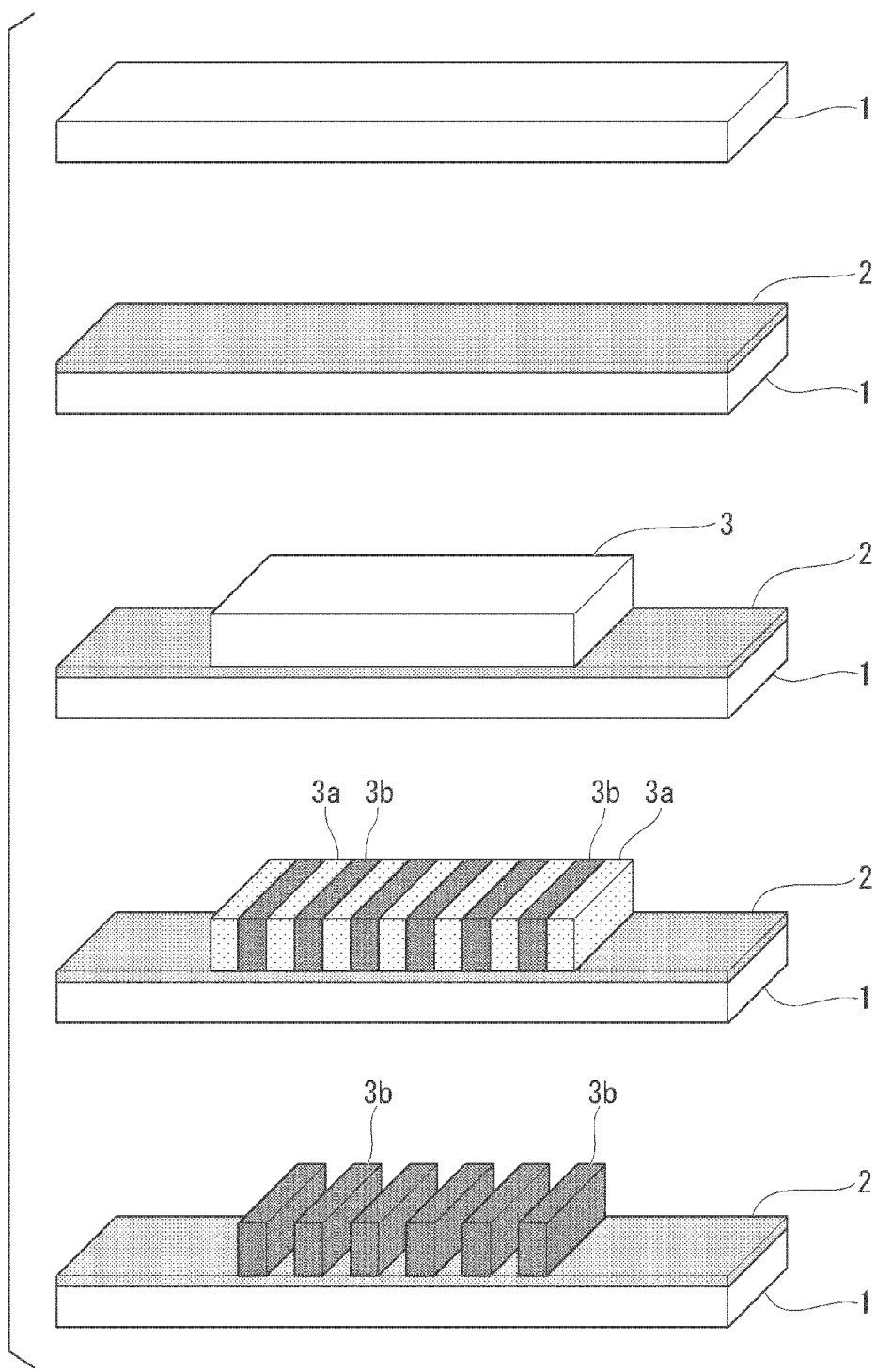
FIG. 1 is a schematic diagram showing an example of one embodiment of the first and second aspects of the present invention.

<<Method of Producing Structure Containing Phase-Separated Structure>>

A method of forming a structure containing a phase-separated structure according to the present embodiment includes: a step of forming a layer containing a block copolymer having a plurality of blocks bonded and a purity of 98% or more on a substrate, and a step of phase-separating the layer containing the block copolymer.

Hereinafter, the method of producing a structure containing a phase-separated structure according to the present embodiment will be specifically described with reference to the drawings. However, the present invention is not limited to these embodiments.

[Step of Forming a Layer Containing a Block Copolymer Having a Plurality of Blocks Bonded and a Purity of 98% or More on a Substrate]

Firstly, a layer containing a block copolymer having a plurality of blocks bonded and a purity of 98% or more is formed on a substrate.

<Substrate>

There are no particular limitations on the type of a substrate 1, provided that the block copolymer-containing solution can be coated on the surface of the substrate. Examples of the substrate include a substrate constituted of an inorganic substance such as a metal (e.g., silicon, copper, chromium, iron or aluminum), glass, titanium oxide, silica or mica; and a substrate constituted of an organic substance such as an acrylic plate, polystyrene, cellulose, cellulose acetate or phenol resin.

Further, the size and the shape of the substrate 1 used in the present invention is not particularly limited. The substrate 1 does not necessarily need to have a smooth surface, and a substrate made of various materials and having various shapes can be appropriately selected for use. For example, a multitude of shapes can be used, such as a substrate having a curved surface, a plate having an uneven surface, and a thin sheet.

Further, on the surface of the substrate 1, an inorganic and/or organic film may be provided.

As the inorganic film, an inorganic antireflection film (inorganic BARC) can be used. As the organic film, an organic antireflection film (organic BARC) can be used.

Before forming a neutralization film on the substrate, the surface of the substrate 1 may be washed. By washing the surface of the substrate 1, the later thin film forming step may be satisfactorily performed.

As the washing treatment, a conventional method may be used, and examples thereof include an oxygen plasma treatment, a hydrogen plasma treatment, an ozone oxidation treatment, an acid alkali treatment, and a chemical modification treatment. For example, the substrate is immersed in an acidic solution such as a sulfuric acid/hydrogen peroxide aqueous solution, followed by washing with water and drying. Thereafter, a layer containing a block copolymer can be formed on the surface of the substrate.

<Block Copolymer>

In the present embodiment, a block copolymer is a polymer having a plurality of partial constituent components (blocks) in which only the same structural units are bonded, the plurality of partial constituent components (blocks) being bonded, and the block polymer has a purity of 98% or more. As the blocks constituting the block copolymer, 2 types of blocks may be used, or 3 or more types of blocks may be used. In the present invention, the plurality of blocks constituting the block copolymer are not particularly limited, as long as they are combinations capable of causing phase separation. However, it is preferable to use a combination of blocks which are mutually incompatible. Further, it is preferable to use a combination in which a phase of at least one block amongst the plurality of blocks constituting the block copolymer can be easily subjected to selective removal as compared to the phases of other blocks. An example of a combination which can be selectively removed reliably include a block copolymer in which one or more blocks having an etching selectivity of more than 1 are bonded.

In the present specification, a "period of a block copolymer" refers to a period of a phase structure observed when a phase-separated structure is formed, and is a sum of the lengths of the phases which are mutually incompatible. The period of a block copolymer corresponds to the length of 1 molecule of the block copolymer.

The period of a block polymer is determined by intrinsic polymerization properties such as the polymerization degree N and the Flory-Huggins interaction parameter $\chi$. Specifically, the repulsive interaction between different block components of the block copolymer becomes larger as the $\chi N$ becomes larger. Therefore, when $\chi N=10$ (hereafter, referred to as "strong segregation limit"), there is a strong tendency for the phase separation to occur between different blocks in the block copolymer. At the strong segregation limit, the period of the block copolymer is approximately $N^{2/3}\chi^{1/6}$. That is, the period of the block copolymer is in proportion to the polymerization degree N which correlates with the molecular weight Mn and molecular weight ratio between different blocks. Therefore, by adjusting the composition and the total molecular weight of the block copolymer to be used, the period of the block copolymer can be easily adjusted.

Examples of the block copolymer include a block copolymer in which a block of a structural unit having an aromatic group is bonded to a block of a structural unit derived from an ($\alpha$-substituted) acrylate ester; a block copolymer in which a block of a structural unit having an aromatic group is bonded to a block of a structural unit derived from an ($\alpha$-substituted) acrylic acid; a block copolymer in which a block of a structural unit having an aromatic group is bonded to a block of a structural unit derived from siloxane or a derivative thereof; a block copolymer in which a block of a structural unit having an aromatic group is bonded to a block of a structural unit derived from lactic acid; a block copolymer in which a block of a structural unit derived from an alkyleneoxide is bonded to a block of a structural unit derived from an ($\alpha$-substituted) acrylate ester; a block copolymer in which a block of a structural unit derived from an alkyleneoxide is bonded to a block of a structural unit derived from an ($\alpha$-substituted) acrylic acid; a block copolymer in which a block of a structural unit containing a polyhedral oligomeric silsesquioxane structure is bonded to a block of a structural unit derived from an ($\alpha$-substituted) acrylate ester; a block copolymer in which a block of a structural unit containing a polyhedral oligomeric silsesquioxane structure is bonded to a block of a structural unit derived from an ($\alpha$-substituted) acrylic acid; and a block copolymer in which a block of a structural unit containing a polyhedral oligomeric silsesquioxane structure is bonded to a block of a structural unit derived from siloxane or a derivative thereof.

In the present embodiment, the block copolymer preferably includes a structural unit having an aromatic group and a structural unit derived from an ($\alpha$-substituted) acrylic acid, an ($\alpha$-substituted) acrylate ester or lactic acid.

Examples of the structural unit having an aromatic group include structural units having a phenyl group, a naphthyl group or the like. In the present embodiment, a structural unit derived from styrene or a derivative thereof is preferable.

Examples of the styrene or derivative thereof include $\alpha$-methylstyrene, 2-methylstyrene, 3-methylstyrene, 4-methylstyrene, 4-t-butylstyrene, 4-n-octylstyrene, 2,4,6-trimethylstyrene, 4-methoxystyrene, 4-t-butoxystyrene, 4-trimethylsilylstyrene, 4-hydroxystyrene, 4-nitrostyrene, 3-nitrostyrene, 4-chlorostyrene, 4-fluorostyrene, 4-acetoxyvinylstyrene, 4-vinylbenzylchloride, 1-vinylnaphthalene, 4-vinylbiphenyl, 1-vinyl-2-pyrolidone, 9-vinylanthracene, and vinylpyridine. Among these examples, styrene or 4-trimethylsilylstyrene is preferable.

An ($\alpha$-substituted) acrylic acid refers to either or both acrylic acid and a compound in which the hydrogen atom bonded to the carbon atom on the $\alpha$-position of acrylic acid has been substituted with a substituent. As an example of such a substituent, an alkyl group of 1 to 5 carbon atoms can be given.

Examples of ($\alpha$-substituted) acrylic acid include acrylic acid and methacrylic acid.

An ($\alpha$-substituted) acrylate ester refers to either or both acrylate ester and a compound in which the hydrogen atom bonded to the carbon atom on the $\alpha$-position of acrylate ester has been substituted with a substituent. As an example of such a substituent, an alkyl group of 1 to 5 carbon atoms can be given.

Specific examples of the ($\alpha$-substituted) acrylate ester include acrylate esters such as methyl acrylate, ethyl acrylate, propyl acrylate, n-butyl acrylate, t-butyl acrylate, cyclohexyl acrylate, octyl acrylate, nonyl acrylate, hydroxyethyl acrylate, hydroxypropyl acrylate, benzyl acrylate, anthracene acrylate, glycidyl acrylate, 3,4-epoxycyclohexylmethane acrylate, and propyltrimethoxysilane acrylate; and methacrylate esters such as methyl methacrylate, ethyl methacrylate, propyl methacrylate, n-butyl methacrylate, t-butyl methacrylate, cyclohexyl methacrylate, octyl methacrylate, nonyl methacrylate, hydroxyethyl methacrylate, hydroxypropyl methacrylate, benzyl methacrylate, anthracene methacrylate, glycidyl methacrylate, 3,4-epoxycyclohexylmethane methacrylate, and propyltrimethoxysilane methacrylate.

Among these, methyl acrylate, ethyl acrylate, t-butyl acrylate, methyl methacrylate, ethyl methacrylate, and t-butyl methacrylate are preferable.

Examples of siloxane or derivative thereof include dimethylsiloxane, diethylsiloxane, diphenylsiloxane, and methylphenylsiloxane.

Examples of the alkylene oxide include ethylene oxide, propylene oxide, isopropylene oxide and butylene oxide.

Specific examples of the structural unit containing a polyhedral oligomeric silsesquioxane structure include a structural unit represented by general formula (a0-1) shown below.

[Chemical Formula 1]

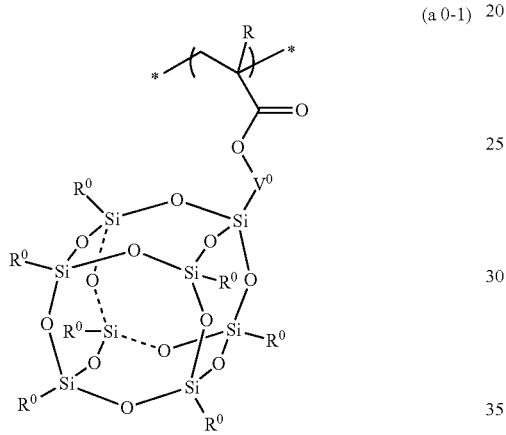

(a0-1)

In the formula, R represents a hydrogen atom, an alkyl group of 1 to 5 carbon atoms or a halogenated alkyl group of 1 to 5 carbon atoms; $V^0$ represents a divalent hydrocarbon group which may have a substituent; and $R^0$ represents a monovalent hydrocarbon group which may have a substituent, wherein the plurality of $R^0$ may be the same or different from each other.

In the aforementioned formula (a0-1), as the alkyl group of 1 to 5 carbon atoms for R, a linear or branched alkyl group of 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group and a neopentyl group. The halogenated alkyl group of 1 to 5 carbon atoms represented by R is a group in which part or all of the hydrogen atoms of the aforementioned alkyl group of 1 to 5 carbon atoms have been substituted with halogen atoms. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

In formula (a0-1), the monovalent hydrocarbon group for $R^0$ preferably contains 1 to 20 carbon atoms, more preferably 1 to 10 carbon atoms, and still more preferably 1 to 8 carbon atoms. However, this number of carbon atoms does not include any carbon atoms within any of the substituents described below.

The monovalent hydrocarbon group for $R^0$ may be an aliphatic hydrocarbon group or an aromatic hydrocarbon group, but is preferably an aliphatic hydrocarbon group, and more preferably a monovalent aliphatic saturated hydrocarbon group (alkyl group).

More specific examples of this alkyl group include chain-like aliphatic hydrocarbon groups (linear or branched alkyl groups), and aliphatic hydrocarbon groups that include a ring within the structure.

The linear alkyl group preferably contains 1 to 8 carbon atoms, more preferably 1 to 5 carbon atoms, and still more preferably 1 to 3 carbon atoms. Specific examples include a methyl group, an ethyl group, an n-propyl group, an isopropyl group, an n-butyl group, an isobutyl group and an n-pentyl group. Among these, a methyl group, an ethyl group or an n-propyl group is preferable, a methyl group, an ethyl group or an isobutyl group is more preferable, and an ethyl group is most preferable.

The branched alkyl group preferably has 3 to 5 carbon atoms. Specific examples of such branched alkyl groups include an isopropyl group, an isobutyl group, a tert-butyl group, an isopentyl group and a neopentyl group, and an isopropyl group or a tert-butyl group is particularly desirable.

As examples of the hydrocarbon group containing a ring in the structure thereof, a cyclic aliphatic hydrocarbon group (a group in which 1 hydrogen atom has been removed from an aliphatic hydrocarbon ring), a group in which the cyclic aliphatic hydrocarbon group is bonded to the terminal of the aforementioned chain-like aliphatic hydrocarbon group, and a group in which the cyclic aliphatic hydrocarbon group is interposed within the aforementioned chain-like aliphatic hydrocarbon group, can be given.

The cyclic aliphatic hydrocarbon group preferably has 3 to 8 carbon atoms, and more preferably 4 to 6 carbon atoms. The cyclic aliphatic hydrocarbon group may be either a polycyclic group, or a monocyclic group. As the monocyclic group, a group in which 1 or more hydrogen atoms have been removed from a monocycloalkane of 3 to 6 carbon atoms is preferable. Examples of the monocycloalkane include cyclopentane and cyclohexane. As the polycyclic group, a group in which 1 or more hydrogen atom has been removed from a polycycloalkane of 7 to 12 carbon atoms is preferable. Examples of the polycycloalkane include adamantane, norbornane, isobornane, tricyclodecane and tetracyclododecane.

The chain-like aliphatic hydrocarbon group may have a substituent. Examples of the substituent include a fluorine atom, a fluorinated alkyl group of 1 to 5 carbon atoms, and an oxygen atom (=O).

The cyclic aliphatic hydrocarbon group may have a substituent. Examples of the substituent include an alkyl group of 1 to 5 carbon atoms, a fluorine atom, a fluorinated alkyl group of 1 to 5 carbon atoms, and an oxygen atom (=O).

In the case where the monovalent hydrocarbon group for $R^0$ is an aromatic hydrocarbon group, the aromatic hydrocarbon group is a monovalent hydrocarbon group having at least 1 aromatic ring.

The aromatic ring is not particularly limited, as long as it is a cyclic conjugated compound having (4n+2) π electrons, and may be either monocyclic or polycyclic. The aromatic ring preferably has 5 to 30 carbon atoms, more preferably 5 to 20, still more preferably 6 to 15, and most preferably 6 to 12. However, this number of carbon atoms does not include any carbon atoms within any of the substituents described below.

Examples of the aromatic ring include aromatic hydrocarbon rings, such as benzene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom. Specific examples of the aromatic hetero ring include a pyridine ring and a thiophene ring.

Specific examples of the aromatic hydrocarbon group include a group in which one hydrogen atom has been removed from the aforementioned aromatic hydrocarbon ring or aromatic hetero ring (aryl group or heteroaryl group); a group in which one hydrogen atom has been removed from an aromatic compound having two or more aromatic rings (biphenyl, fluorene or the like); and a group in which one hydrogen atom of the aforementioned aromatic hydrocarbon ring or aromatic hetero ring has been substituted with an alkylene group (an arylalkyl group such as a benzyl group, a phenethyl group, a 1-naphthylmethyl group, a 2-naphthylmethyl group, a 1-naphthylethyl group, or a 2-naphthylethyl group).

The alkylene group which is bonded to the aforementioned aryl group or heteroaryl group preferably has 1 to 4 carbon atoms, more preferably 1 or 2 carbon atoms, and most preferably 1 carbon atom.

The aromatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

In formula (a0-1), the divalent hydrocarbon group for V° may be either an aliphatic hydrocarbon group or an aromatic hydrocarbon group. An "aliphatic hydrocarbon group" refers to a hydrocarbon group that has no aromaticity.

The aliphatic hydrocarbon group as the divalent hydrocarbon group for V° may be either saturated or unsaturated. In general, the aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

The linear or branched aliphatic hydrocarbon group preferably has 1 to 10 carbon atoms, more preferably 1 to 6, still more preferably 1 to 4, and most preferably 1 to 3.

As the linear aliphatic hydrocarbon group, a linear alkylene group is preferable. Specific examples thereof include a methylene group [—$CH_2$—], an ethylene group [—$(CH_2)_2$-], a trimethylene group [—$(CH_2)_3$-], a tetramethylene group [—$(CH_2)_4$-] and a pentamethylene group [—$(CH_2)_5$-].

As the branched aliphatic hydrocarbon group, branched alkylene groups are preferred, and specific examples include various alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group within the alkylalkylene group, a linear alkyl group of 1 to 5 carbon atoms is preferable.

As examples of the hydrocarbon group containing a ring in the structure thereof, an alicyclic hydrocarbon group (a group in which two hydrogen atoms have been removed from an aliphatic hydrocarbon ring), a group in which the alicyclic hydrocarbon group is bonded to the terminal of the aforementioned chain-like aliphatic hydrocarbon group, and a group in which the alicyclic group is interposed within the aforementioned linear or branched aliphatic hydrocarbon group, can be given. As the linear or branched aliphatic hydrocarbon group, the same groups as those described above can be used.

The alicyclic hydrocarbon group preferably has 3 to 20 carbon atoms, and more preferably 3 to 12 carbon atoms.

The alicyclic hydrocarbon group may be either a polycyclic group or a monocyclic group. As the monocyclic aliphatic hydrocarbon group, a group in which 2 hydrogen atoms have been removed from a monocycloalkane is preferable. The monocycloalkane preferably has 3 to 6 carbon atoms, and specific examples thereof include cyclopentane and cyclohexane.

As the polycyclic group, a group in which 2 hydrogen atoms have been removed from a polycycloalkane is preferable, and the polycyclic group preferably has 7 to 12 carbon atoms. Examples of the polycycloalkane include adamantane, norbornane, isobornane, tricyclodecane and tetracyclododecane.

The aromatic hydrocarbon group is a hydrocarbon group having an aromatic ring.

The aromatic ring is not particularly limited, as long as it is a cyclic conjugated compound having $(4n+2)$ $\pi$ electrons, and may be either monocyclic or polycyclic. The aromatic ring preferably has 5 to 30 carbon atoms, more preferably 5 to 20, still more preferably 6 to 15, and most preferably 6 to 12. However, this number of carbon atoms does not include any carbon atoms within any of the substituents described below.

Examples of the aromatic ring include aromatic hydrocarbon rings, such as benzene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom. Specific examples of the aromatic hetero ring include a pyridine ring and a thiophene ring.

Specific examples of the aromatic hydrocarbon group include a group in which two hydrogen atoms have been removed from the aforementioned aromatic hydrocarbon ring or aromatic hetero ring (arylene group or heteroarylene group); a group in which two hydrogen atoms have been removed from an aromatic compound having two or more aromatic rings (biphenyl, fluorene or the like); and a group in which one hydrogen atom of the aforementioned aromatic hydrocarbon ring or aromatic hetero ring has been substituted with an alkylene group (a group in which one hydrogen atom has been removed from the aryl group within the aforementioned arylalkyl group such as a benzyl group, a phenethyl group, a 1-naphthylmethyl group, a 2-naphthylmethyl group, a 1-naphthylethyl group, or a 2-naphthylethyl group, or a heteroarylalkyl group).

The alkylene group which is bonded to the aforementioned aryl group or heteroaryl group preferably has 1 to 4 carbon atoms, more preferably 1 or 2 carbon atoms, and most preferably 1 carbon atom.

Specific examples of structural unit represented by formula (a0-1) are shown below. In the formulae shown below, $R^{\alpha}$ represents a hydrogen atom, a methyl group or a trifluoromethyl group.

[Chemical Formula 2]

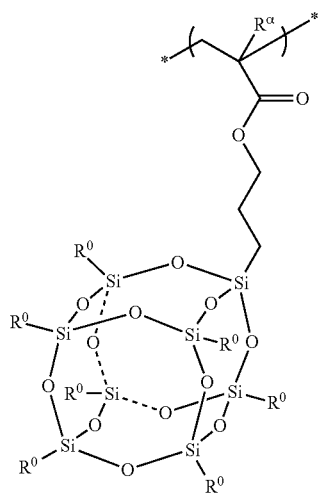

$R^0$ = ethyl group or isobutyl group

In the present embodiment, the molar ratio of the structural unit having an aromatic group to the structural unit derived from an (α-substituted) acrylic acid or (α-substituted) acrylate ester is preferably in the range of 60:40 to 90:10, and more preferably 65:35 to 80:20.

When the ratio of the structural unit having an aromatic group to the structural unit derived from an (α-substituted) acrylic acid or (α-substituted) acrylate ester is within the above-mentioned preferable range, a cylindrical phase-separated structure oriented in a direction perpendicular to the substrate surface may be obtained.

Specific examples of such block copolymers include a block copolymer having a block of styrene and a block of acrylic acid; a block copolymer having a block of styrene and a block of methyl acrylate; a block copolymer having a block of styrene and a block of ethyl acrylate; a block copolymer having a block of styrene and a block of t-butyl acrylate; a block copolymer having a block of styrene and a block of methacrylic acid; a block copolymer having a block of styrene and a block of methyl methacrylate; a block copolymer having a block of styrene and a block of ethyl methacrylate; a block copolymer having a block of styrene and a block of t-butyl methacrylate; a block copolymer having a block of a structural unit containing a polyhedral oligomeric silsesquioxane (POSS) structure and a block of acrylic acid; and a block copolymer having a block of a structural unit containing a polyhedral oligomeric silsesquioxane (POSS) structure and a block of methyl acrylate.

In the present embodiment, the block copolymer is not particularly limited as long as it has a purity of 98% or more, and the block copolymer can be appropriately selected depending on the desired pattern.

In the synthesis process of the block copolymer, oxygen and water gets mixed at the time of feeding the monomer, and a termination reaction occurs at the growing chain end. As a result, reaction stops during the synthesis, and impurities are generated as by-products. Such impurities cause pattern defects in the formation of a pattern. In the present embodiment, by using a block copolymer having a purity as high as 98% or more which is obtainable by purification or the like, a pattern with reduced pattern defects can be formed.

In the synthesis process of a block copolymer in which a plurality of kinds of blocks are bonded, as described above, a homopolymer is likely to be contained as impurity. For example, in the case of a block copolymer in which 2 kinds of blocks are bonded, in a diblock copolymer of A-B type, a homopolymer consisting of a monomer initially fed in the synthesis process is likely to be contained as impurity, and in a triblock copolymer of type A-B-A, not only a homopolymer consisting of a monomer initially fed in the synthesis process, but also a diblock copolymer A-B which is a by-product in the synthesis process is likely to be contained as impurity.

In the present embodiment, as the purity of the block copolymer, [{(total solid content)−(solid impurity content)/(total solid content)}×100] may be adopted.

The solid impurity content is not limited to homopolymer, and refers to the total impurity content including remaining monomers. As the solid impurity content, any measured value by various chromatography methods may be used.

In the present embodiment, it is preferable to purify the synthesized block copolymer, so as to obtain a block copolymer having a purity of 98% or more.

The purification method is not particularly limited, and any conventional method may be used, such as a liquid-liquid extraction method in which impurities such as remaining monomers and oligomer components are removed by washing with water or using an appropriate combination of solvents; a purification method conducted in a liquid state, such as ultrafiltration in which materials having a specific molecular weight or lower are extracted and removed; a reprecipitation method in which the resin solution is dropwise added to a poor solvent to solidify the resin in the poor solvent, thereby removing the remaining monomers; and a purification method conducted in a solid state, such as a method in which a filters resin slurry is washed with a poor solvent.

One kind of these methods may conducted once, or repeatedly conducted. Further, two or more kinds of these methods may be used in combination.

In the present embodiment, by purifying the synthesized block copolymer, so as to remove homopolymer or the like by-produced by the termination reaction which occurs in the synthesis process of the block copolymer, it is presumed that an excellent pattern can be formed.

In the present embodiment, it is preferable to conduct purification by washing with an alcohol such as methanol or isopropanol or a saturated hydrocarbon such as cyclohexane or heptane. Further, it is preferable to use a high purity block copolymer obtainable by conducting purification with such solvent at least once, preferably at least twice, and more preferably at least three times.

In the present embodiment, the purity of the block copolymer is 98% or more, preferably 98.2% or more, and more preferably 99% or more.

In the present embodiment, the purity of the block copolymer is preferably determined by analysis using an analyzer capable of a high precision analysis. The analyzer to be used is not particularly limited as long as has high precision, and any conventional analyzing method such as liquid chromatography or gas chromatography may be used for measurement. In the present embodiment, it is preferable to analyze by liquid chromatography. As the liquid chromatography, normal phase chromatography or reversed phase chromatography may be used. As the detector, an adsorption detector, a fluorescence detector, a mass spectrometer or the like may be used.

In the analysis by liquid chromatography, the type of column to be used may be appropriately selected.

In the present embodiment, it is particularly desirable to use at least one block copolymer selected from the group consisting of a block copolymer with a purity of 98% or more having a block of styrene and a block of methyl methacrylate, a block copolymer with a purity of 98% or more having a block of methyl methacrylate and a block of a structural unit containing a polyhedral oligomeric silsesquioxane (POSS) structure, a block copolymer with a purity of 98% or more having a block of 4-trimethylsilylstyrene and a block of methyl methacrylate, and a block copolymer with a purity of 98% or more having a block of styrene and a block of lactic acid.

In the method of producing a structure containing a phase-separated structure according to the present embodiment, the composition containing a block copolymer may contain 2 or more kinds of block copolymers with a purity of 98% or more.

In the case where the composition containing a block copolymer contains 2 or more kinds of block copolymers with a purity of 98% or more, for example, the composition may contain a first block copolymer may be a block copolymer with a purity of 98% or more having a block of styrene and a block of acrylic acid, and a second block copolymer with a purity of 98% or more having a compositional ratio different from that of the first block copolymer.

By mixing block copolymers having different compositional ratios, it is considered that a minor adjustment of the pattern size can be realized, such that a desired pattern can be obtained.

The weight average molecular weight (Mw) (the polystyrene equivalent value determined by gel permeation chromatography) of each polymer constituting the block copolymer is not particularly limited as long as it is large enough to cause phase separation. The weight average molecular weight is preferably 5,000 to 500,000, more preferably 5,000 to 400,000, and still more preferably 5,000 to 300,000.

The polydispersity (Mw/Mn) of the block copolymer is preferably 1.0 to 3.0, more preferably 1.0 to 1.5, and still more preferably 1.0 to 1.3. Here, Mn is the number average molecular weight.

If desired, other miscible additives can also be added to the composition containing a block copolymer. Examples of such miscible additives include additive resins for improving the performance of the layer of the neutralization film, surfactants for improving the applicability, dissolution inhibitors, plasticizers, stabilizers, colorants, halation prevention agents, dyes, sensitizers, base amplifiers and basic compounds.

-Organic Solvent

The composition containing a block copolymer may be prepares by dissolving the block copolymer in an organic solvent. The organic solvent may be any organic solvent which can dissolve the respective components to give a uniform solution, and one or more kinds of any organic solvent can be appropriately selected from those which have been conventionally known as solvents for a film composition containing a resin as a main component.

Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene.

These solvents can be used individually, or in combination as a mixed solvent.

Among these, propylene glycol monomethyl ether acetate (PGMEA), propylene glycol monomethyl ether (PGME), cyclohexanone and ethyl lactate (EL) are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2. For example, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME weight ratio is preferably from 1:9 to 9:1, more preferably from 2:8 to 8:2, and still more preferably 3:7 to 7:3. Alternatively, when PGME and cyclohexanone is mixed as the polar solvent, the PGMEA:(PGME+cyclohexanone) weight ratio is preferably from 1:9 to 9:1, more preferably from 2:8 to 8:2, and still more preferably 3:7 to 7:3.

Further, as the organic solvent for the composition containing a block copolymer, a mixed solvent of γ-butyrolactone with PGMEA, EL or the aforementioned mixed solvent of PGMEA with a polar solvent, is also preferable. The mixing ratio (former:latter) of such a mixed solvent is preferably from 70:30 to 95:5.

The amount of the organic solvent in the composition containing a block copolymer is not particularly limited, and is adjusted appropriately to a concentration that enables application of a coating solution depending on the thickness of the coating film. In general, the organic solvent is used in an amount that yields a solid content for the block copolymer that is within a range from 0.2 to 70% by weight, and preferably from 0.2 to 50% by weight.

Hereafter, among the blocks constituting the block copolymer, in an optional step described later, a block which is not selectively removed is referred to as "block $P_A$", and a block to be selectively removed is referred to as "block $P_B$". For example, after the phase separation of a layer containing a PS-PMMA block copolymer, by subjecting the layer to an oxygen plasma treatment or a hydrogen plasma treatment, the phase of PMMA is selectively removed. In such a case, PS is the block $P_A$, and PMMA is the block $P_B$.

In the present invention, the shape and size of the phase to be selectively removed (i.e., the phase of block $P_B$) is determined by the volume fraction of the respective blocks constituting the block copolymer and the molecular weight of the block copolymer. For example, by making the volume fraction of the $P_B$ block within the block copolymer relatively small, a cylinder structure in which the phase of the $P_B$ block is present within the phase of the $P_A$ block in the form of a cylinder can be formed. On the other hand, by making the volume fraction of the $P_B$ block within the block copolymer about the same as that of the $P_A$ block, a lamellar structure in which the phase of the $P_A$ block and the phase of the $P_B$ block are alternately laminated can be formed. Further, by increasing the molecular weight of the block copolymer, the size of each phase can be increased.

[Step of Phase-Separating a Layer Containing a Block Copolymer]

In the present embodiment, after the previous step (step of forming a layer containing a block copolymer having a plurality of blocks bonded and a purity of 98% or more on a layer of the neutralization film), the phase of the layer containing the block copolymer on the neutralization film is phase-separated.

The phase-separation of the layer containing a block copolymer (i.e., layer 3 is FIG. 1) is performed by heat treatment after the formation of the layer containing a block copolymer, thereby forming a phase-separated structure. The heat treatment is preferably conducted at a temperature at least as high as the glass transition temperature of the layer containing the block copolymer used and lower than the heat decomposition temperature. For example, in the case where the block copolymer is PS-PMMA (Mw: 18-18 k), it is preferable to conduct a heat treatment at a temperature of 160 to 270° C. for 30 to 3,600 seconds.

Further, the heat treatment is preferably conducted in a low reactive gas such as nitrogen.

In the present embodiment, by the above heat treatment, a structure containing a phase separated structure in which the layer containing the block copolymer is phase-separated into a phase of $P_A$ block and a phase of $P_B$ block.

[Step of Applying a Neutralization Film to a Substrate to Form a Layer of the Neutralization Film]

In the method of producing a structure containing a phase-separated structure according to the present embodiment, as shown in FIG. 1, prior to the step of forming a layer containing a block copolymer, a neutralization film is applied to the substrate to form a layer of the neutralization film.

The layer of the neutralization film refers to a layer exhibiting affinity for all polymers constituting the block copolymer. By forming a layer of the neutralization film, it becomes possible to prevent only phases of specific polymers to come into contact with the surface of the substrate by phase separation. For this reason, in order to form a phase-separated structure having a lamellar structure oriented in a direction perpendicular to the substrate surface or a cylindrical phase-separated structure before forming a layer containing a block copolymer, it is preferable to form a layer of the neutralization film depending on the type of the block copolymer to be used.

Specifically, for example, a thin film (i.e., layer 2 of neutralization film) having affinity for all polymers constituting the block copolymer is formed on the surface of the substrate. In the present embodiment, the layer of the neutralization film preferably contains a surface treatment agent exhibiting affinity for all polymers constituting the block copolymer.

As the layer 2 of the neutralization film, a film composed of a resin composition can be used. The resin composition used as the layer of the neutralization film can be appropriately selected from conventional resin compositions used for forming a thin film, depending on the type of polymers constituting the block copolymer. The resin composition used as the layer of the neutralization film may be a heat-polymerizable resin composition, or a resist composition such as a positive resist composition or a negative resist composition.

Alternatively, a compound may be used as the neutralization film, and the compound may be coated to form a non-polymerizable film as the neutralization film. For example, a siloxane organic monomolecular film such as phenethyltrichlorosilane, octadecyltrichlorosilane or hexamethyldisilazane may be preferably used as a neutralization film.

The layer 2 of a neutralization film can be formed by a conventional method.

Examples of the neutralization film include a resin composition containing all structural units of the polymers constituting the block copolymer, and a resin containing all structural units having high affinity for the polymers constituting the block copolymer.

For example, when a PS-PMMA block copolymer (described later) is used, as the neutralization film, it is preferable to use a resin composition containing both PS and PMMA as the structural units, or a compound or a composition containing both a portion having a high affinity for PS such as an aromatic ring and a portion having a high affinity for PMMA such as a functional group with high polarity.

Examples of the resin composition containing both PS and PMMA as the structural units include a random copolymer of PS and PMMA, and an alternating polymer of PS and PMMA (a copolymer in which the respective monomers are alternately copolymerized).

Examples of the composition containing both a portion having a high affinity for PS and a portion having a high affinity for PMMA include a resin composition obtained by polymerizing at least a monomer having an aromatic ring and a monomer having a substituent with high polarity. Examples of the monomer having an aromatic ring include a monomer having a group in which one hydrogen atom has been removed from the ring of an aromatic hydrocarbon, such as a phenyl group, a biphenyl group, a fluorenyl group, a naphthyl group, an anthryl group or a phenanthryl group, or a monomer having a hetero aryl group such as the aforementioned group in which part of the carbon atoms constituting the ring of the group has been substituted with a hetero atom such as an oxygen atom, a sulfur atom or a nitrogen atom. Examples of the monomer having a substituent with high polarity include a monomer having a trimethoxysilyl group, a trichlorosilyl group, a carboxy group, a hydroxy group, a cyano group or a hydroxyalkyl group in which part of the hydrogen atoms of the alkyl group has been substituted with fluorine atoms.

Examples of the compound containing both a portion having a high affinity for PS and a portion having a high affinity for PMMA include a compound having both an aryl group such as a phenethyltrichlorosilane and a substituent with high polarity, and a compound having both an alkyl group and a substituent with high polarity, such as an alkylsilane compound.

Further, in consideration of the adhesiveness of the pattern, the neutralization film preferably exhibits a polarity close to that of the resist composition.

[Guide Pattern Formation Step]

Figure 2:
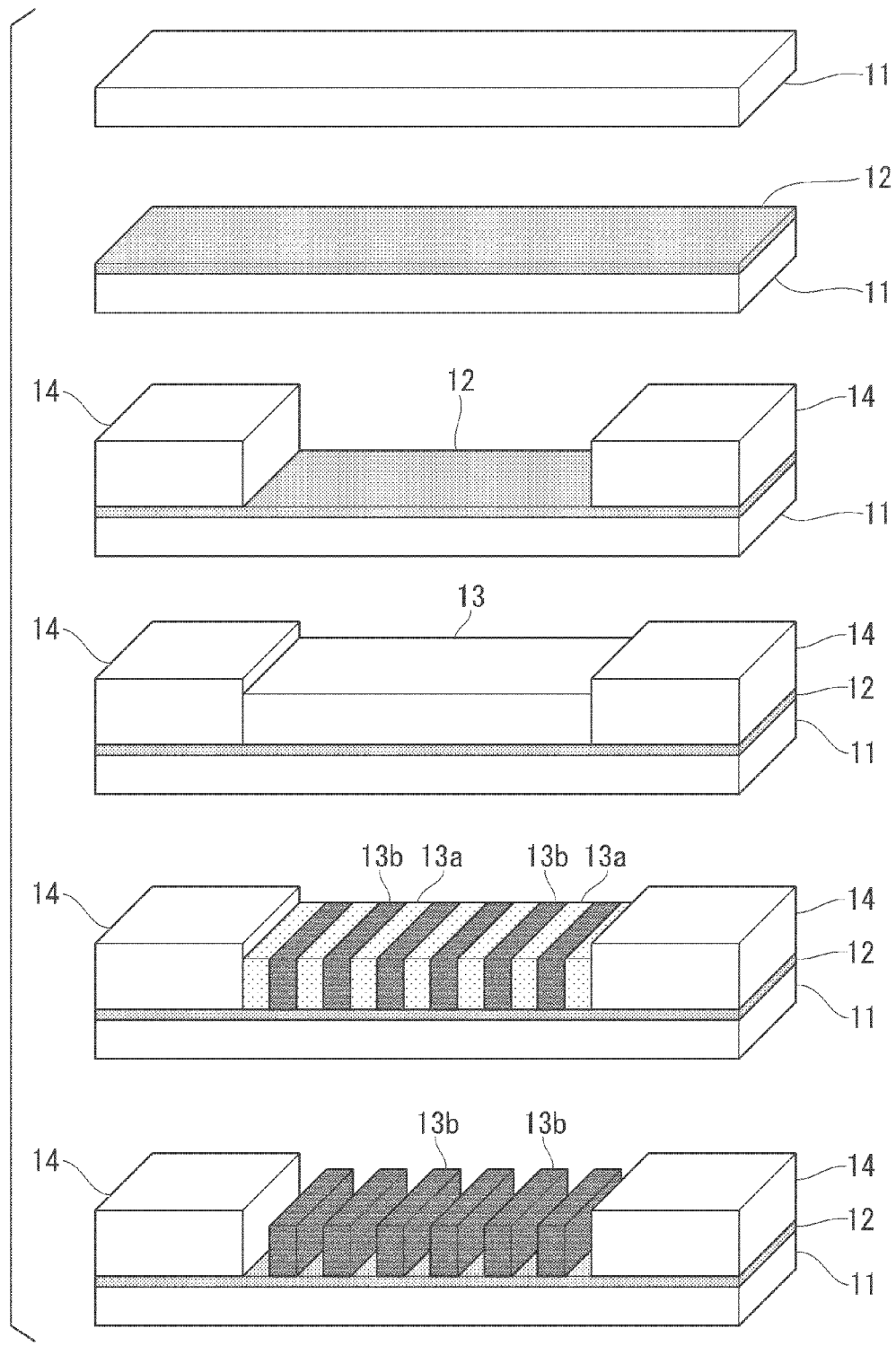
FIG. 2 is a schematic diagram showing an example of one embodiment of the first and second aspects of the present invention.

In the method of producing a structure containing a phase-separated structure according to the present embodiment, as shown in FIG. 2, prior to the step of forming a layer containing a block copolymer, it is preferable to form a guide pattern, followed by phase-separation of the layer containing a block copolymer to form a pattern.

However, in the present embodiment, application of a neutralization film as shown in FIG. 2 is not always necessary.

In the case where a neutralization film is applied as shown in FIG. 2, the step of forming a guide pattern may be conducted prior to or after the [step of applying a neutralization film to a substrate to form a layer of the neutralization film], and preferable after the [step of applying a neutralization film to a substrate to form a layer of the neutralization film].

In the formation of a guide pattern, a method of forming a resist pattern using a resist composition, a pattern forming method by nanoprinting may be adopted.

In the case where a guide pattern is formed by a method of forming a resist pattern using a resist composition, the method preferably includes a step in which a resist composition containing a base component (A) which exhibits changed solubility in a developing solution by the action of acid and an acid generator component (B) which exhibits acid upon exposure is applied to a substrate to form a resist film, a step in which the resist film is exposed, and a step in which the resist film is developed using a developing solution to form a resist pattern.

In the present embodiment, by conducting the above steps, a structure containing a phase-separated structure formed along the resist pattern can be obtained. That is, according to the present embodiment, it is considered that the orientation of the phase-separated structure becomes controllable.

In the present embodiment, a method in which a resist composition or the like is used as a physical guide to control the orientation of the phase-separated pattern (graphoepitaxy) may be used.

<Resist Composition>

In the present embodiment, the resist composition preferably includes a base component (A) (hereafter, sometimes referred to as "component (A)") which exhibits changed solubility in a developing solution under action of acid, and an acid-generator component (B) (hereafter, sometimes referred to as "component (B)") which generates acid upon exposure.

When a resist film is formed using the resist composition and the formed resist film is subjected to a selective exposure, acid is generated at exposed portions, and the generated acid acts on the component (A) to change the solubility of the component (A) in a developing solution, whereas the solubility of the component (A) in a developing solution is not changed at unexposed portions, thereby generating difference in solubility in a developing solution between exposed portions and unexposed portions. Therefore, by subjecting the resist film to development, the exposed portions are dissolved and removed to form a positive-tone resist pattern in the case of a positive resist, whereas the unexposed portions are dissolved and removed to form a negative-tone resist pattern in the case of a negative resist.

In the present specification, a resist composition which forms a positive resist pattern by dissolving and removing the exposed portions is called a positive resist composition, and a resist composition which forms a negative resist pattern by dissolving and removing the unexposed portions is called a negative resist composition.

In the present embodiment, the resist composition may be either a positive resist composition or a negative resist composition.

Further, in the present embodiment, the resist composition may be applied to an alkali developing process using an alkali developing solution in the developing treatment, or a solvent developing process using a developing solution containing an organic solvent (organic developing solution) in the developing treatment, and preferably a solvent developing process.

In the present embodiment, the resist composition has a function of generating acid upon exposure, and in the resist composition, the component (A) may generate acid upon exposure, or an additive component other than the component (A) may generate acid upon exposure.

More specifically, in the present embodiment, the resist composition may be a resist composition (1) containing an acid generator component (B) which generates acid upon exposure (hereafter, referred to as "component (B)";

a resist composition (2) in which the component (A) is a component which generates acid upon exposure; or a resist composition (3) in which the component (A) is a component which generates acid upon exposure, and further containing an acid generator component (B).

That is, when the resist composition of the present invention is the aforementioned resist composition (2) or (3), the component (A) is a "base component which generates acid upon exposure and exhibits changed solubility in a developing solution under action of acid". In the case where the component (A) is a base component which generates acid upon exposure and exhibits changed solubility in a developing solution under action of acid, the component (A1) described later is preferably a polymeric compound which generates acid upon exposure and exhibits changed solubility in a developing solution under action of acid. As the polymeric compound, a resin having a structural unit which generates acid upon exposure can be used. As the structural unit which generates acid upon exposure, a conventional structural unit can be used.

In the present embodiment, it is particularly desirable that the resist composition is the aforementioned resist composition (1).

<Component (A)>

In the present invention, the term "base component" refers to an organic compound capable of forming a film, and is preferably an organic compound having a molecular weight of 500 or more. When the organic compound has a molecular weight of 500 or more, the film-forming ability is improved, and a photosensitive resin pattern of nano level can be easily formed.

The organic compound used as the base component is broadly classified into non-polymers and polymers.

In general, as a non-polymer, any of those which have a molecular weight in the range of 500 to less than 4,000 is used. Hereafter, a "low molecular weight compound" refers to a non-polymer having a molecular weight in the range of 500 to less than 4,000.

As a polymer, any of those which have a molecular weight of 1,000 or more is generally used. Hereafter, a "resin" refers to a polymer having a molecular weight of 1,000 or more.

As the molecular weight of the polymer, the weight average molecular weight in terms of the polystyrene equivalent value determined by gel permeation chromatography (GPC) is used.

As the component (A'), a resin, a low molecular weight compound, or a combination thereof may be used.

The component (A) may be a resin that exhibits increased solubility in a developing solution under action of acid or a resin that exhibits decreased solubility in a developing solution under action of acid.

In the present invention, the component (A) may be a component that generates acid upon exposure.

In the present embodiment, the component (A) preferably includes a polymeric compound (A1) having a structural unit containing an acid decomposable group which exhibits increased polarity by the action of acid (hereafter, referred to as "structural unit (a1)"), a structural unit derived from an acrylate ester containing a —$SO_2$— containing cyclic group (hereafter, referred to as "structural unit (a2)"), a structural unit containing a polar group-containing aliphatic hydrocarbon group (hereafter, referred to as "structural unit (a3)"), a structural unit containing an acid non-dissociable cyclic group (hereafter, referred to as "structural unit (a4)"), a structural unit containing a lactone-containing cyclic group or a carbonate containing cyclic group (hereafter, referred to as "structural unit (a5)") and a structural unit containing an ether-containing cyclic group (hereafter, referred to as "structural unit (a13)").

(Structural Unit (a1))

The structural unit (a1) is a structural unit containing an acid decomposable group that exhibits increased polarity by the action of acid.

The term "acid decomposable group" refers to a group in which at least a part of the bond within the structure thereof is cleaved by the action of an acid.

Examples of acid decomposable groups which exhibit increased polarity by the action of an acid include groups which are decomposed by the action of an acid to form a polar group.

Examples of the polar group include a carboxy group, a hydroxy group, an amino group and a sulfo group (—$SO_3H$). Among these, a polar group containing —OH in the structure thereof (hereafter, referred to as "OH-containing polar group") is preferable, a carboxy group or a hydroxy group is more preferable, and a carboxy group is particularly desirable.

More specifically, as an example of an acid decomposable group, a group in which the aforementioned polar group has been protected with an acid dissociable group (such as a group in which the hydrogen atom of the OH-containing polar group has been protected with an acid dissociable group) can be given.

The "acid dissociable group" refers to both (i) a group in which the bond between the acid dissociable group and the adjacent atom is cleaved by the action of acid; and (ii) a group in which one of the bonds is cleaved by the action of acid, and then a decarboxylation reaction occurs, thereby cleaving the bond between the acid dissociable group and the adjacent atom.

It is necessary that the acid dissociable group that constitutes the acid decomposable group is a group which exhibits a lower polarity than the polar group generated by the dissociation of the acid dissociable group. Thus, when the acid dissociable group is dissociated by the action of acid, a polar group exhibiting a higher polarity than that of the acid dissociable group is generated, thereby increasing the polarity. As a result, the polarity of the entire component (A1) is increased. By the increase in the polarity, the solubility in an alkali developing solution changes and, the solubility in an organic developing solution is relatively decreased.

The acid dissociable group is not particularly limited, and any of the groups that have been conventionally proposed as acid dissociable groups for the base resins of chemically amplified resists can be used.

Examples of the acid dissociable group for protecting the carboxy group or hydroxy group as a polar group include the acid dissociable group represented by general formula (a1-r-1) shown below (hereafter, for the sake of convenience, sometimes referred to as "acetal-type acid dissociable group").

[Chemical Formula 3]

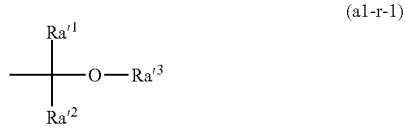

(a1-r-1)

In the formula, $Ra'^1$ and $Ra'^2$ represents a hydrogen atom or an alkyl group; and $Ra'^3$ represents a hydrocarbon group, provided that $Ra'^3$ may be bonded to $Ra'^1$ or $Ra'^2$.

In formula (a1-r-1), as the lower alkyl group for $Ra'^1$ and $Ra'^2$, the same lower alkyl groups as those described above the alkyl groups as the substituent which may be bonded to the carbon atom on the α-position of the aforementioned α-substituted alkylester can be used, although a methyl group or ethyl group is preferable, and a methyl group is particularly desirable.

The hydrocarbon group for $Ra'^3$ is preferably an alkyl group of 1 to 20 carbon atoms, more preferably an alkyl group of 1 to 10 carbon atoms, and still more preferably a linear or branched alkyl group. Specific examples thereof include a methyl group, an ethyl group, a propyl group, an isopropyl group, an n-butyl group, an isobutyl group, a tert-butyl group, a pentyl group, an isopentyl group, a neopentyl group, a 1,1-dimethylethyl group, a 1,1-diethylpropyl group, a 2,2-dimethylpropyl group and a 2,2-dimethylbutyl group.

In the case where $Ra'^3$ represents a cyclic hydrocarbon group, the cyclic hydrocarbon group may be aliphatic or aromatic, and may be polycyclic or monocyclic. As the monocyclic aliphatic hydrocarbon group, a group in which 1 hydrogen atom has been removed from a monocycloalkane is preferable. The monocycloalkane preferably has 3 to 8 carbon atoms, and specific examples thereof include cyclopentane, cyclohexane and cyclooctane. As the polycyclic group, a group in which 1 hydrogen atom has been removed from a polycycloalkane is preferable, and the polycyclic group preferably has 7 to 12 carbon atoms. Examples of the polycycloalkane include adamantane, norbornane, isobornane, tricyclodecane and tetracyclododecane.

In the case where the hydrocarbon group is an aromatic hydrocarbon group, examples of the aromatic ring contained in the aromatic hydrocarbon group include aromatic hydrocarbon rings, such as benzene, biphenyl, fluorene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom.

Specific examples of the aromatic hydrocarbon group include a group in which 1 hydrogen atom has been removed from the aforementioned aromatic hydrocarbon ring (aryl group); and a group in which 1 hydrogen atom of the aforementioned aryl group has been substituted with an alkylene group (an arylalkyl group such as a benzyl group, a phenethyl group, a 1-naphthylmethyl group, a 2-naphthylmethyl group, a 1-naphthylethyl group or a 2-naphthylethyl group). The alkylene group (alkyl chain within the arylalkyl group) preferably has 1 to 4 carbon atom, more preferably 1 or 2, and most preferably 1.

In the case where $Ra'^3$ is bonded to $Ra'^1$ or $Ra'^2$ to form a ring, the cyclic group is preferably a 4 to 7-membered ring, and more preferably a 4 to 6-membered ring. Specific examples of the cyclic group include tetrahydropyranyl group and tetrahydrofuranyl group.

Examples of the acid dissociable group for protecting the carboxy group as a polar group include the acid dissociable group represented by general formula (a1-r-2) shown below (hereafter, with respect to the acid dissociable group represented by the following formula (a1-r-2), the acid dissociable group constituted of alkyl groups is referred to as "tertiary ester-type acid dissociable group").

[Chemical Formula 4]

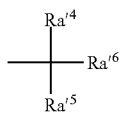

(a1-r2-2)

In the formula, $Ra'^4$ to $Ra'^6$ each independently represents a hydrocarbon group, provided that $Ra'^5$ and $Ra'^6$ may be mutually bonded to form a ring.

As the hydrocarbon group for $Ra'^4$ to $Ra'^6$, the same groups as those described above for $Ra'^3$ can be mentioned. $Ra'^4$ is preferably an alkyl group having from 1 to 5 carbon atoms. In the case where $Ra'^5$ and $Ra'^6$ are mutually bonded to form a ring, a group represented by general formula (a1-r2-1) shown below can be mentioned.

On the other hand, in the case where $Ra'^4$ to $Ra'^6$ are not mutually bonded and independently represent a hydrocarbon group, the group represented by general formula (a1-r2-2) shown below can be mentioned.

[Chemical Formula 5]

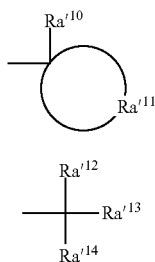

(a1-r2-1)

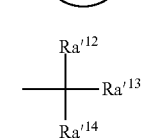

(a1-r2-2)

In the formulae, $Ra'^{10}$ represents an alkyl group of 1 to 10 carbon atoms; $Ra'^{11}$ is a group which forms an aliphatic cyclic group together with a carbon atom having $Ra'^{10}$ bonded thereto; and $Ra'^{12}$ to $Ra'^{14}$ each independently represents a hydrocarbon group.

In the formula (a1-r2-1), as the alkyl group of 1 to 10 carbon atoms for $Ra'^{10}$, the same groups as described above for the linear or branched alkyl group for $Ra'^3$ in the formula (a1-r-1) are preferable. In the formula (a1-r2-1), as the aliphatic cyclic group which is formed by $Ra'^{11}$, the same groups as those described above for the cyclic alkyl group for $Ra'^3$ in the formula (a1-r-1) are preferable.

In the formula (a1-r2-2), it is preferable that $Ra'^{12}$ and $Ra'^{14}$ each independently represents an alkyl group or 1 to 10 carbon atoms, and it is more preferable that the alkyl group is the same group as the described above for the linear or branched alkyl group for $Ra'^3$ in the formula (a1-r-1), it is still more preferable that the alkyl group is a linear alkyl group of 1 to 5 carbon atoms, and it is particularly preferable that the alkyl group is a methyl group or an ethyl group.

In the formula (a1-r2-2), it is preferable that $Ra'^{13}$ is the same group as described above for the linear, branched or cyclic alkyl group for $Ra'^3$ in the formula (a1-r-1).

Among these, the same cyclic alkyl group as those describe above for $Ra'^3$ is more preferable.

Specific examples of the formula (a1-r2-1) are shown below. In the formulae shown below, "*" represents a valence bond.

[Chemical Formula 6]

(r-pr-m1)

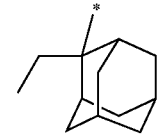

(r-pr-m2)

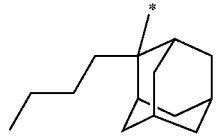

(r-pr-m3)

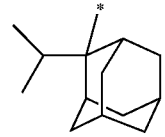

(r-pr-m4)

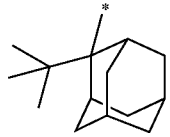

(r-pr-m5)

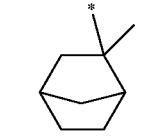

(r-pr-m6)

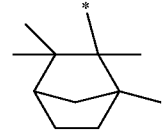

(r-pr-m7)

(r-pr-m8)

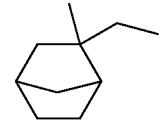

(r-pr-m9)

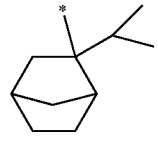

(r-pr-m10)

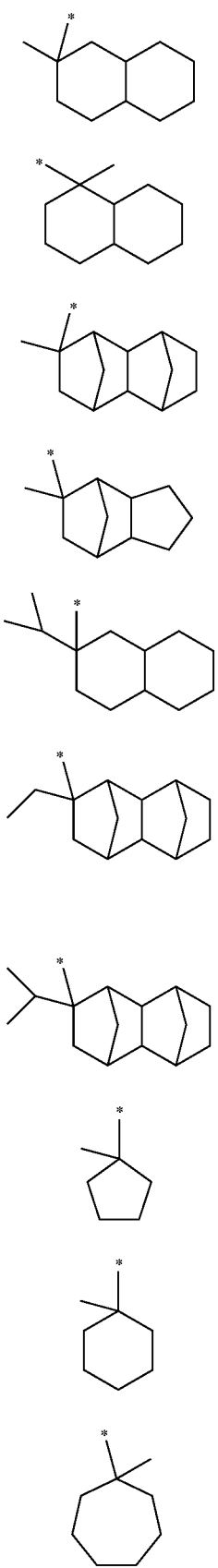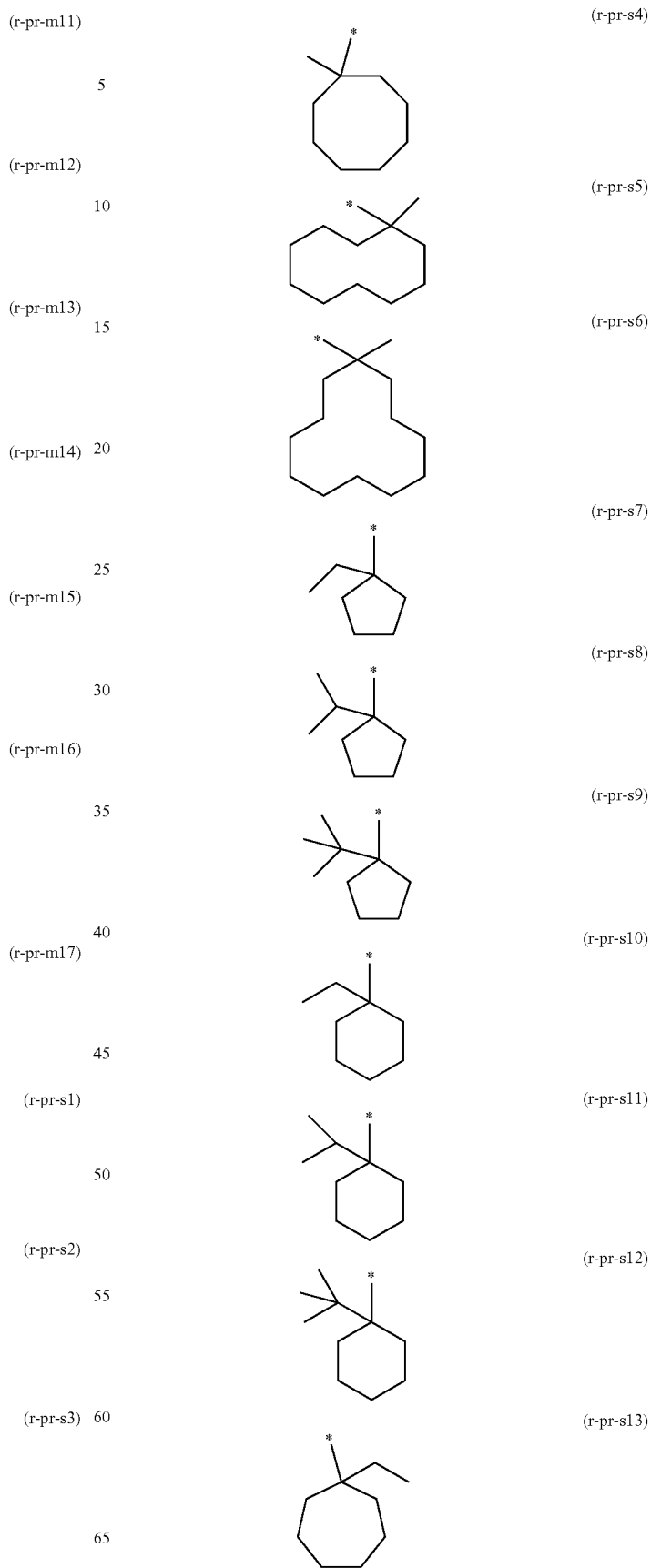

(r-pr-s14) 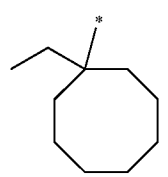
(r-pr-s15) 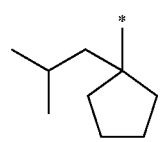
(r-pr-s16) 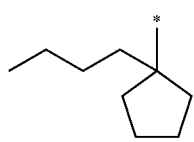
(r-pr-s17) 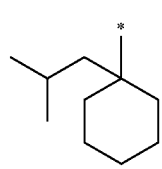
(r-pr-s18) 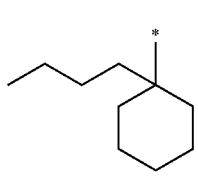
Specific examples of the formula (a1-r2-2) are shown below.
[Chemical Formula 7]
(r-pr-cm1) 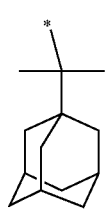
(r-pr-cm2) 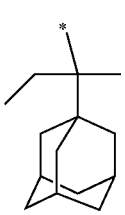
(r-pr-cm3) 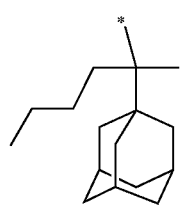
(r-pr-cm4) 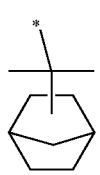
(r-pr-cm5) 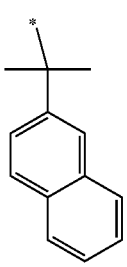
(r-pr-cm6) 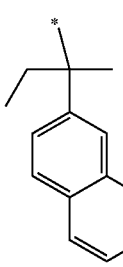
(r-pr-cm7) 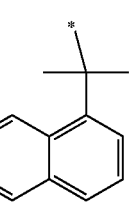
(r-pr-cm8) 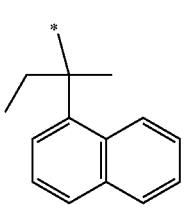
(r-pr-cs1) 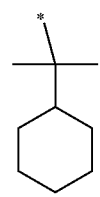
(r-pr-cs2) 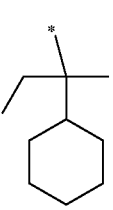

(r-pr-cs3)

(r-pr-cs4)
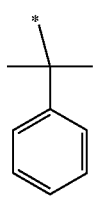

(r-pr-cs5)
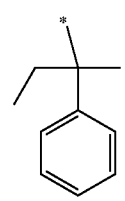

(r-pr-c1)

(r-pr-c2)

(r-pr-c3)

Examples of the acid dissociable group for protecting a hydroxy group as a polar group include the acid dissociable group represented by general formula (a1-r-3) shown below (hereafter, referred to as "tertiary alkyloxycarbonyl-type acid dissociable group").

[Chemical Formula 8]

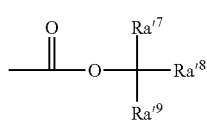
(a1-r-3)

In the formula, $Ra'^7$ to $Ra'^9$ each independently represents an alkyl group.

In the formula (a1-r-3), $Ra'^7$ to $Ra'^9$ is preferably an alkyl group of 1 to 5 carbon atoms, and more preferably an alkyl group of 1 to 3 carbon atoms.

Further, the total number of carbon atoms within the alkyl group is preferably 3 to 7, more preferably 3 to 5, and most preferably 3 or 4.

Examples of the structural unit (a1) include a structural unit derived from an acrylate ester which may have the hydrogen atom bonded to the carbon atom on the α-position substituted with a substituent and contains an acid decomposable group which exhibits increased polarity by the action of acid; a structural unit derived from hydroxystyrene or a hydroxystyrene derivative in which at least a part of the hydrogen atom of the hydroxy group is protected with a substituent containing an acid decomposable group; and a structural unit derived from vinylbenzoic acid or a vinylbenzoic acid derivative in which at least a part of the hydrogen atom within —C(=O)—OH is protected with a substituent containing an acid decomposable group.

As the structural unit (a1), a structural unit derived from an acrylate ester which may have the hydrogen atom bonded to the carbon atom on the α-position substituted with a substituent is preferable.

As the structural unit (a1), structural units represented by general formula (a1-1) or (a1-2) shown below are preferable.

[Chemical Formula 9]

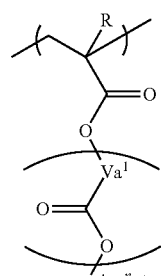
(a1-1)

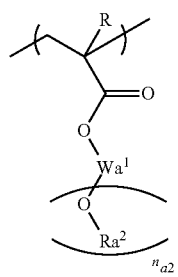
(a1-2)

In the formulae, R represents a hydrogen atom, an alkyl group of 1 to 5 carbon atoms or a halogenated alkyl group of 1 to 5 carbon atoms; $Va^1$ represents a divalent hydrocarbon group which may have an ether bond, an urethane bond or an amide bond; $n_{a1}$ represents an integer of 0 to 2;

$Ra^1$ represents an acid dissociable group represented by the aforementioned formula (a1-r-1) or (a1-r-2);

$Wa^1$ represents a hydrocarbon group having a valency of $n_{a2}+1$; $n_{a2}$ represents an integer of 1 to 3; and $Ra^2$ represents an acid dissociable group represented by the aforementioned formula (a1-r-1) or (a1-r-3).

In general formula (a1-1), as the alkyl group of 1 to 5 carbon atoms for R, a linear or branched alkyl group of 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group and a neopentyl group. The halogenated alkyl group of 1 to 5 carbon atoms represented by R is a group in which part or all of the hydrogen atoms of the aforementioned alkyl group of 1 to 5 carbon atoms have been substituted with halogen atoms. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

The hydrocarbon group for $Va^1$ may be either an aliphatic hydrocarbon group or an aromatic hydrocarbon group. An "aliphatic hydrocarbon group" refers to a hydrocarbon group that has no aromaticity. The aliphatic hydrocarbon group as the divalent hydrocarbon group for $Va^1$ may be either saturated or unsaturated. In general, the aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

Further, as the group for $Va^1$, a group in which the aforementioned divalent hydrocarbon group has been bonded via an ether bond, urethane bond or amide bond can be mentioned.

The linear or branched aliphatic hydrocarbon group preferably has 1 to 10 carbon atoms, more preferably 1 to 6, still more preferably 1 to 4, and most preferably 1 to 3.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched aliphatic hydrocarbon group, branched alkylene groups are preferred, and specific examples include various alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group within the alkylalkylene group, a linear alkyl group of 1 to 5 carbon atoms is preferable.

As examples of the hydrocarbon group containing a ring in the structure thereof, an alicyclic hydrocarbon group (a group in which two hydrogen atoms have been removed from an aliphatic hydrocarbon ring), a group in which the alicyclic hydrocarbon group is bonded to the terminal of the aforementioned chain-like aliphatic hydrocarbon group, and a group in which the alicyclic group is interposed within the aforementioned linear or branched aliphatic hydrocarbon group, can be given. As the linear or branched aliphatic hydrocarbon group, the same groups as those described above can be used.

The alicyclic hydrocarbon group preferably has 3 to 20 carbon atoms, and more preferably 3 to 12 carbon atoms.

The alicyclic hydrocarbon group may be either a monocyclic group or a polycyclic group. As the monocyclic aliphatic hydrocarbon group, a group in which 2 hydrogen atoms have been removed from a monocycloalkane is preferable. The monocycloalkane preferably has 3 to 6 carbon atoms, and specific examples thereof include cyclopentane and cyclohexane. As the polycyclic group, a group in which two hydrogen atoms have been removed from a polycycloalkane is preferable, and the polycyclic group preferably has 7 to 12 carbon atoms. Examples of the polycycloalkane include adamantane, norbornane, isobornane, tricyclodecane and tetracyclododecane.

The aromatic hydrocarbon group is a hydrocarbon group having an aromatic ring.

The aromatic hydrocarbon group as the divalent hydrocarbon group for $Va^1$ preferably has 3 to 30 carbon atoms, more preferably 5 to 30, still more preferably 5 to 20, still more preferably 6 to 15, and most preferably 6 to 10. Here, the number of carbon atoms within a substituent(s) is not included in the number of carbon atoms of the aromatic hydrocarbon group.

Examples of the aromatic ring contained in the aromatic hydrocarbon group include aromatic hydrocarbon rings, such as benzene, biphenyl, fluorene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom.

Specific examples of the aromatic hydrocarbon group include a group in which two hydrogen atoms have been removed from the aforementioned aromatic hydrocarbon ring (arylene group); and a group in which one hydrogen atom has been removed from the aforementioned aromatic hydrocarbon ring (aryl group) and one hydrogen atom has been substituted with an alkylene group (such as a benzyl group, a phenethyl group, a 1-naphthylmethyl group, a 2-naphthylmethyl group, a 1-naphthylethyl group, or a 2-naphthylethyl group). The alkylene group (alkyl chain within the arylalkyl group) preferably has 1 to 4 carbon atom, more preferably 1 or 2, and most preferably 1.

In the aforementioned formula (a1-2), the hydrocarbon group for $Wa^1$ having a valency of $n_{a2}+1$ may be either an aliphatic hydrocarbon group or an aromatic hydrocarbon group. The aliphatic cyclic group refers to a hydrocarbon group that has no aromaticity, and may be either saturated or unsaturated, but is preferably saturated. Examples of the aliphatic hydrocarbon group include a linear or branched aliphatic hydrocarbon group, an aliphatic hydrocarbon group containing a ring in the structure thereof, and a combination of the linear or branched aliphatic hydrocarbon group and the aliphatic hydrocarbon group containing a ring in the structure thereof. As the specific examples thereof, the same groups as those described above for $Va^1$ in the aforementioned formula (a1-1) can be mentioned.

The valency of $n_{a2}+1$ is preferably divalent, trivalent or tetravalent, and divalent or trivalent is more preferable.

As the structural unit (a1-2), a structural unit represented by general formula (a1-2-01) shown below is particularly desirable.

[Chemical Formula 10]

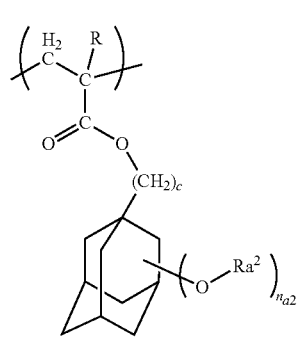

(a1-2-01)

In the formula (a1-2-01), $Ra^2$ represents an acid dissociable group represented by the aforementioned formula (a1-r-1) or (a1-r-3); $n_{n2}$ is an integer of 1 to 3, preferably 1 or 2, and more preferably 1; c is an integer of 0 to 3, preferably 0 or 1, and more preferably 1; R is the same as defined above.

Specific examples of the structural units (a1-1) and (a1-2) are shown below. In the formulae shown below, $R^\alpha$ represents a hydrogen atom, a methyl group or a trifluoromethyl group.

[Chemical Formula 11]

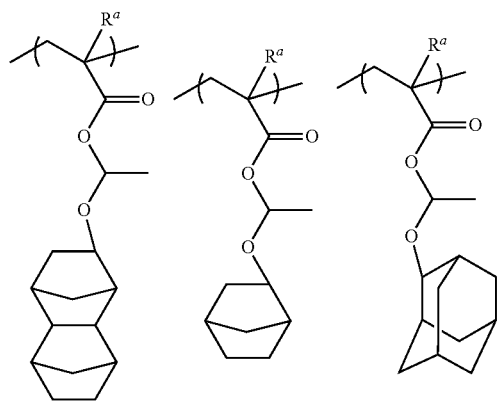

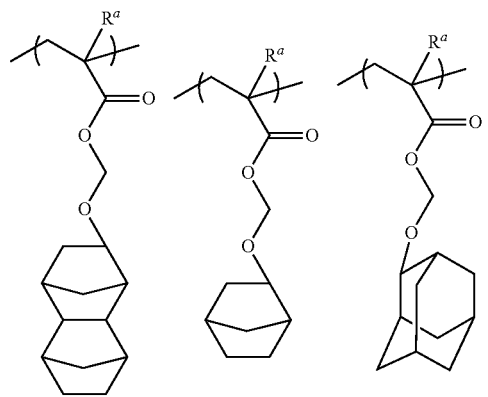

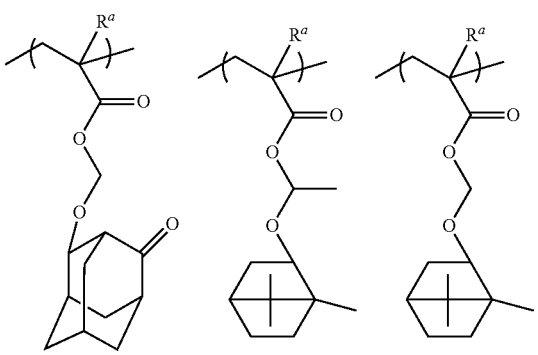

-continued

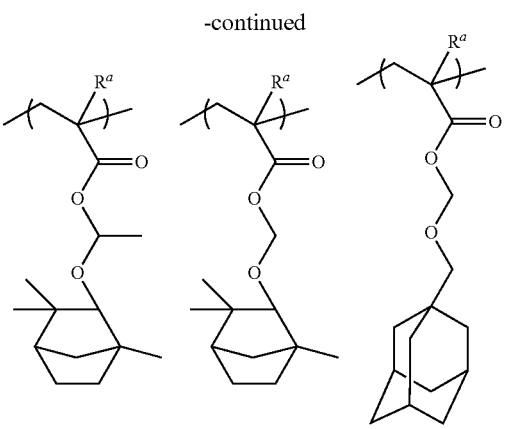

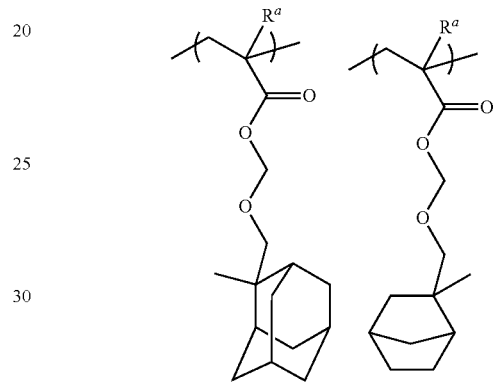

[Chemical Formula 12]

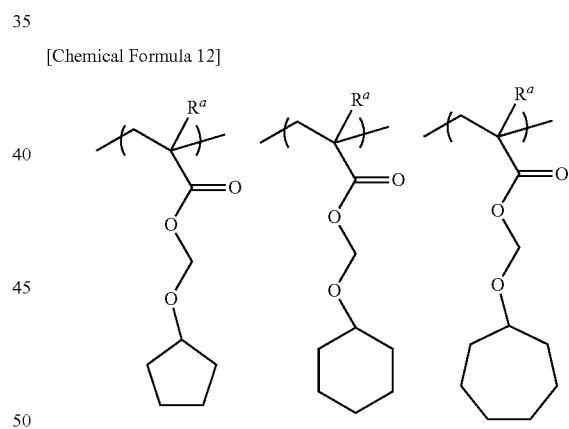

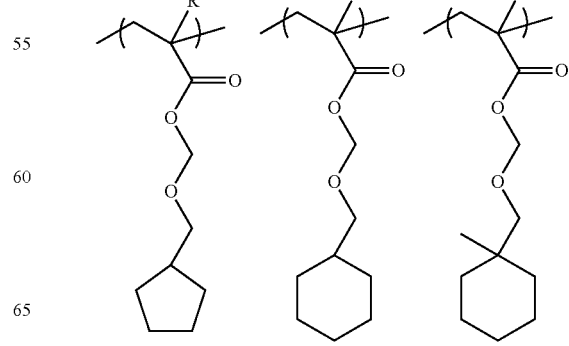

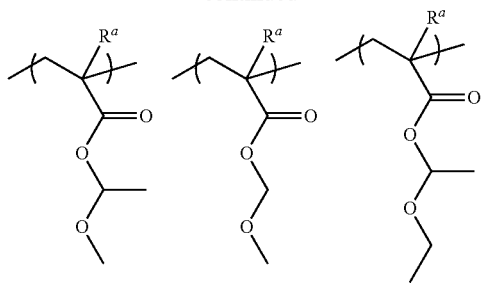
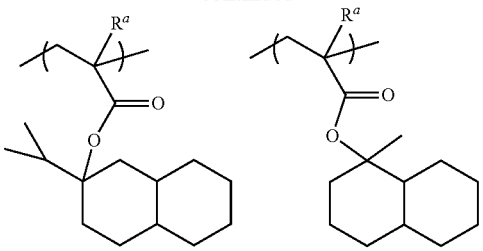
[Chemical Formula 13]
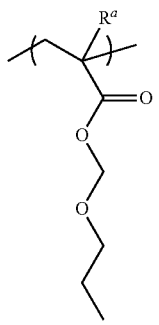
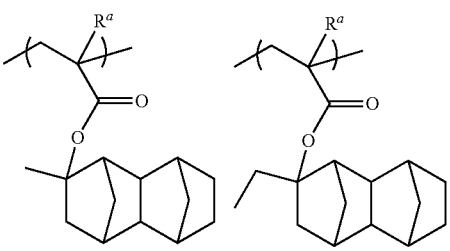
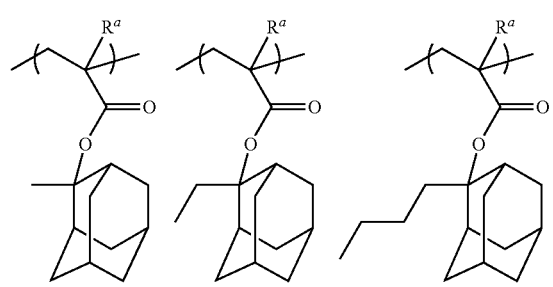
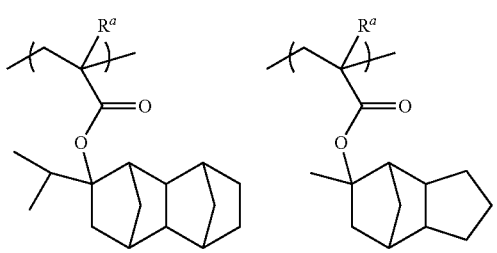
[Chemical Formula 14]
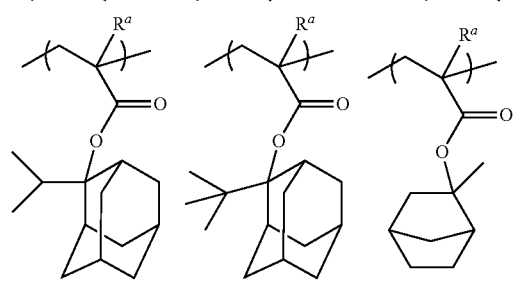
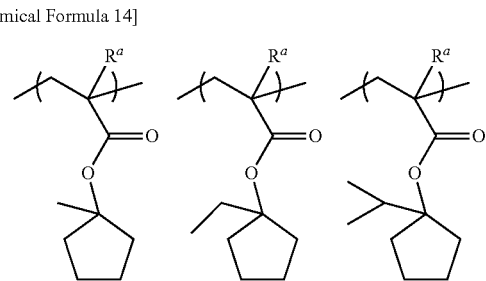
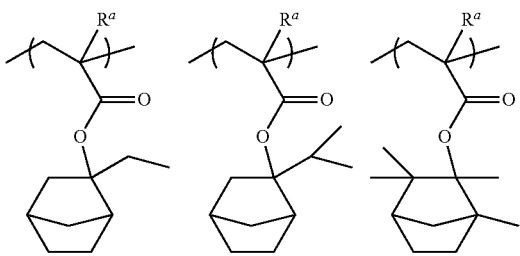
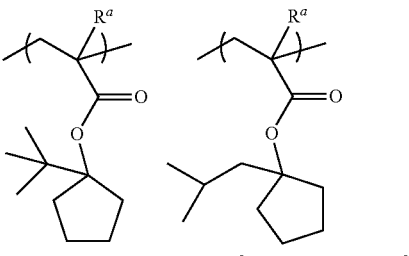
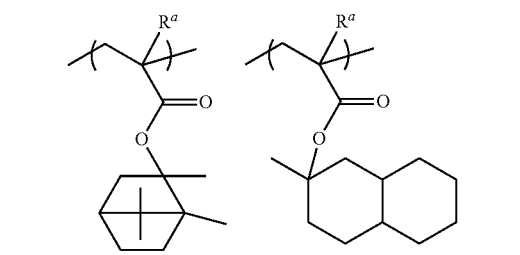
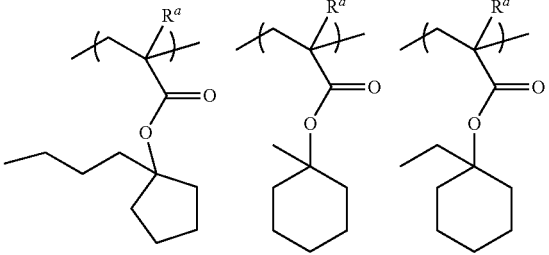
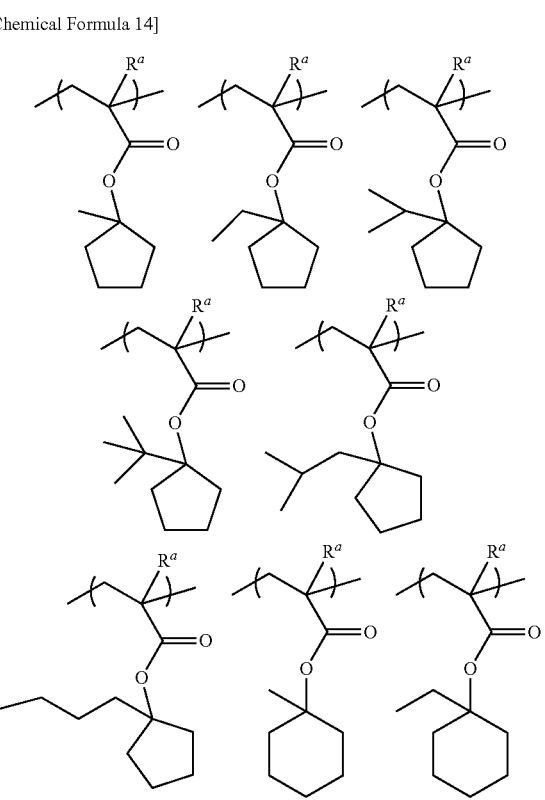

-continued

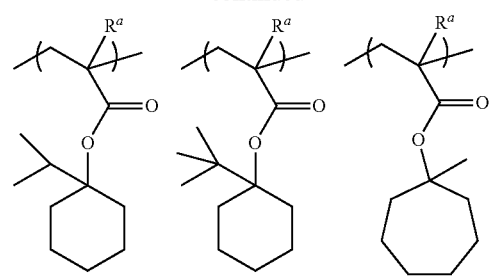

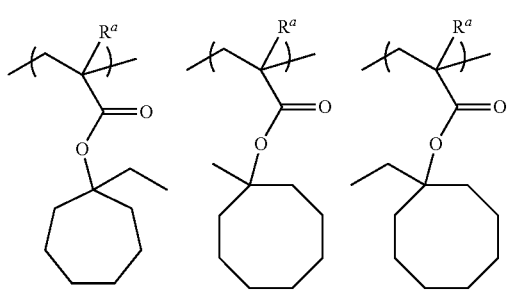

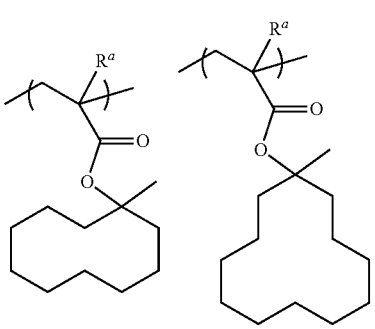

[Chemical Formula 15]

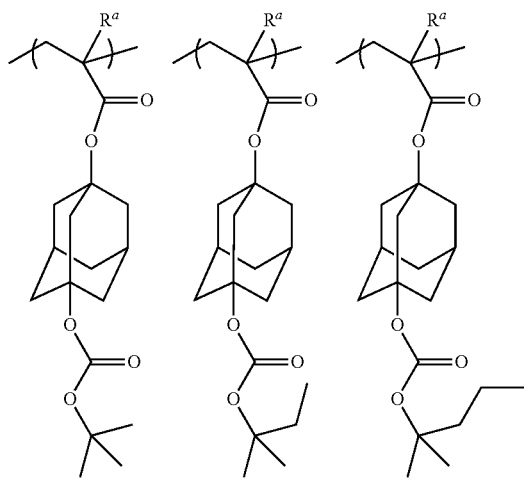

-continued

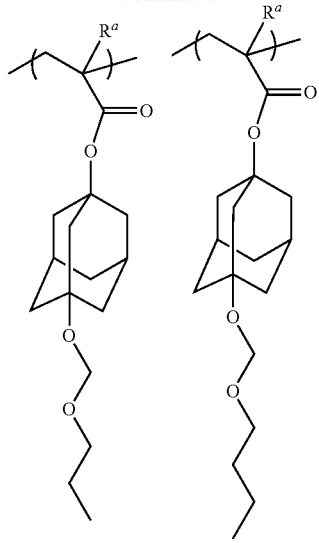

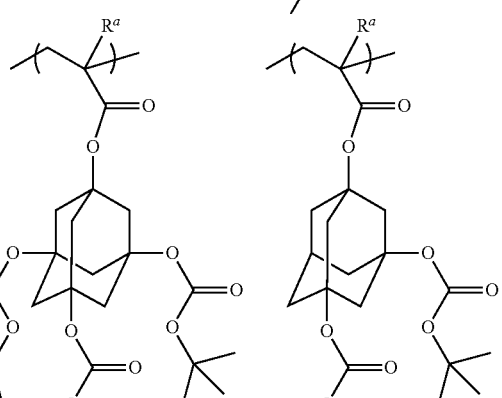

In the component (A), the amount of the structural unit (a1) based on the combined total of all structural units constituting the component (A) is preferably 20 to 80 mol %, more preferably 20 to 75 mol %, and still more preferably 25 to 70 mol %. By ensuring the lower limit, various lithography properties such as sensitivity, resolution and LWR are improved. On the other hand, when the amount of the structural unit (a1) is no more than the upper limit of the above-mentioned range, a good balance can be achieved with the other structural units.

(Structural Unit (a2))

The structural unit (a2) is a structural unit containing an —$SO_2$— containing cyclic group.

When the component (A1) is used for forming a resist film, the structural unit (a2) containing an —$SO_2$— containing cyclic group is effective in improving the adhesion between the resist film and the substrate.

In the present invention, the component (A1) preferably has a structural unit (a2).

The aforementioned structural unit (a1) which contains an —$SO_2$— containing cyclic group falls under the definition of the structural unit (a2); however, such a structural unit is regarded as a structural unit (a1), and does not fall under the definition of the structural unit (a2).

The structural unit (a2) is preferably a structural unit represented by general formula (a2-1) shown below.

[Chemical Formula 16]

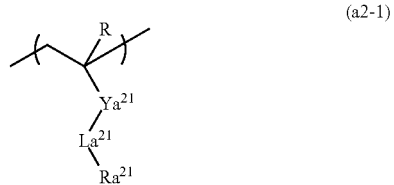

(a2-1)

In the formula, R represents a hydrogen atom, an alkyl group of 1 to 5 carbon atoms, a halogenated alkyl group of 1 to 5 carbon atoms, a hydroxyalkyl group, an alkoxy group; $Ya^{21}$ represents a single bond or a divalent linking group; $La^{21}$ represents —O—, —COO—, —CON(R')—, —OCO—, —CONHCO— or —CONHCS—; and R' represents a hydrogen atom or a methyl group, provided that, when $La^{21}$ represents —O—, $Ya^{21}$ does not represents —CO—; $Ra^{21}$ represents an —$SO_2$— containing cyclic group.

The divalent linking group for $Ya^{21}$ is not particularly limited, and preferable examples thereof include a divalent hydrocarbon group which may have a substituent and a divalent linking group containing a hetero atom.

(Divalent Hydrocarbon Group which May have a Substituent)

The hydrocarbon group as a divalent linking group may be either an aliphatic hydrocarbon group or an aromatic hydrocarbon group.

An "aliphatic hydrocarbon group" refers to a hydrocarbon group that has no aromaticity. The aliphatic hydrocarbon group may be saturated or unsaturated. In general, the aliphatic hydrocarbon group is preferably saturated.

Examples of the aliphatic hydrocarbon group include a linear or branched aliphatic hydrocarbon group, and an aliphatic hydrocarbon group containing a ring in the structure thereof. Specifically, groups exemplified above for $Va^1$ in the aforementioned formula (a1-1) can be mentioned.

The linear or branched aliphatic hydrocarbon group may or may not have a substituent. Examples of the substituent include a fluorine atom, a fluorinated alkyl group of 1 to 5 carbon atoms, and a carbonyl group.

As examples of the hydrocarbon group containing a ring in the structure thereof, a cyclic aliphatic hydrocarbon group containing a hetero atom in the ring structure thereof and may have a substituent (a group in which two hydrogen atoms have been removed from an aliphatic hydrocarbon ring), a group in which the cyclic aliphatic hydrocarbon group is bonded to the terminal of the aforementioned chain-like aliphatic hydrocarbon group, and a group in which the cyclic aliphatic group is interposed within the aforementioned linear or branched aliphatic hydrocarbon group, can be given. As the linear or branched aliphatic hydrocarbon group, the same groups as those described above can be used.

The cyclic aliphatic hydrocarbon group preferably has 3 to 20 carbon atoms, and more preferably 3 to 12 carbon atoms.

Specific examples of the cyclic aliphatic hydrocarbon group include the same group as exemplified above for $Va^1$ in the aforementioned formula (a1-1).

The cyclic aliphatic hydrocarbon group may or may not have a substituent. Examples of the substituent include an alkyl group, an alkoxy group, a halogen atom, a halogenated alkyl group, a hydroxyl group and a carbonyl group.

The alkyl group as the substituent is preferably an alkyl group of 1 to 5 carbon atoms, and a methyl group, an ethyl group, a propyl group, an n-butyl group or a tert-butyl group is particularly desirable.

The alkoxy group as the substituent is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom for the substituent include a fluorine atom, a chlorine atom, a bromine atom and an iodine atom, and a fluorine atom is preferable.

Examples of the halogenated alkyl group for the substituent include groups in which part or all of the hydrogen atoms within the aforementioned alkyl groups has been substituted with the aforementioned halogen atoms.

The cyclic aliphatic hydrocarbon group may have part of the carbon atoms constituting the ring structure thereof substituted with a substituent containing a hetero atom. As the substituent containing a hetero atom, —O—, —C(=O)—O—, —S—, —S(=O)$_2$— or —S(=O)$_2$—O— is preferable.

Specific examples of the aromatic hydrocarbon group as a divalent hydrocarbon group include the same group as exemplified above for $Va^1$ in the aforementioned formula (a1-1).

With respect to the aromatic hydrocarbon group, the hydrogen atom within the aromatic hydrocarbon group may be substituted with a substituent. For example, the hydrogen atom bonded to the aromatic ring within the aromatic hydrocarbon group may be substituted with a substituent. Examples of substituents include an alkyl group, an alkoxy group, a halogen atom, a halogenated alkyl group, and a hydroxyl group.

The alkyl group as the substituent is preferably an alkyl group of 1 to 5 carbon atoms, and a methyl group, an ethyl group, a propyl group, an n-butyl group or a tert-butyl group is particularly desirable.

As the alkoxy group, the halogen atom and the halogenated alkyl group for the substituent, the same groups as the aforementioned substituent groups for substituting a hydrogen atom within the cyclic aliphatic hydrocarbon group can be used.

(Divalent Linking Group Containing a Hetero Atom)

With respect to a divalent linking group containing a hetero atom, a hetero atom is an atom other than carbon and hydrogen, and examples thereof include an oxygen atom, a nitrogen atom, a sulfur atom and a halogen atom.

In the case where $Ya^{21}$ represents a divalent linking group containing a hetero atom, preferable examples of the linking group include —O—, —C(=O)—O—, —C(=O)—, —O—C(=O)—O—, —C(=O)—NH—, —NH—, —NH—C(=NH)— (wherein H may be substituted with a substituent such as an alkyl group or an acyl group), —S—, —S(=O)₂—, —S(=O)₂—O—, a group represented by general formula —Y²¹—O—Y²²—, —Y²¹—O—, —Y²¹—C(=O)—O—, —C(=O)—O—Y²¹, —[Y²¹—C(=O)—O]$_{m'}$—Y²²— [in the formulae, Y²¹ and Y²² each independently represents a divalent hydrocarbon group which may have a substituent, and O represents an oxygen atom; and m' represents an integer of 0 to 3.

The divalent linking group containing a hetero atom represents —C(=O)—NH—, —NH—, or —NH—C(=NH)—, H may be substituted with a substituent such as an alkyl group, an acyl group or the like. The substituent (an alkyl group, an acyl group or the like) preferably has 1 to 10 carbon atoms, more preferably 1 to 8, and most preferably 1 to 5.

In formulae —Y²¹—O—Y²², —Y²¹—O—, —Y²¹—C(=O)—O—, —C(=O)—O—Y²¹, —[Y²¹—C(=O)—O]$_{m'}$—Y²²— and —Y²¹—O—C(=O)—Y²²—, Y²¹ and Y²² each independently represents a divalent hydrocarbon group which may have a substituent. Examples of the divalent hydrocarbon group include the same groups as those described above as the "divalent hydrocarbon group which may have a substituent" in the explanation of the aforementioned divalent linking group.

As Y²¹, a linear aliphatic hydrocarbon group is preferable, more preferably a linear alkylene group, still more preferably a linear alkylene group of 1 to 5 carbon atoms, and a methylene group or an ethylene group is particularly desirable.

As Y²², a linear or branched aliphatic hydrocarbon group is preferable, and a methylene group, an ethylene group or an alkylmethylene group is more preferable. The alkyl group within the alkylmethylene group is preferably a linear alkyl group of 1 to 5 carbon atoms, more preferably a linear alkyl group of 1 to 3 carbon atoms, and most preferably a methyl group.

In the group represented by the formula —[Y²¹—C(=O)—O]$_{m'}$—Y²²—, m' represents an integer of 0 to 3, preferably an integer of 0 to 2, more preferably 0 or 1, and most preferably 1. Namely, it is particularly desirable that the group represented by the formula —[Y²¹—C(=O)—O]$_{m'}$—Y²²— is a group represented by the formula —Y²¹—C(=O)—O—Y²²—. Among these, a group represented by the formula —(CH₂)$_{a'}$—C(=O)—O—(CH₂)$_{b'}$— is preferable. In the formula, a' is an integer of 1 to 10, preferably an integer of 1 to 8, more preferably an integer of 1 to 5, still more preferably 1 or 2, and most preferably 1. b' is an integer of 1 to 10, preferably an integer of 1 to 8, more preferably an integer of 1 to 5, still more preferably 1 or 2, and most preferably 1.

In the present invention, Ya²¹ preferably represents an ester bond [—C(=O)—O—], an ether bond (—O—), a linear or branched alkylene group, a combination of these, or a single bond.

In formula (a2-1), Ra²¹ represents a —SO₂— containing cyclic group.

An "—SO₂— containing cyclic group" refers to a cyclic group having a ring containing —SO₂— within the ring structure thereof, i.e., a cyclic group in which the sulfur atom (S) within —SO₂— forms part of the ring skeleton of the cyclic group. The ring containing —SO₂— within the ring skeleton thereof is counted as the first ring. A cyclic group in which the only ring structure is the ring that contains —SO₂— in the ring skeleton thereof is referred to as a monocyclic group, and a group containing other ring structures is described as a polycyclic group regardless of the structure of the other rings. The —SO₂— containing cyclic group may be either a monocyclic group or a polycyclic group.

As the —SO₂— containing cyclic group for the cyclic hydrocarbon group represented by R¹, a cyclic group containing —O—SO₂— within the ring skeleton thereof, i.e., a cyclic group containing a sultone ring in which —O—S— within the —O—SO₂— group forms part of the ring skeleton thereof is particularly desirable. Specific examples of the —SO₂— containing cyclic group include groups represented by general formulae (a1-r-1) to (a5-r-4) shown below.

[Chemical Formula 17]

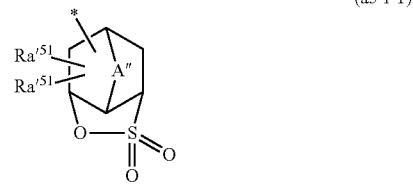
(a5-r-1)

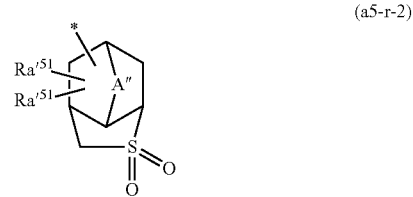
(a5-r-2)

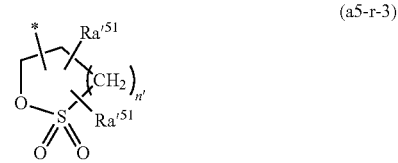
(a5-r-3)

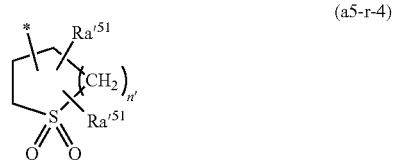
(a5-r-4)

In the formulae, each Ra'⁵¹ independently represents a hydrogen atom, an alkyl group, an alkoxy group, a halogen atom, a halogenated alkyl group, a hydroxy group, —COOR", —OC(=O)R", a hydroxyalkyl group or a cyano group; R" represents a hydrogen atom or an alkyl group; A" represents an oxygen atom, a sulfur atom or an alkylene group of 1 to 5 carbon atoms which may contain an oxygen atom or a sulfur atom; and n' represents an integer of 0 to 2.

In general formulae (a1-r-1) to (a5-r-4), A" is the same as defined for A" in general formulae (a1-r-1) to (a2-r-7). The alkyl group, alkoxy group, halogen atom, halogenated alkyl group, —COOR", —OC(=O)R" and hydroxyalkyl group for Ra'⁵¹ are the same as defined for Ra'²¹ in the aforementioned general formulae (a2-r-1) to (a2-r-7).

Specific examples of the groups represented by the aforementioned general formulas (a5-r-1) to (a5-r-4) are shown below. In the formulae shown below, "Ac" represents an acetyl group.

[Chemical Formula 18]
(r-sl-1-1) 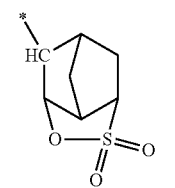
(r-sl-1-2) 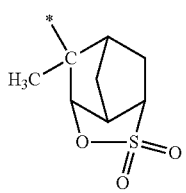
(r-sl-1-3) 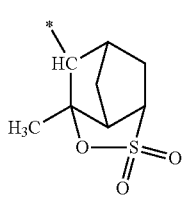
(r-sl-1-4) 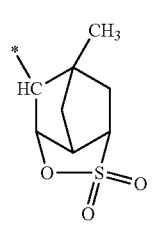
(r-sl-1-5) 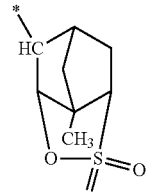
(r-sl-1-6) 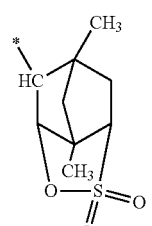
(r-sl-1-7) 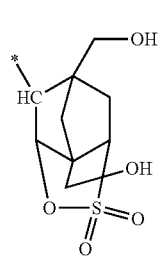
(r-sl-1-8) 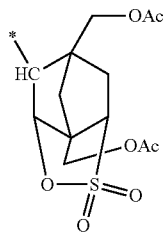
(r-sl-1-9) 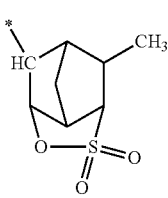
(r-sl-1-10) 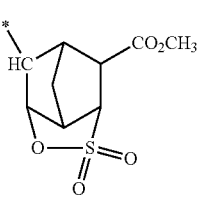
(r-sl-1-11) 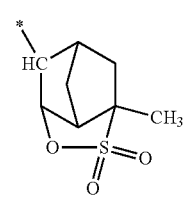
(r-sl-1-12) 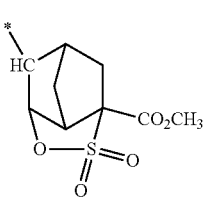
(r-sl-1-13) 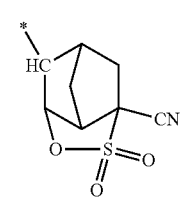
(r-sl-1-14) 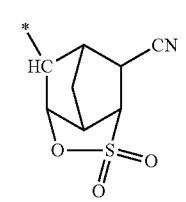
(r-sl-1-15) 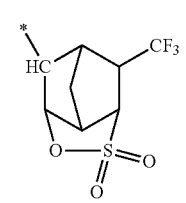

[Chemical Formula 19]

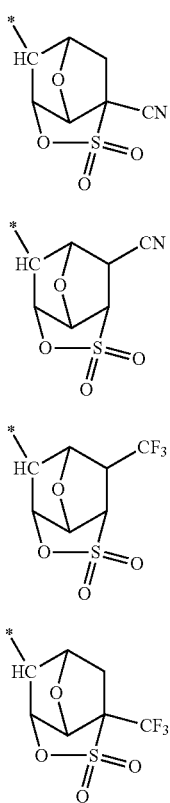

As the —$SO_2$— containing cyclic group, a group represented by the aforementioned general formula (a5-r-1) is preferable, at least one member selected from the group consisting of groups represented by the aforementioned chemical formulas (r-sl-1-1), (r-sl-1-18), (r-sl-3-1) and (r-sl-4-1) is more preferable, and a group represented by chemical formula (r-sl-1-1) is most preferable.

As the structural unit (a2) contained in the component (A1), 1 type of structural unit may be used, or 2 or more types may be used.

When the component (A1) contains the structural unit (a2), the amount of the structural unit (a2) based on the combined total of all structural units constituting the component (A1) is preferably 1 to 80 mol %, more preferably 5 to 70 mol %, still more preferably 10 to 65 mol %, and most preferably 10 to 60 mol %. When the amount of the structural unit (a2) is at least as large as the lower limit of the above-mentioned range, the effect of using the structural unit (a2) can be satisfactorily achieved. On the other hand, when the amount of the structural unit (a2) is no more than the upper limit of the above-mentioned range, a good balance can be achieved with the other structural units, and various lithography properties and pattern shape can be improved.

(Structural Unit (a3))

The structural unit (a3) is a structural unit containing a polar group-containing aliphatic hydrocarbon group (provided that the structural units that fall under the definition of structural units (a1)) and (a2) are excluded).

When the component (A1) includes the structural unit (a3), it is presumed that the hydrophilicity of the component (A1) is enhanced, thereby contributing to improvement in resolution.

Examples of the polar group include a hydroxyl group, cyano group, carboxyl group, or hydroxyalkyl group in which part of the hydrogen atoms of the alkyl group have been substituted with fluorine atoms, although a hydroxyl group is particularly desirable.

Examples of the aliphatic hydrocarbon group include linear or branched hydrocarbon groups (preferably alkylene groups) of 1 to 10 carbon atoms, and cyclic aliphatic hydrocarbon groups (cyclic groups). These cyclic groups can be selected appropriately from the multitude of groups that have been proposed for the resins of resist compositions designed for use with ArF excimer lasers. The cyclic group is preferably a polycyclic group, more preferably a polycyclic group of 7 to 30 carbon atoms.

Of the various possibilities, structural units derived from an acrylate ester that include an aliphatic polycyclic group that contains a hydroxyl group, cyano group, carboxyl group or a hydroxyalkyl group in which part of the hydrogen atoms of the alkyl group have been substituted with fluorine atoms are particularly desirable. Examples of the polycyclic group include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

As the structural unit (a3), there is no particular limitation as long as it is a structural unit containing a polar group-containing aliphatic hydrocarbon group, and an arbitrary structural unit may be used.

The structural unit (a3) is preferably a structural unit derived from an acrylate ester which may have the hydrogen atom bonded to the carbon atom on the α-position substituted with a substituent and contains a polar group-containing aliphatic hydrocarbon group.

When the aliphatic hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulas (a3-1), (a3-2) and (a3-3) shown below are preferable.

[Chemical Formula 21]

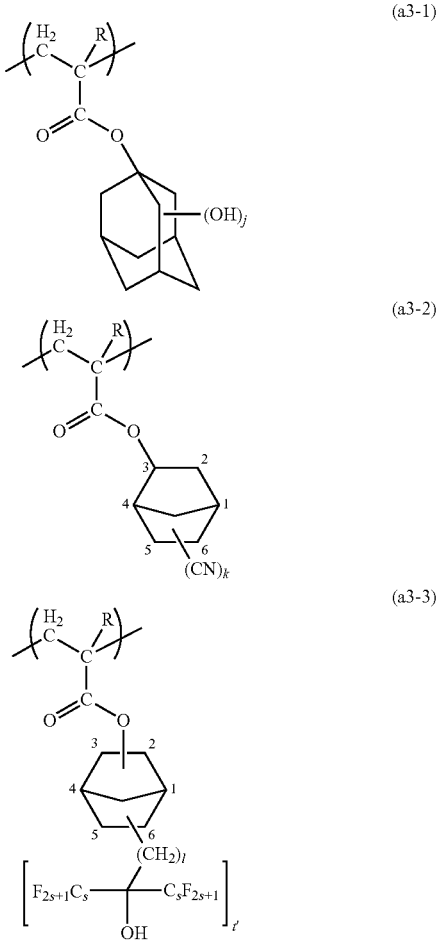

In the formulas, R is the same as defined above; j is an integer of 1 to 3; k is an integer of 1 to 3; t' is an integer of 1 to 3; l is an integer of 1 to 5; and s is an integer of 1 to 3.

In formula (a3-1), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group.

j is preferably 1, and it is particularly desirable that the hydroxyl group be bonded to the 3rd position of the adamantyl group.

In formula (a3-2), k is preferably 1. The cyano group is preferably bonded to the 5th or 6th position of the norbornyl group.

In formula (a3-3), t' is preferably 1. l is preferably 1. s is preferably 1. Further, it is preferable that a 2-norbornyl group or 3-norbornyl group be bonded to the terminal of the carboxy group of the acrylic acid. The fluorinated alkyl alcohol is preferably bonded to the 5th or 6th position of the norbornyl group.

As the structural unit (a3) contained in the component (A1), 1 type of structural unit may be used, or 2 or more types may be used.

The amount of the structural unit (a3) within the component (A1) based on the combined total of all structural units constituting the component (A1) is preferably 5 to 50 mol %, more preferably 5 to 40 mol %, and still more preferably 5 to 25 mol %.

When the amount of the structural unit (a3) is at least as large as the lower limit of the above-mentioned range, the effect of using the structural unit (a3) can be satisfactorily achieved. On the other hand, when the amount of the structural unit (a3) is no more than the upper limit of the above-mentioned range, a good balance can be achieved with the other structural units.

(Structural Unit (a4))

The structural unit (a4) is a structural unit containing an acid non-dissociable cyclic group. When the component (A1) includes the structural unit (a4), dry etching resistance of the resist pattern to be formed is improved. Further, the hydrophobicity of the component (A1) is further improved. Increase in the hydrophobicity contributes to improvement in terms of resolution, shape of the resist pattern and the like, particularly in an organic solvent developing process.

An "acid non-dissociable, aliphatic cyclic group" in the structural unit (a4) refers to a cyclic group which is not dissociated by the action of acid generated from the component (13) described later upon exposure, and remains in the structural unit.

As the structural unit (a4), a structural unit which contains a non-acid-dissociable aliphatic cyclic group, and is also derived from an acrylate ester is preferable. Examples of this cyclic group include the same groups as those described above in relation to the aforementioned structural unit (a1), and any of the multitude of conventional groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecyl group, adamantyl group, tetracyclododecyl group, isobornyl group, and norbornyl group is particularly desirable. These polycyclic groups may be substituted with a linear or branched alkyl group of 1 to 5 carbon atoms.

Specific examples of the structural unit (a4) include units with structures represented by general formulas (a4-1) to (a4-7) shown below.

[Chemical Formula 22]

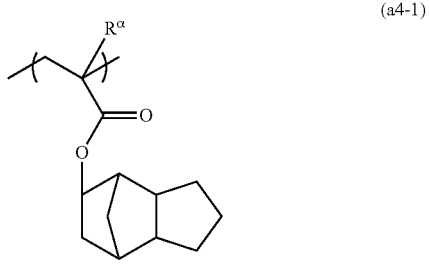

(a4-2) 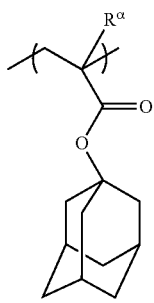

(a4-3) 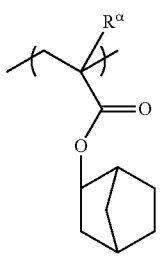

(a4-4) 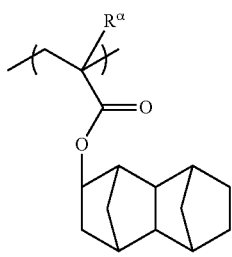

(a4-5) 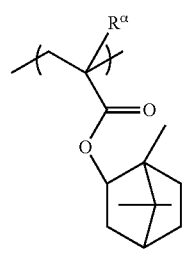

(a4-6) 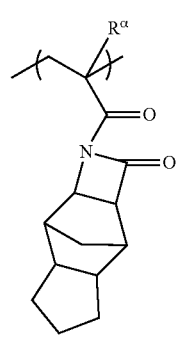

(a4-7) 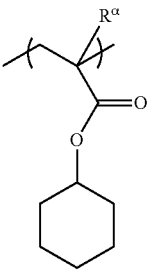

In the formulae, $R^\alpha$ represents a hydrogen atom, a methyl group or a trifluoromethyl group.

As the structural unit (a4) contained in the component (A1), 1 type of structural unit may be used, or 2 or more types may be used.

When the structural unit (a4) is included in the component (A1), the amount of the structural unit (a4) based on the combined total of all the structural units that constitute the component (A1) is preferably within the range from 1 to 30 mol %, and more preferably from 10 to 20 mol %.

(Structural Unit (a5))

The structural unit (a5) is a structural unit containing a lactone-containing cyclic group or a carbonate-containing cyclic group.

When the component (A1) is used for forming a resist film, the structural unit (a5) containing a lactone-containing cyclic group or a carbonate-containing cyclic group is effective in improving the adhesion between the resist film and the substrate.

The aforementioned structural unit (a1) which contains a lactone-containing cyclic group or a carbonate-containing cyclic group falls under the definition of the structural unit (a5); however, such a structural unit is regarded as a structural unit (a1), and does not fall under the definition of the structural unit (a5).

As the structural unit (a5), a structural unit represented by the aforementioned formula (a2-1) in which $Ra^{21}$ represents a lactone-containing cyclic group or a carbonate-containing cyclic group is preferable.

The term "lactone-containing cyclic group" refers to a cyclic group including a ring containing a —O—C(=O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings. The lactone-containing cyclic group may be either a monocyclic group or a polycyclic group.

The lactone-containing cyclic group as the cyclic hydrocarbon group for $R^1$ is not particularly limited, and an arbitrary group may be used. Specific examples include groups represented by general formulas (a2-r-1) to (a2-r-7) shown below. Hereinbelow, "*" represents a valence bond.

[Chemical Formula 23]

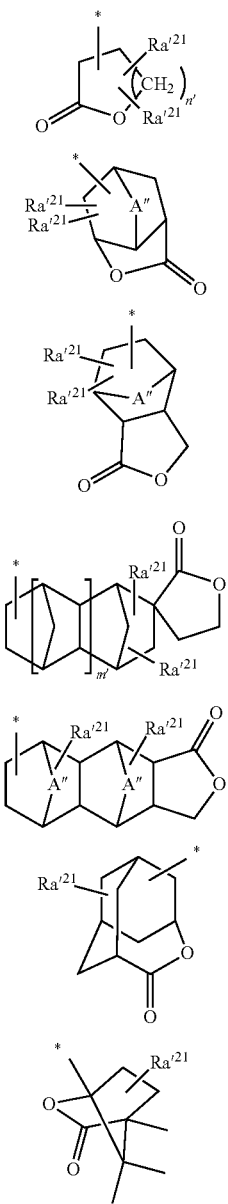

In the formulae, each Ra'²¹ independently represents a hydrogen atom, an alkyl group, an alkoxy group, a halogen atom, a halogenated alkyl group, a hydroxy group, —COOR", —OC(=O)R", a hydroxyalkyl group or a cyano group; R" represents a hydrogen atom or an alkyl group; A" represents an oxygen atom, a sulfur atom or an alkylene group of 1 to 5 carbon atoms which may contain an oxygen atom or a sulfur atom; n' represents an integer of 0 to 2; and m' represents 0 or 1.

In general formulae (a2-r-1) to (a2-r-7) above, A" represents an oxygen atom (—O—), a sulfur atom (—S—) or an alkylene group of 1 to 5 carbon atoms which may contain an oxygen atom or a sulfur atom. As the alkylene group of 1 to 5 carbon atoms for A", a linear or branched alkylene group is preferable, and examples thereof include a methylene group, an ethylene group, an n-propylene group and an isopropylene group. Examples of alkylene groups that contain an oxygen atom or a sulfur atom include the aforementioned alkylene groups in which —O— or —S— is bonded to the terminal of the alkylene group or present between the carbon atoms of the alkylene group. Specific examples of such alkylene groups include —O—CH₂—, —CH₂—O—CH₂—, —S—CH₂— and —CH₂—S—CH₂—. As A", an alkylene group of 1 to 5 carbon atoms or —O— is preferable, more preferably an alkylene group of 1 to 5 carbon atoms, and most preferably a methylene group. Each Ra'²¹ independently represents an alkyl group, an alkoxy group, a halogen atom, a halogenated alkyl group, -COOR", -OC(=O)R", a hydroxyalkyl group or a cyano group.

The alkyl group for Ra'²¹ is preferably an alkyl group of 1 to 5 carbon atoms.

The alkoxy group for Ra'²¹ is preferably an alkoxy group of 1 to 6 carbon atoms.

Further, the alkoxy group is preferably a linear or branched alkoxy group. Specific examples of the alkoxy groups include the aforementioned alkyl groups for Ra'²¹ having an oxygen atom (—O—) bonded thereto.

As examples of the halogen atom for Ra'²¹, a fluorine atom, chlorine atom, bromine atom and iodine atom can be given. Among these, a fluorine atom is preferable.

Examples of the halogenated alkyl group for Ra'²¹ include groups in which part or all of the hydrogen atoms within the aforementioned alkyl group for Ra'²¹ has been substituted with the aforementioned halogen atoms. As the halogenated alkyl group, a fluorinated alkyl group is preferable, and a perfluoroalkyl group is particularly desirable.

Specific examples of the groups represented by the aforementioned general formulae (a2-r-1) to (a2-r-7) are shown below.

[Chemical Formula 24]

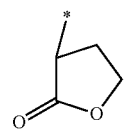

(r-lc-1-1)

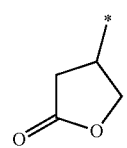

(r-lc-1-2)

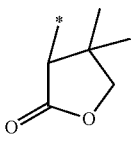

(r-lc-1-3)

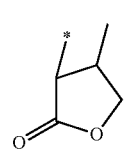

(r-lc-1-4)

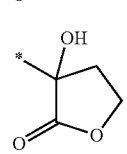

(r-lc-1-5)

(r-lc-1-6)
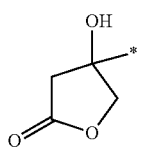
(r-lc-1-7)
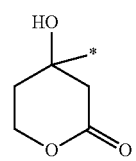
(r-lc-2-1)
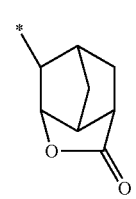
(r-lc-2-2)
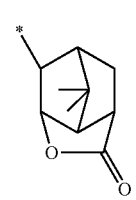
(r-lc-2-3)
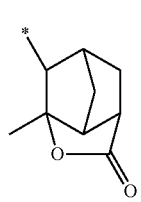
(r-lc-2-4)
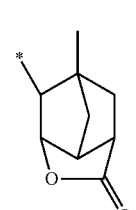
(r-lc-2-5)
(r-lc-2-6)
(r-lc-2-7)
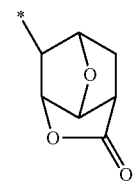
(r-lc-2-8)
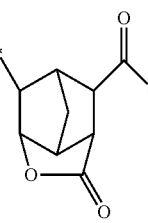
(r-lc-2-9)
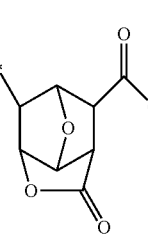
(r-lc-2-10)
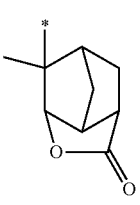
(r-lc-2-11)
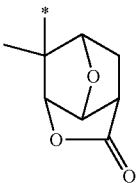
(r-lc-2-12)
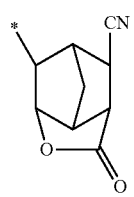
(r-lc-2-13)
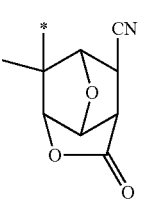
(r-lc-3-1)
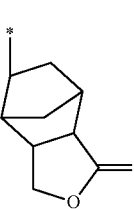

-continued
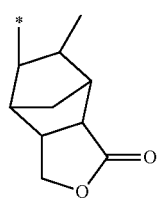 (r-lc-3-2)
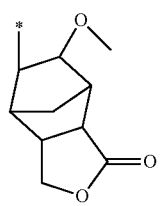 (r-lc-3-3)
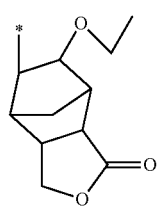 (r-lc-3-4)
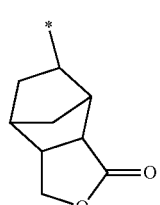 (r-lc-3-5)
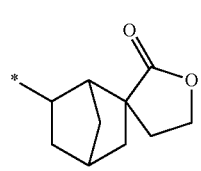 (r-lc-4-1)
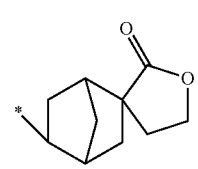 (r-lc-4-2)
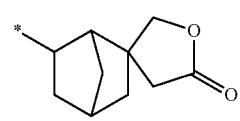 (r-lc-4-3)
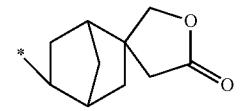 (r-lc-4-4)
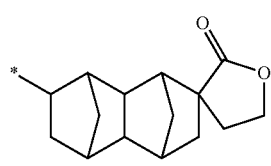 (r-lc-4-5)
-continued
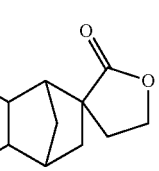 (r-lc-4-6)
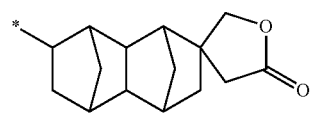 (r-lc-4-7)
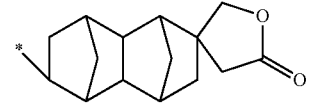 (r-lc-4-8)
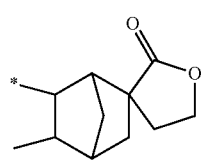 (r-lc-4-9)
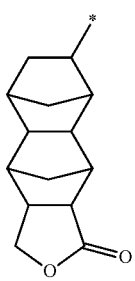 (r-lc-5-1)
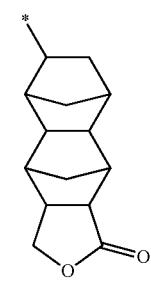 (r-lc-5-2)
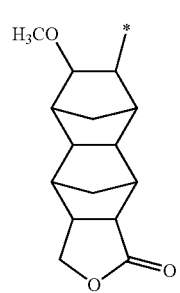 (r-lc-5-3)

-continued (r-lc-5-4)

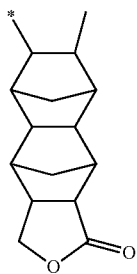

(r-lc-6-1)

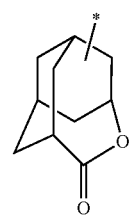

(r-lc-7-1)

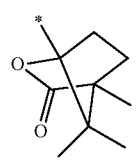

The term "carbonate-containing cyclic group" refers to a cyclic group including a ring containing a —O—C(=O)—O— structure (carbonate ring). The term "carbonate ring" refers to a single ring containing a —O—C(=O)—O— structure, and this ring is counted as the first ring. A carbonate-containing cyclic group in which the only ring structure is the carbonate ring is referred to as a monocyclic group, and groups containing other ring structures are described as polycyclic groups regardless of the structure of the other rings. The carbonate-containing cyclic group may be either a monocyclic group or a polycyclic group.

The carbonate-containing cyclic group as the cyclic hydrocarbon group for $R^1$ is not particularly limited, and an arbitrary group may be used. Specific examples include groups represented by general formulas (ax3-r-1) to (ax3-r-3) shown below.

[Chemical Formula 25]

(ax3-r-1)

(ax3-r-2)

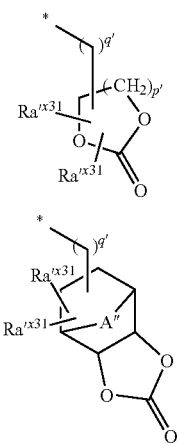

-continued (ax3-r-3)

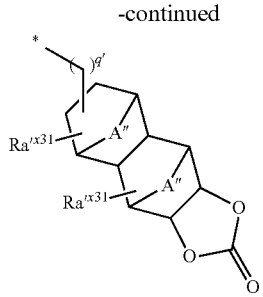

In the formulae, each $Ra'^{x31}$ independently represents a hydrogen atom, an alkyl group, an alkoxy group, a halogen atom, a halogenated alkyl group, a hydroxy group, —COOR", —OC(=O)R", a hydroxyalkyl group or a cyano group; R" represents a hydrogen atom or an alkyl group; A" represents an oxygen atom, a sulfur atom or an alkylene group of 1 to 5 carbon atoms which may contain an oxygen atom or a sulfur atom; and q' represents 0 or 1.

In general formulae (ax3-r-1) to (ax3-r-3), A" is the same as defined for A" in general formula (a2-r-1).

Examples of the alkyl group, alkoxy group, halogen atom, halogenated alkyl group, —COOR", —OC(=O)R" and hydroxyalkyl group for $Ra'^{31}$ include the same groups as those described above in the explanation of $Ra'^{21}$ in the general formulas (a2-r-1) to (a2-r-7).

Specific examples of the groups represented by the aforementioned general formulae (ax3-r-1) to (ax3-r-3) are shown below.

[Chemical Formula 26]

(r-cr-1-1)

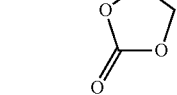

(r-cr-1-2)

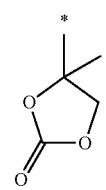

(r-cr-1-3)

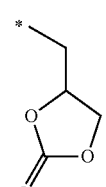

(r-cr-1-4)

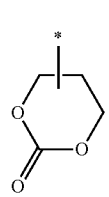

(r-cr-1-5)
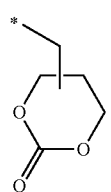
(r-cr-1-6)
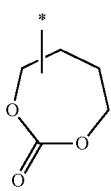
(r-cr-1-6)
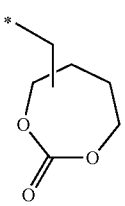
(r-cr-2-1)
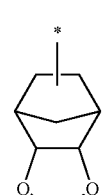
(r-cr-2-2)
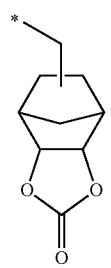
(r-cr-2-3)
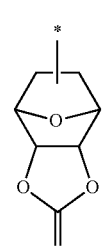
(r-cr-2-4)
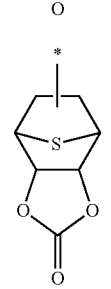
(r-cr-3-1)
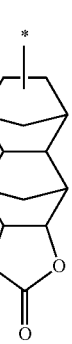
(r-cr-3-2)
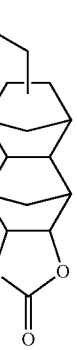
(r-cr-3-3)
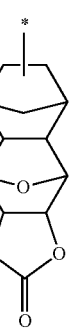
(r-cr-3-4)
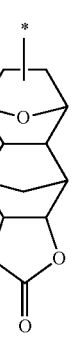

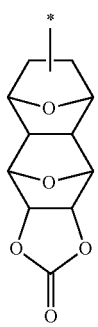

(r-cr-3-5)

Among these examples, as the lactone-containing cyclic group, a group represented by general formula (a2-r-1) or (a2-r-2) is preferable, and a group represented by the chemical formula (r-lc-1-1) is more preferable.

As the structural unit (a5) contained in the component (A1), 1 type of structural unit may be used, or 2 or more types may be used.

When the component (A1) contains the structural unit (a5), the amount of the structural unit (a5) based on the combined total of all structural units constituting the component (A1) is preferably 1 to 80 mol %, more preferably 5 to 70 mol %, still more preferably 10 to 65 mol %, and most preferably 10 to 60 mol %. When the amount of the structural unit (a5) is at least as large as the lower limit of the above-mentioned range, the effect of using the structural unit (a5) can be satisfactorily achieved. On the other hand, when the amount of the structural unit (a5) is no more than the upper limit of the above-mentioned range, a good balance can be achieved with the other structural units, and various lithography properties such as DOF and CDU and pattern shape can be improved.

(Structural Unit (a13))

The structural unit (a13) is a structural unit containing an ether-containing cyclic group. Examples of the structural unit (a13) include a structural unit represented by any one of general formulae (a13-1) to (a13-3) shown below.

[Chemical Formula 27]

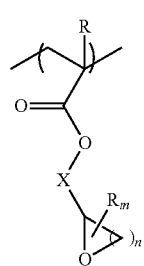

(a13-1)

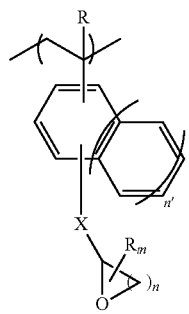

(a13-2)

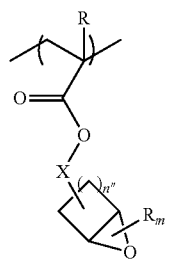

(a13-3)

In the formulae, R is the same as defined above; X represents a single bond or an alkylene group of 1 to 3 carbon atoms; n represents an integer of 1 to 5; $R_m$ represents hydrogen or an alkyl group of 1 to 5 carbon atoms; n' represents an integer of 0 to 2; and n" represents an integer of 0 to 2.

Specific examples of structural units represented by the aforementioned formula (a13-1) to (a13-3) are shown below.

[Chemical Formula 28]

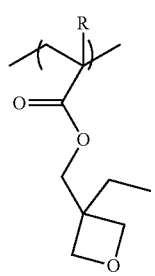

(a13-1-1)

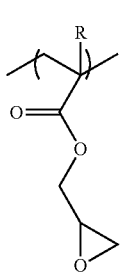

(a13-1-2)

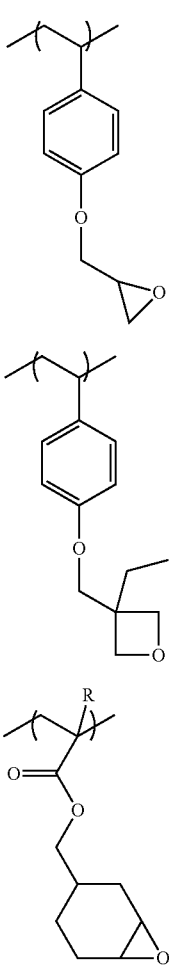

In the formulae, R is the same as defined above.

As the structural unit (a13) contained in the component (A1), 1 type of structural unit may be used, or 2 or more types may be used.

When the component (A1) contains the structural unit (a13), the amount of the structural unit (a13) based on the combined total of all structural units constituting the component (A1) is preferably 1 to 80 mol %, more preferably 5 to 70 mol %, still more preferably 10 to 65 mol %, and most preferably 10 to 60 mol %. When the amount of the structural unit (a13) is at least as large as the lower limit of the above-mentioned range, the effect of using the structural unit (a13) can be satisfactorily achieved. On the other hand, when the amount of the structural unit (a13) is no more than the upper limit of the above-mentioned range, a good balance can be achieved with the other structural units, and various lithography properties such as DOF and CDU and pattern shape can be improved.

The component (A1) is preferably a copolymer having any one of structural units (a1), (a2), (a3), (a4), (a5) and (a13), and more preferably a copolymer having a combination of the structural units (a1) and (a2), a combination of the structural units (a1), (a2) and (a5), or a combination of the structural units (a1), (a2), (a3) and (a13).

In the present invention, the weight average molecular weight (Mw) (the polystyrene equivalent value determined by gel permeation chromatography) of the component (A1) is not particularly limited, but is preferably 1,000 to 50,000, more preferably 1,500 to 30,000, and most preferably 2,000 to 20,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory.

As the component (A1), one type may be used alone, or two or more types may be used in combination.

In the component (A), the amount of the component (A1) based on the total weight of the component (A) is preferably 25% by weight or more, more preferably 50% by weight or more, still more preferably 75% by weight or more, and may be even 100% by weight. When the amount of the component (A1) is 25% by weight or more, various lithography properties are improved.

In the resist composition of the present invention, as the component (A), one type may be used, or two or more types of compounds may be used in combination.

In the resist composition of the present invention, the amount of the component (A) can be appropriately adjusted depending on the thickness of the resist film to be formed, and the like.

<Acid Generator Component; Component (B)>

The resist composition of the present invention may further include an acid generator component (B) (hereafter, referred to as "component (B)") which generates acid upon exposure. As the component (B), there is no particular limitation, and any of the known acid generators used in conventional chemically amplified resist compositions can be used.

Examples of these acid generators are numerous, and include onium salt acid generators such as iodonium salts and sulfonium salts; oxime sulfonate acid generators; diazomethane acid generators such as bisalkyl or bisaryl sulfonyl diazomethanes and poly(bis-sulfonyl)diazomethanes; nitrobenzylsulfonate acid generators; iminosulfonate acid generators; and disulfone acid generators. Among these, it is preferable to use an onium salt acid generator.

As the onium salt acid generator, a compound represented by general formula (b-1) below (hereafter, sometimes referred to as "component (b-1)"), a compound represented by general formula (b-2) below (hereafter, sometimes referred to as "component (b-2)") or a compound represented by general formula (b-3) below (hereafter, sometimes referred to as "component (b-3)") may be used.

[Chemical Formula 29]

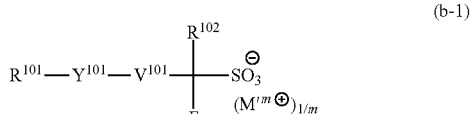

(b-1)

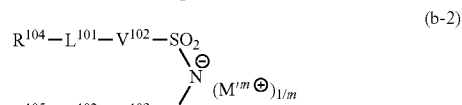

(b-2)

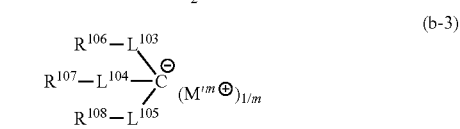

(b-3)

In the formulae, $R^{101}$ and $R^{104}$ to $R^{108}$ each independently represents a cyclic group which may have a substituent, a chain-like alkyl group which may have a substituent or a chain-like alkenyl group which may have a substituent, provided that $R^{104}$ and $R^{105}$ may be mutually bonded to form a ring; $R^{106}$ and $R^{107}$ may be mutually bonded to form a ring; $R^{102}$ represents a fluorine atom or a fluorinated alkyl group of 1 to 5 carbon atoms; $Y^{101}$ represents a single bond or a divalent linking group containing an oxygen atom; $V^{101}$ to $V^{103}$ each independently represents a single bond, an alkylene group or a fluorinated alkylene group; $L^{101}$ and $L^{102}$ each independently represents a single bond or an oxygen atom; $L^{103}$ to $L^{105}$ each independently represents a single bond, —CO— or —SO$_2$—; and $M'^{m+}$ represents an organic cation having a valency of m (provided that the cation of a compound represented by the aforementioned formula (b1-1) is excluded).

-{Anion Moiety} Anion Moiety of Component (b-1)

In the formula (b-1), $R^{101}$ represents a cyclic group which may have a substituent, a chain-like alkyl group which may have a substituent or a chain-like alkenyl group which may have a substituent.

(Cyclic Group which May have a Substituent)

The cyclic group is preferably a cyclic hydrocarbon group, and the cyclic hydrocarbon group may be either an aromatic hydrocarbon group or an aliphatic hydrocarbon group.

As the aromatic hydrocarbon group for $R^{101}$, groups in which one hydrogen atom has been removed from an aromatic hydrocarbon ring described above in relation to the divalent aromatic hydrocarbon group for $Va^1$ in the formula (a1-1) or an aromatic compound containing two or more aromatic ring can be mentioned, and a phenyl group or a naphthyl group is preferable.

As the cyclic aliphatic hydrocarbon group for $R^{101}$, groups in which one hydrogen atom has been removed from a monocycloalkane or a polycycloalkane exemplified above in the explanation of the divalent aliphatic hydrocarbon group for $Va^1$ in the formula (a1-1) can be mentioned, and an adamantyl group or a norbornyl group is preferable.

Further, the cyclic hydrocarbon group for $R^{101}$ may contain a hetero atom like as a heterocycle, and specific examples thereof include lactone-containing cyclic groups represented by the aforementioned general formulas (a2-r-1) to (a2-r-7), —SO$_2$— containing cyclic groups represented by the aforementioned formulas (a5-r-1) to (a5-r-4) and heterocycles shown below.

[Chemical Formula 30]

(r-hr-1)
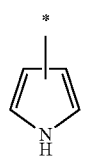

(r-hr-2)
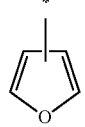

-continued (r-hr-3)
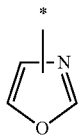

(r-hr-4)
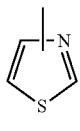

(r-hr-5)
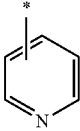

(r-hr-6)
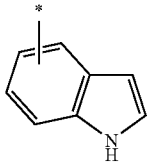

(r-hr-7)
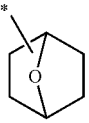

(r-hr-8)
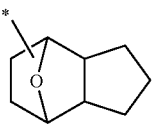

(r-hr-9)
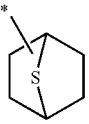

(r-hr-10)
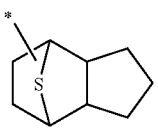

(r-hr-11)

(r-hr-12)
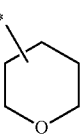

(r-hr-13)
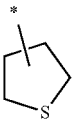

(r-hr-14)

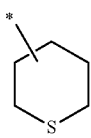

(r-hr-15)

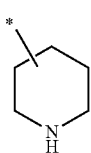

(r-hr-16)

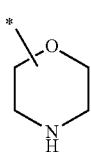

As the substituent for the cyclic hydrocarbon group for $R^{101}$, an alkyl group, an alkoxy group, a halogen atom, a halogenated alkyl group, a hydroxyl group, a carbonyl group, a nitro group or the like can be used.

The alkyl group as the substituent is preferably an alkyl group of 1 to 5 carbon atoms, and a methyl group, an ethyl group, a propyl group, an n-butyl group or a tert-butyl group is particularly desirable.

The alkoxy group as the substituent is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom for the substituent include a fluorine atom, a chlorine atom, a bromine atom and an iodine atom, and a fluorine atom is preferable.

Example of the aforementioned halogenated alkyl group includes a group in which a part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

(Chain-Like Alkyl Group which May have a Substituent)

The chain-like alkyl group for $R^{101}$ may be linear or branched.

The linear alkyl group preferably has 1 to 20 carbon atoms, more preferably 1 to 15, and most preferably 1 to 10. Specific examples include a methyl group, an ethyl group, a propyl group, a butyl group, a pentyl group, a hexyl group, a heptyl group, an octyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched alkyl group preferably has 3 to 20 carbon atoms, more preferably 3 to 15, and most preferably 3 to 10. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

(Chain-Like Alkenyl Group which May have a Substituent)

The chain-like alkenyl group for $R^{101}$ may be linear or branched, and preferably has 2 to 10 carbon atoms, more preferably 2 to 5 carbon atoms, still more preferably 2 to 4 carbon atoms, and most preferably 3 carbon atoms. Examples of linear alkenyl groups include a vinyl group, a propenyl group (an allyl group) and a butynyl group. Examples of branched alkenyl groups include a 1-methylpropenyl group and a 2-methylpropenyl group.

Among the above-mentioned examples, as the chain-like alkenyl group, a propenyl group is particularly desirable.

As the substituent for the chain-like alkyl group or alkenyl group for $R^{101}$, an alkoxy group, a halogen atom, a halogenated alkyl group, a hydroxyl group, a carbonyl group, a nitro group, an amino group, a cyclic group for $R^{101}$ or the like can be used.

Among these examples, as $R^{101}$, a cyclic group which may have a substituent is preferable, and a cyclic hydrocarbon group which may have a substituent is more preferable. Specifically, a phenyl group, a naphthyl group, a group in which one or more hydrogen atoms have been removed from a polycycloalkane, a lactone-containing cyclic group represented by any one of the aforementioned formula (a2-r-1) to (a2-r-7), and an —$SO_2$— containing cyclic group represented by any one of the aforementioned formula (a5-r-1) to (a5-r-4).

In formula (b-1), $Y^{101}$ represents a single bond or a divalent linking group containing an oxygen atom.

In the case where $Y^{101}$ is a divalent linking group containing an oxygen atom, $Y^{101}$ may contain an atom other than an oxygen atom. Examples of atoms other than an oxygen atom include a carbon atom, a hydrogen atom, a sulfur atom and a nitrogen atom.

Examples of divalent linking groups containing an oxygen atom include non-hydrocarbon, oxygen atom-containing linking groups such as an oxygen atom (an ether bond; —O—), an ester bond (—C(=O)—O—), an oxycarbonyl group (—O—C(=O)—), an amido bond (—C(=O)—NH—), a carbonyl group (—C(=O)—) and a carbonate bond (—O—C(=O)—O—); and combinations of the aforementioned non-hydrocarbon, hetero atom-containing linking groups with an alkylene group. Furthermore, the combinations may have a sulfonyl group (—$SO_2$—) bonded thereto. As the combination, the linking group represented by formulas (y-al-1) to (y-al-7) shown below can be mentioned.

[Chemical Formula 31]

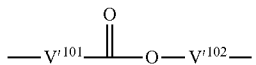

(y-al-1)

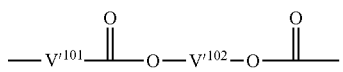

(y-al-2)

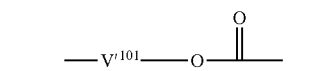

(y-al-3)

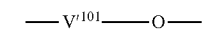

(y-al-4)

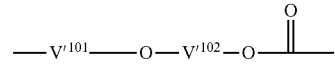

(y-al-5)

-continued (y-al-6)

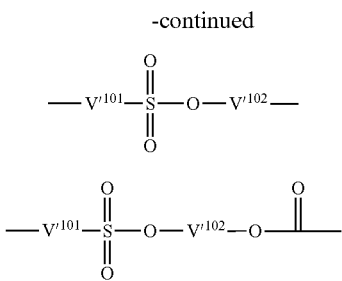

(y-al-7)

[Chemical Formula 32]

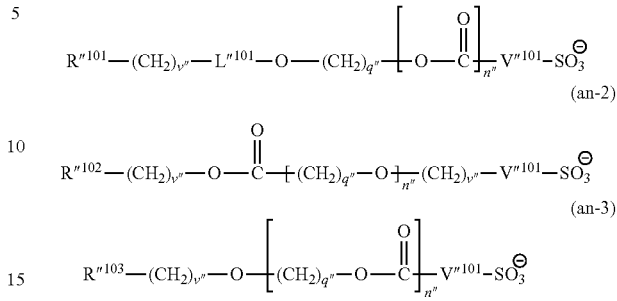

In the formulae, $V'^{101}$ represents a single bond or an alkylene group of 1 to 5 carbon atoms; $V'^{102}$ represents a divalent saturated hydrocarbon group of 1 to 30 carbon atoms.

The divalent saturated hydrocarbon group for $V'^{102}$ is preferably an alkylene group of 1 to 30 carbon atoms.

The alkylene group for $V'^{101}$ and $V'^{102}$ may be a linear alkylene group or a branched alkylene group, and a linear alkylene group is preferable.

Specific examples of the alkylene group for $V'^{101}$ and $V'^{102}$ include a methylene group [—$CH_2$—]; an alkylmethylene group, such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$— and —$C(CH_2CH_3)_2$—; an ethylene group [—$CH_2CH_2$—]; an alkylethylene group, such as —$CH(CH_3)CH_2$—, —$CH(CH_3)CH(CH_3)$—, —$C(CH_3)_2CH_2$— and —$CH(CH_2CH_3)CH_2$—; a trimethylene group (n-propylene group) [—$CH_2CH_2CH_2$—]; an alkyltrimethylene group, such as —$CH(CH_3)CH_2CH_2$— and —$CH_2CH(CH_3)CH_2$—; a tetramethylene group [—$CH_2CH_2CH_2CH_2$—]; an alkyltetramethylene group, such as —$CH(CH_3)CH_2CH_2CH_2$—, —$CH_2CH(CH_3)CH_2CH_2$—; and a pentamethylene group [—$CH_2CH_2CH_2CH_2CH_2$—].

Further, part of methylene group within the alkylene group for $V'^{101}$ and $V'^{102}$ may be substituted with a divalent aliphatic cyclic group of 5 to 10 carbon atoms. The aliphatic cyclic group is preferably a divalent group in which one hydrogen atom has been removed from the cyclic aliphatic hydrocarbon group for $Ra'^3$ in the aforementioned formula (a1-r-1), and a cyclohexylene group, 1,5-adamantylene group or 2,6-adamantylene group is preferable.

$Y^{101}$ is preferably a divalent linking group containing an ether bond or an ester bond, and groups represented by the aforementioned formulas (y-al-1) to (y-al-5) are preferable.

In formula (b-1), $V^{101}$ represents a single bond, an alkylene group or a fluorinated alkylene group. The alkylene group and the fluorinated alkylene group for $V^{101}$ preferably has 1 to 4 carbon atoms. Examples of the fluorinated alkylene group for $V^{101}$ include a group in which part or all of the hydrogen atoms within the alkylene group for $V^{101}$ have been substituted with fluorine. Among these examples, as $V^{101}$, a single bond or a fluorinated alkylene group of 1 to 4 carbon atoms is preferable.

In formula (b-1), $R^{102}$ represents a fluorine atom or a fluorinated alkyl group of 1 to 5 carbon atoms. $R^{102}$ is preferably a fluorine atom or a perfluoroalkyl group of 1 to 5 carbon atoms, and more preferably a fluorine atom.

As specific examples of anion moieties of the formula (b-1), in the case where $Y^{101}$ a single bond, a fluorinated alkylsulfonate anion such as a trifluoromethanesulfonate anion or a perfluorobutanesulfonate anion can be mentioned; and in the case where $Y^{101}$ represents a divalent linking group containing an oxygen atom, anions represented by formulae (an-1) to (an-3) shown below can be mentioned.

In the formulae, $R''^{101}$ represents an aliphatic cyclic group which may have a substituent, a group represented by any one of the aforementioned formulae (r-hr-1) to (r-hr-6) or a chain-like alkyl group which may have a substituent; $R''^{102}$ represents an aliphatic cyclic group which may have a substituent, a lactone-containing cyclic group represented by any one of the aforementioned formulae (a2-r-1) to (a2-r-7) or an —$SO_2$— containing cyclic group represented by any one of the aforementioned formulae (a5-r-1) to (a5-r-4); $R''^{103}$ represents an aromatic cyclic group which may have a substituent, an aliphatic cyclic group which may have a substituent or a chain-like alkenyl group which may have a substituent; $V'''^{101}$ represents a fluorinated alkylene group; $L''^{101}$ represents —C(=O)— or —$SO_2$—; $v''$ represents an integer of 0 to 3; $q''$ represents an integer of 1 to 20; and $n''$ represents 0 or 1.

As the aliphatic cyclic group for $R''^{101}$, $R''^{102}$ and $R''^{103}$ which may have a substituent, the same groups as the cyclic aliphatic hydrocarbon group for $R^{101}$ described above are preferable. As the substituent, the same groups as those described above for substituting the cyclic aliphatic hydrocarbon group for $R^{101}$ can be mentioned.

As the aromatic cyclic group for $R''^{103}$ which may have a substituent, the same groups as the aromatic hydrocarbon group for the cyclic hydrocarbon group represented by $R^{101}$ described above are preferable. The substituent is the same as defined for the substituent for the aromatic hydrocarbon group represented by $R^{101}$.

As the chain-like alkyl group for $R''^{101}$ which may have a substituent, the same groups as those described above for $R^{101}$ are preferable. As the chain-like alkenyl group for $R''^{103}$ which may have a substituent, the same groups as those described above for $R^{101}$ are preferable. $V'''^{101}$ is preferably a fluorinated alkylene group of 1 to 3 carbon atoms, and most preferably —$CF_2$—, —$CF_2CF_2$—, —$CHFCF_2$—, —$CF(CF_3)CF_2$— or —$CH(CF_3)CF_2$—.

-Anion Moiety of Component (b-2)

In formula (b-2), $R^{104}$ and $R^{105}$ each independently represents a cyclic group which may have a substituent, a chain-like alkyl group which may have a substituent or a chain-like alkenyl group which may have a substituent, and is the same as defined for $R^{101}$ in formula (b-1). $R^{104}$ and $R^{105}$ may be mutually bonded to form a ring.

As $R^{104}$ and $R^{105}$, a chain-like alkyl group which may have a substituent is preferable, and a linear or branched alkyl group or a linear or branched fluorinated alkyl group is more preferable.

The chain-like alkyl group preferably has 1 to 10 carbon atoms, more preferably 1 to 7 carbon atoms, and still more preferably 1 to 3 carbon atoms. The smaller the number of carbon atoms of the chain-like alkyl group for $R^{104}$ and $R^{105}$, the more the solubility in a resist solvent is improved. Further, in the chain-like alkyl group for $R^{104}$ and $R^{105}$, it is preferable that the number of hydrogen atoms substituted with fluorine atoms is as large as possible because the acid strength increases and the transparency to high energy radiation of 200 nm or less or electron beam is improved. The fluorination ratio of the chain-like alkyl group is preferably from 70 to 100%, more preferably from 90 to 100%, and it is particularly desirable that the chain-like alkyl group be a perfluoroalkyl group in which all hydrogen atoms are substituted with fluorine atoms.

In formula (b-2), $V^{102}$ and $V^{103}$ each independently represents a single bond, an alkylene group or a fluorinated alkylene group, and is the same as defined for $V^{101}$ in formula (b-1).

In formula (b-2), $L^{101}$ and $L^{102}$ each independently represents a single bond or an oxygen atom.

-Anion Moiety of Component (b-3)

In formula (b-3), $R^{106}$ to $R^{108}$ each independently represents a cyclic group which may have a substituent, a chain-like alkyl group which may have a substituent or a chain-like alkenyl group which may have a substituent, and is the same as defined for $R^{101}$ in formula (b-1).

$L^{103}$ to $L^{105}$ each independently represents a single bond, —CO— or —SO$_2$—.

{Cation Moiety}

In formulae (b-1), (b-2) and (b-3), $M'^{m+}$ represents an organic cation having a valency of m other than the cation moiety of the compound represented by the aforementioned formula (b1-1), preferably a sulfonium cation or an iodonium cation, and most preferably a cation represented by any one of formulae (ca-1) to (ca-4) shown below.

[Chemical Formula 33]

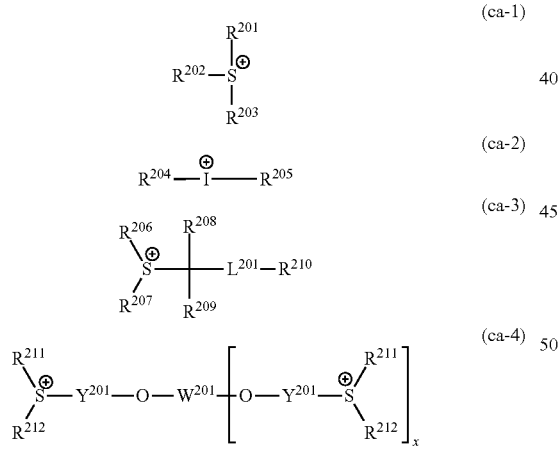

In the formulae, $R^{201}$ to $R^{207}$, $R^{211}$ and $R^{212}$ independently represents an aryl group, an alkyl group or an alkenyl group, provided that two of $R^{201}$ to $R^{203}$, $R^{206}$ and $R^{207}$, or $R^{211}$ and $R^{212}$ may be mutually bonded to form a ring with the sulfur atom; $R^{208}$ and $R^{209}$ each independently represents a hydrogen atom or an alkyl group of 1 to 5 carbon atoms; $R^{210}$ represents an aryl group which may have a substituent, an alkyl group which may have a substituent, an alkenyl group which may have a substituent or an —SO$_2$— containing cyclic group which may have a substituent; $L^{201}$ represents —C(=O)— or —C(=O)—O—; $Y^{201}$ each independently represents an arylene group, an alkylene group or an alkenylene group; x represents 1 or 2; and $W^{201}$ represents a linking group having a valency of (x+1).

As the aryl group for $R^{201}$ to $R^{207}$, $R^{211}$ and $R^{212}$, an unsubstituted aryl group of 6 to 20 carbon atoms can be mentioned, and a phenyl group or a naphthyl group is preferable.

The alkyl group for $R^{201}$ to $R^{207}$, $R^{211}$ and $R^{212}$ is preferably a chain-like or cyclic alkyl group having 1 to 30 carbon atoms.

The alkenyl group for $R^{201}$ to $R^{201}$, $R^{211}$ and $R^{212}$ preferably has 2 to 10 carbon atoms.

Specific examples of the substituent which $R^{201}$ to $R^{207}$ and $R^{210}$ to $R^{212}$ may have include an alkyl group, a halogen atom, a halogenated alkyl group, a carbonyl group, a cyano group, an amino group, an aryl group, an arylthio group and groups represented by formulae (ca-r-1) to (ca-r-7) shown below.

The aryl group within the arylthio group as the substituent is the same as defined for $R^{101}$, and specific examples include a phenylthio group and a biphenylthio group.

[Chemical Formula 34]

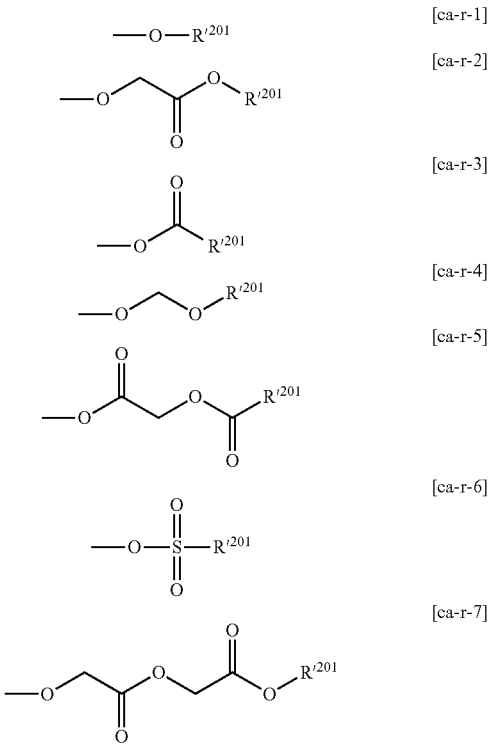

In the formulae, $R'^{201}$ each independently represents a hydrogen atom, a cyclic group which may have a substituent, a chain-like alkyl group which may have a substituent or a chain-like alkenyl group which may have a substituent.

As the cyclic group which may have a substituent, the chain-like alkyl group which may have a substituent and the chain-like alkenyl group which may have a substituent for $R'^{201}$, the same groups as those described above for $R^{101}$ can be mentioned. As the cyclic group which may have a substituent and chain-like alkyl group which may have a substituent, the same groups as those described above for the acid dissociable group represented by the aforementioned formula (a1-r-2) can be also mentioned.

When $R^{201}$ to $R^{203}$, $R^{206}$, $R^{207}$, $R^{211}$ and $R^{212}$ are mutually bonded to form a ring with the sulfur atom, these groups may be mutually bonded via a hetero atom such as a sulfur atom, an oxygen atom or a nitrogen atom, or a functional group such as a carbonyl group, —SO—, —SO$_2$—, —SO$_3$—, —COO—, —CONH— or —N(R$_N$)— (wherein R$_N$ represents an alkyl group of 1 to 5 carbon atoms). The ring containing the sulfur atom in the skeleton thereof is preferably a 3 to 10-membered ring, and most preferably a 5 to 7-membered ring. Specific examples of the ring formed include a thiophene ring, a thiazole ring, a benzothiophene ring, a thianthrene ring, a benzothiophene ring, a dibenzothiophene ring, a 9H-thioxanthene ring, a thioxanthone ring, a phenoxathiin ring, a tetrahydrothiophenium ring, and a tetrahydrothiopyranium ring.

R$^{208}$ and R$^{209}$ each independently represents a hydrogen atom or an alkyl group of 1 to 5 carbon atoms, preferably a hydrogen atom or an alkyl group of 1 to 3 carbon atoms, and when R$^{208}$ and R$^{209}$ each represents an alkyl group, R$^{208}$ and R$^{209}$ may be mutually bonded to form a ring.

R$^{210}$ represents an aryl group which may have a substituent, an alkyl group which may have a substituent, an alkenyl group which may have a substituent, or an —SO$_2$— containing cyclic group which may have a substituent.

Examples of the aryl group for R$^{210}$ include an unsubstituted aryl group of 6 to 20 carbon atoms, and a phenyl group or a naphthyl group is preferable.

As the alkyl group for R$^{210}$, a chain-like or cyclic alkyl group having 1 to 30 carbon atoms is preferable.

The alkenyl group for R$^{210}$ preferably has 2 to 10 carbon atoms.

As the —SO$_2$— containing cyclic group for R$^{210}$ which may have a substituent, the same "—SO$_2$— containing cyclic groups" as those described above for Ra$^{21}$ in the aforementioned general formula (a2-1) can be mentioned, and the group represented by the aforementioned general formula (a5-r-1) is preferable.

Each Y$^{201}$ independently represents an arylene group, an alkylene group or an alkenylene group.

Examples of the arylene group for Y$^{201}$ include groups in which one hydrogen atom has been removed from an aryl group given as an example of the aromatic hydrocarbon group for R$^{101}$ in the aforementioned formula (b-1).

The alkylene group and the alkenylene group for Y$^{201}$ is the same as defined for the aliphatic hydrocarbon group as the divalent linking group represented by Va$^1$ in the aforementioned general formula (a1-1).

In the formula (ca-4), x represents 1 or 2.

W$^{201}$ represents a linking group having a valency of (x+1), i.e., a divalent or trivalent linking group.

As the divalent linking group for W$^{201}$, a divalent hydrocarbon group which may have a substituent is preferable, and as examples thereof, the same hydrocarbon groups as those described above for Ya$^{21}$ in the general formula (a2-1) can be mentioned. The divalent linking group for W$^{201}$ may be linear, branched or cyclic, and cyclic is more preferable. Among these, an arylene group having two carbonyl groups, each bonded to the terminal thereof is preferable. Examples of the arylene group include a phenylene group and a naphthylene group, and a phenylene group is particularly desirable.

As the trivalent linking group for W$^{201}$, a group in which one hydrogen atom has been removed from the aforementioned divalent linking group for W$^{201}$ and a group in which the divalent linking group has been bonded to another divalent linking group can be mentioned. The trivalent linking group for W$^{201}$ is preferably a group in which 2 carbonyl groups are bonded to an arylene group.

Specific examples of preferable cations represented by formula (ca-1) include cations represented by formulae (ca-1-1) to (ca-1-63) shown below.

[Chemical Formula 35]

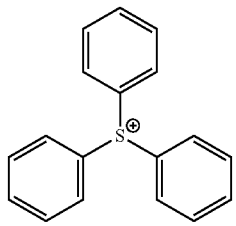

(ca-1-1)

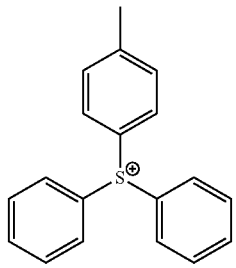

(ca-1-2)

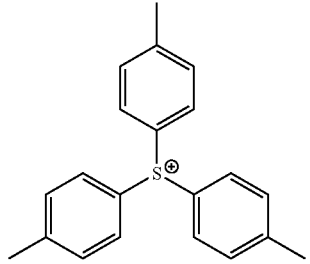

(ca-1-3)

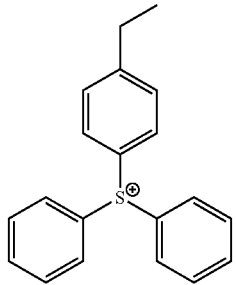

(ca-1-4)

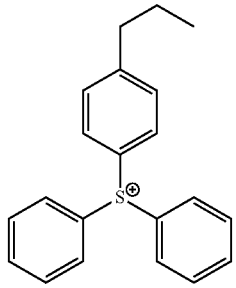

(ca-1-5)

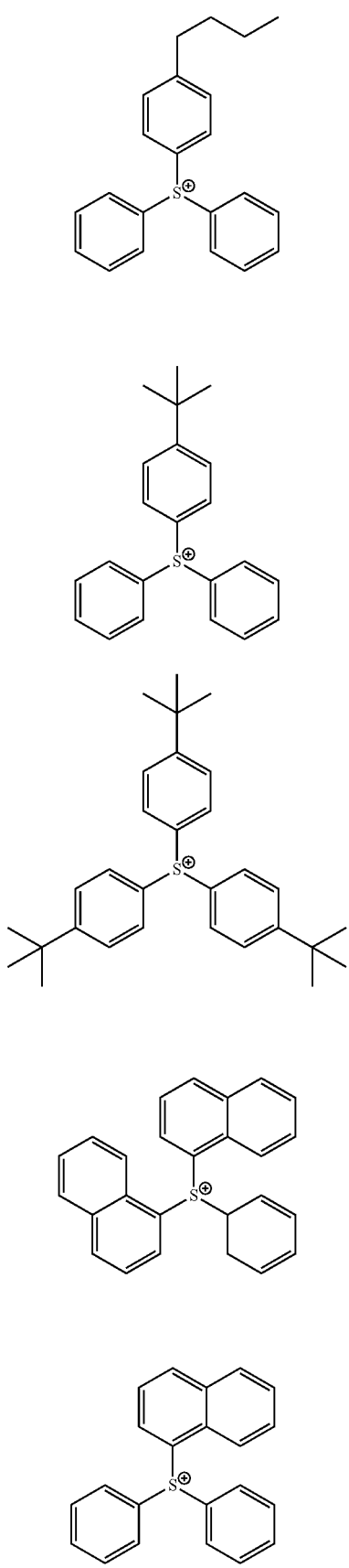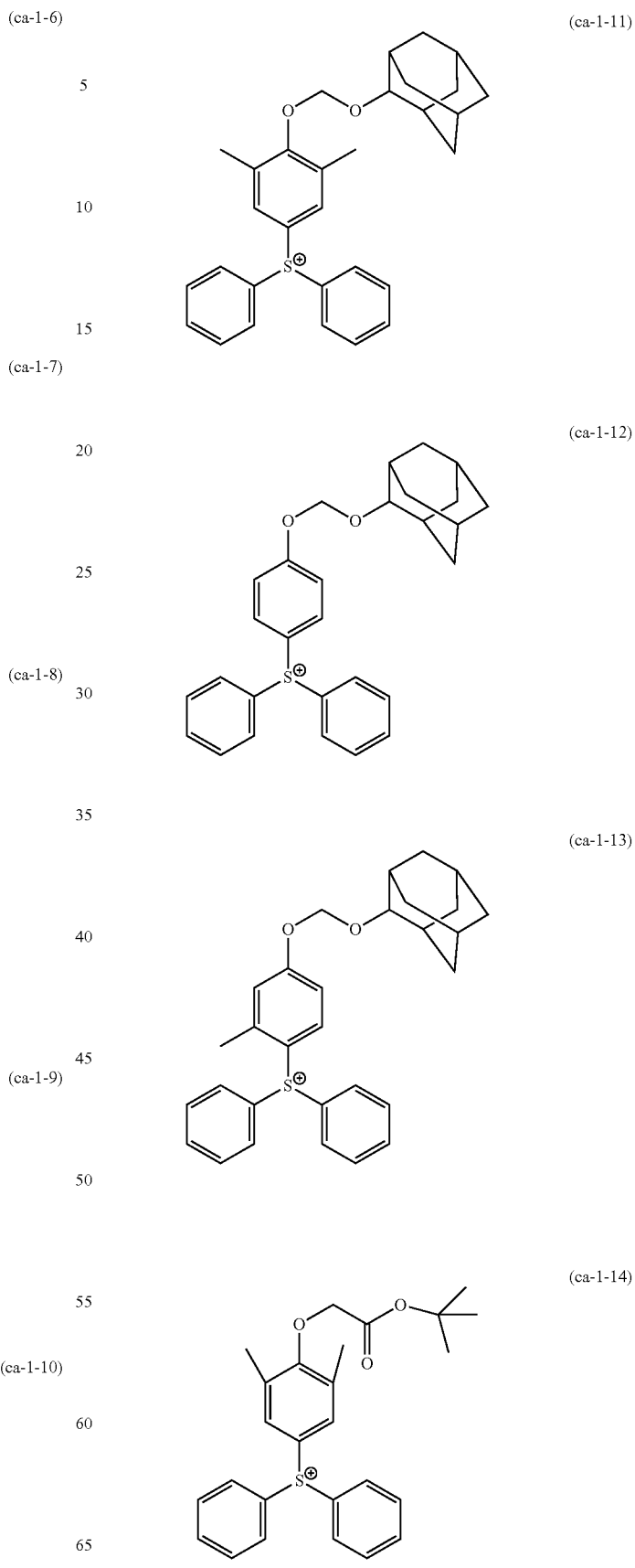

(ca-1-15)
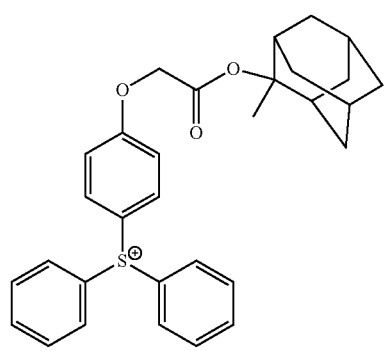
(ca-1-16)
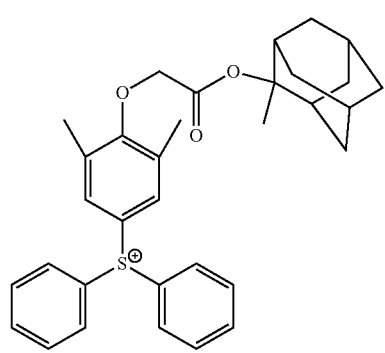
[Chemical Formula 36]
(ca-1-17)
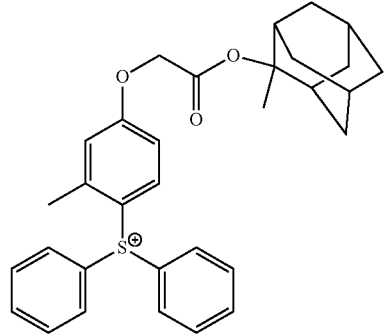
(ca-1-18)
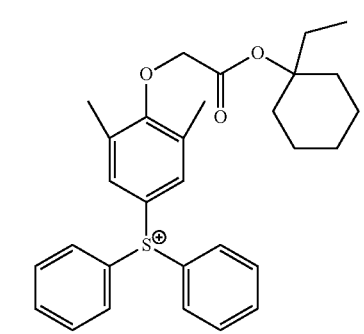
(ca-1-19)
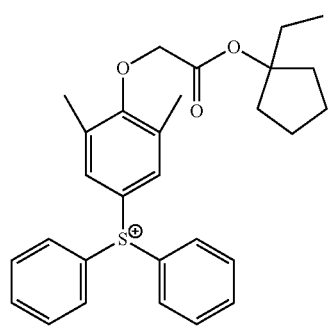
(ca-1-20)
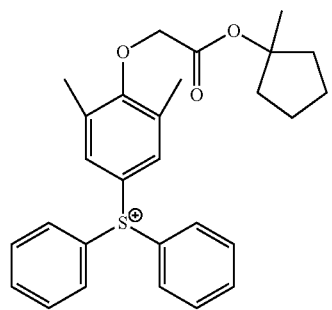
(ca-1-21)
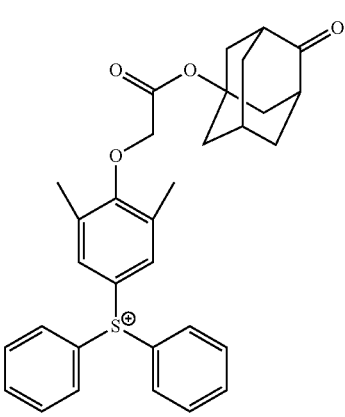
(ca-1-22)
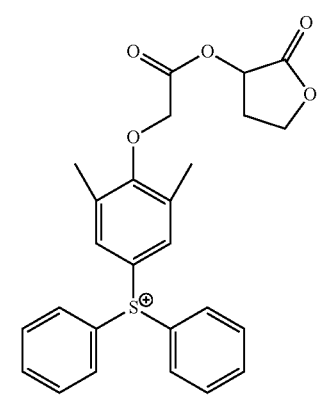

(ca-1-23)
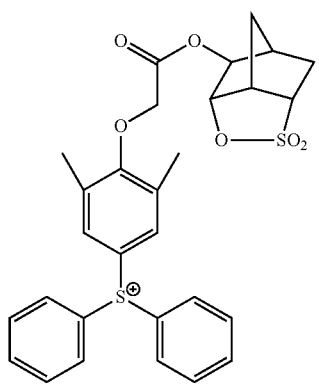
(ca-1-24)
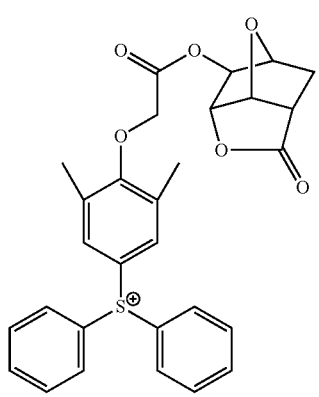
(ca-1-25)
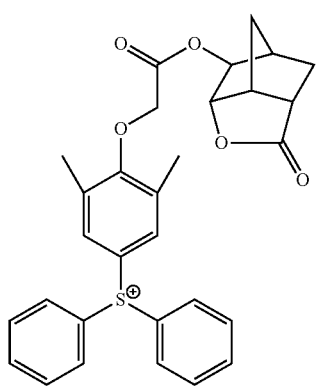
(ca-1-26)
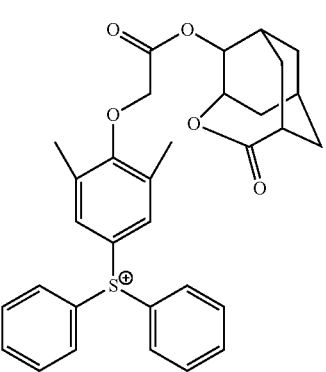
(ca-1-27)
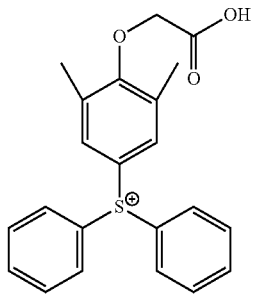
(ca-1-28)
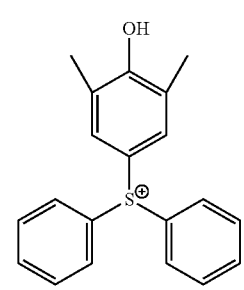
(ca-1-29)
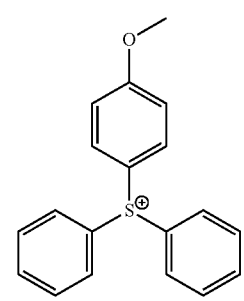
(ca-1-30)
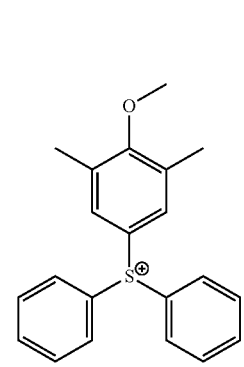
(ca-1-31)
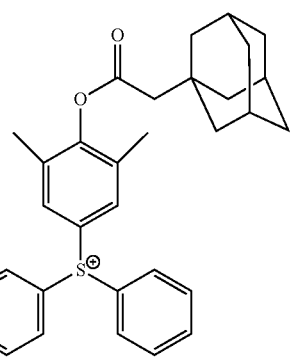

(ca-1-32) 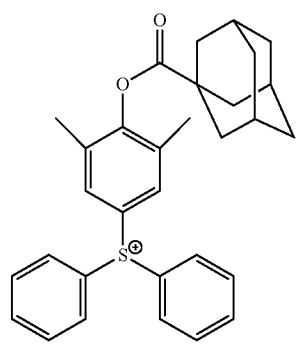
(ca-1-33) 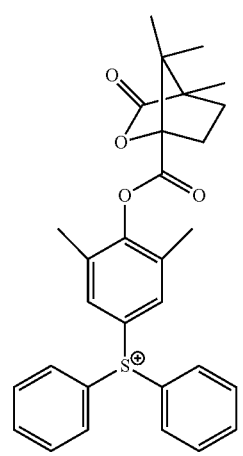
[Chemical Formula 37]
(ca-1-34) 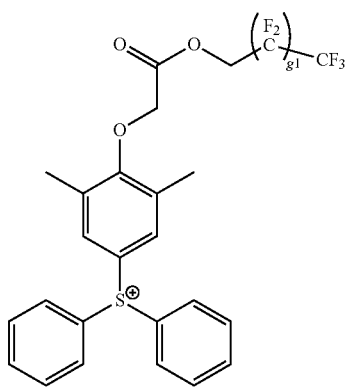
(ca-1-35) 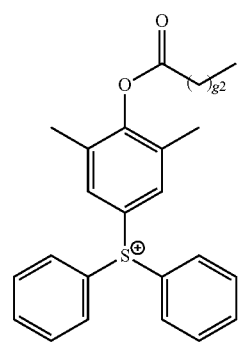
(ca-1-36) 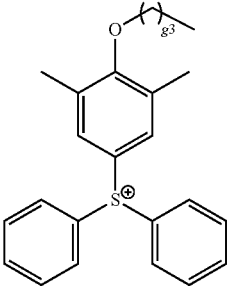
(ca-1-37) 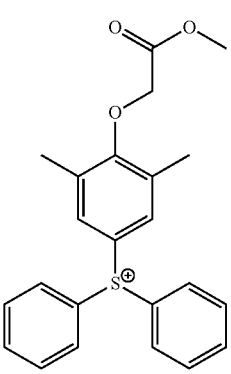
(ca-1-38) 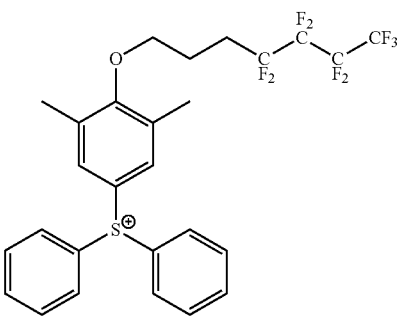
(ca-1-39) 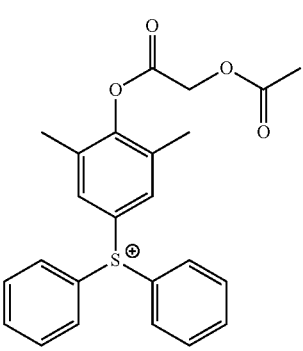

(ca-1-40)
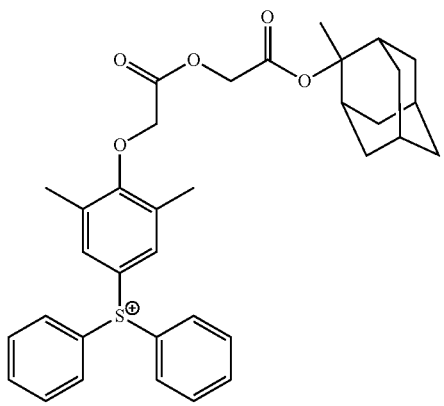
(ca-1-41)
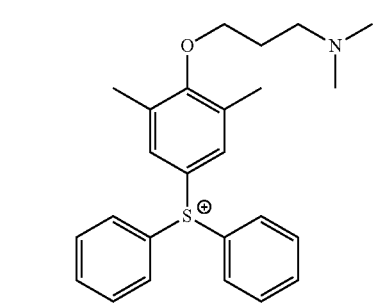
(ca-1-42)
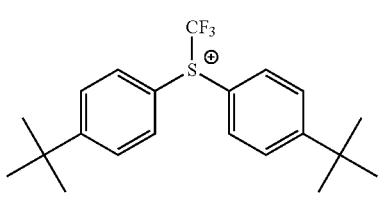
(ca-1-43)
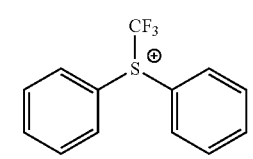
(ca-1-44)
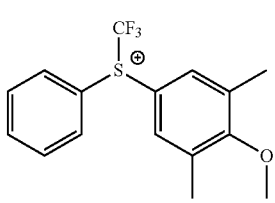
(ca-1-45)
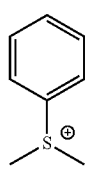
(ca-1-46)
(ca-1-47)
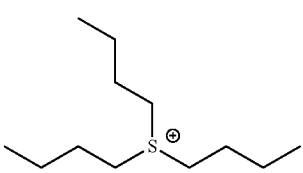
(ca-1-48)
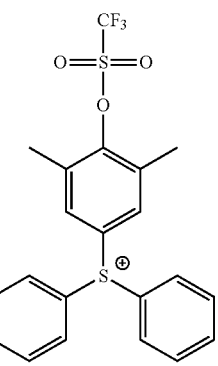
In the formulae, g1, g2 and g3 represent recurring numbers, wherein g1 is an integer of 1 to 5, g2 is an integer of 0 to 20, and g3 is an integer of 0 to 20.
[Chemical Formula 38]
(ca-1-49)
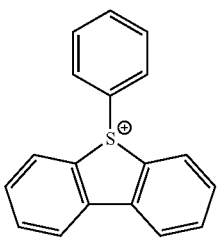
(ca-1-50)
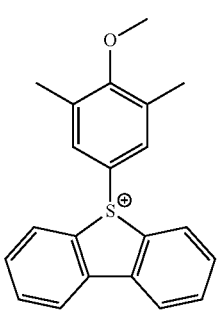
(ca-1-51)
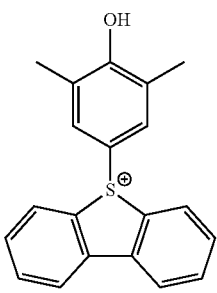

(ca-1-52) 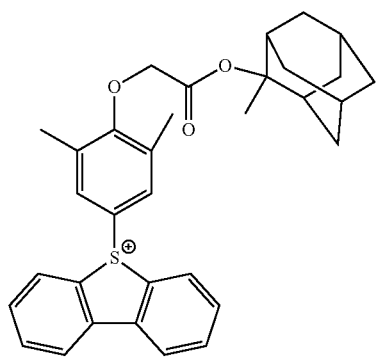
(ca-1-53) 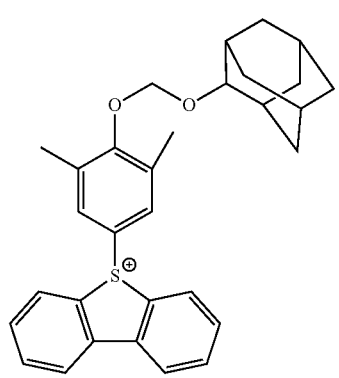
(ca-1-54) 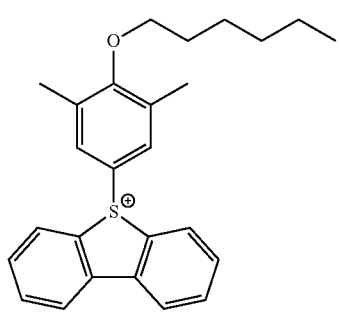
(ca-1-55) 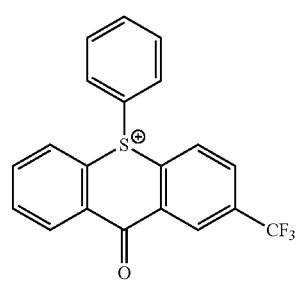
(ca-1-56) 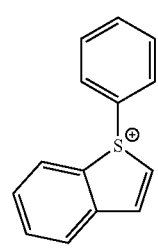
(ca-1-57) 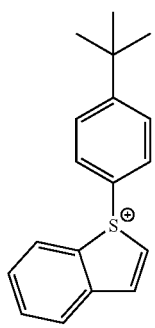
(ca-1-58) 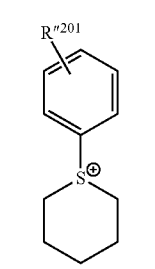
(ca-1-59) 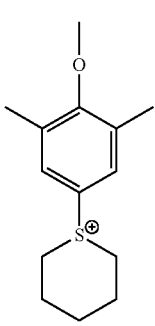
(ca-1-60) 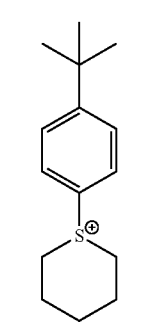
(ca-1-61) 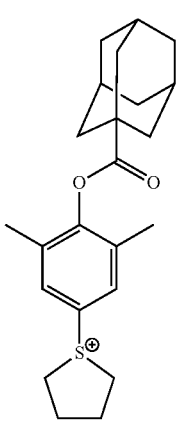

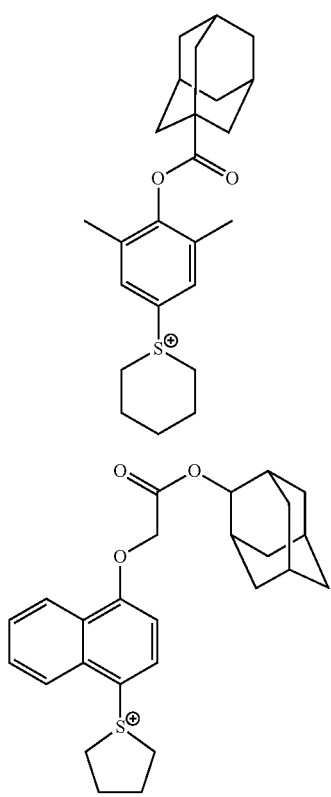

(ca-1-62)

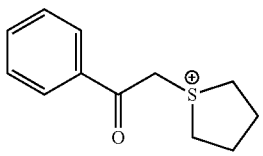

(ca-1-63)

In the formulae, $R''^{201}$ represents a hydrogen atom or a substituent, and as the substituent, the same groups as those described above for substituting $R^{201}$ to $R^{207}$ and $R^{210}$ to $R^{212}$ can be mentioned.

Specific examples of preferable cations represented by formula (ca-3) include cations represented by formulae (ca-3-1) to (ca-3-6) shown below.

[Chemical Formula 39]

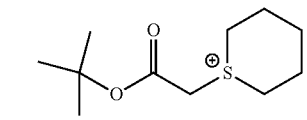

(ca-3-1)

[Chemical Formula 40]

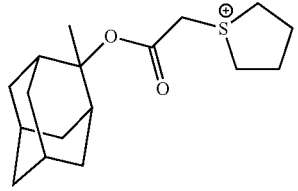

(ca-3-2)

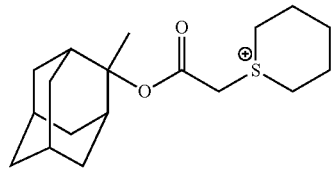

(ca-3-3)

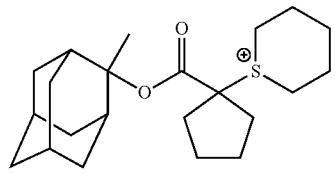

(ca-3-4)

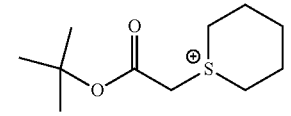

(ca-3-5)

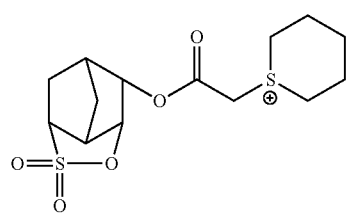

(ca-3-6)

Specific examples of preferable cations represented by formula (ca-4) include cations represented by formulae (ca-4-1) and (ca-4-2) shown below.

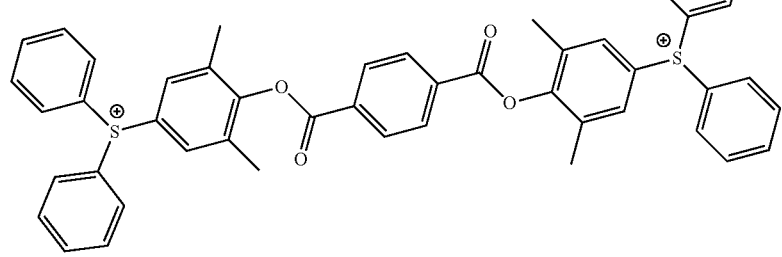

(ca-4-1)

(ca-4-2)

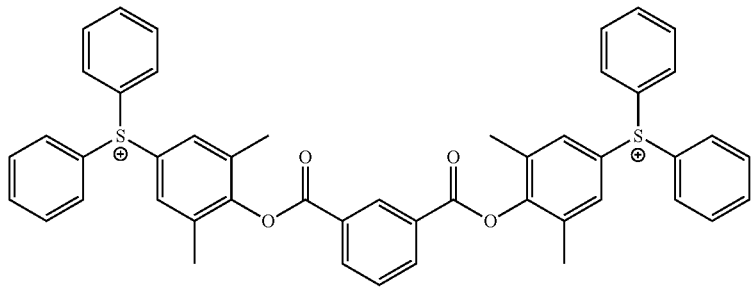

As the component (B), one type of these acid generators may be used alone, or two or more types may be used in combination.

When the resist composition of the present invention contains the component (B), the amount of the component (B) relative to 100 parts by weight of the component (A) is preferably within a range from 0.5 to 60 parts by weight, more preferably from 1 to 50 parts by weight, and still more preferably from 1 to 40 parts by weight. When the amount of the component (B) is within the above-mentioned range, formation of a resist pattern can be satisfactorily performed. Further, by virtue of the above-mentioned range, when each of the components are dissolved in an organic solvent, a uniform solution can be obtained and the storage stability becomes satisfactory.

<Basic Compound Component; Component (D)>

Moreover, the resist composition of the present invention may include an acid diffusion control agent component (hereafter, frequently referred to as "component (D)"), in addition to the component (A), or in addition to the component (A) and the component (B).

The component (D) functions as an acid diffusion control agent, i.e., a quencher which traps the acid generated from the component (B) and the like upon exposure.

In the present invention, the component (D) may be a photodecomposable base (D1) (hereafter, referred to as "component (D1)") which is decomposed upon exposure and then loses the ability of controlling of acid diffusion, or a nitrogen-containing organic compound (D2) (hereafter, referred to as "component (D2)") which does not fall under the definition of component (D1).

[Component (D1)]

When a resist pattern is formed using a resist composition containing the component (D1), the contrast between exposed portions and unexposed portions is improved.

The component (D1) is not particularly limited, as long as it is decomposed upon exposure and then loses the ability of controlling of acid diffusion. As the component (D1), at least one compound selected from the group consisting of a compound represented by general formula (d1-1) shown below (hereafter, referred to as "component (d1-1)"), a compound represented by general formula (d1-2) shown below (hereafter, referred to as "component (d1-2)") and a compound represented by general formula (d1-3) shown below (hereafter, referred to as "component (d1-3)") is preferably used.

At exposed portions, the components (d1-1) to (d1-3) are decomposed and then lose the ability of controlling of acid diffusion (i.e., basicity), and therefore the components (d1-1) to (d1-3) cannot function as a quencher, whereas at unexposed portions, the components (d1-1) to (d1-3) functions as a quencher.

[Chemical Formula 41]

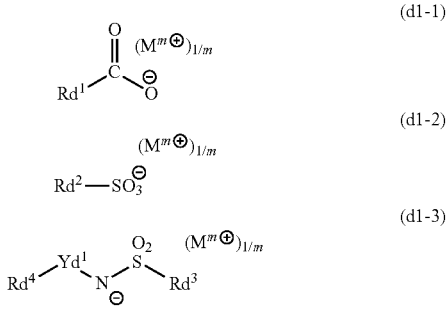

In the formulae, $Rd^1$ to $Rd^4$ represent a cyclic group which may have a substituent, a chain-like alkyl group which may have a substituent or a chain-like alkenyl group which may have a substituent, provided that, the carbon atom adjacent to the sulfur atom within the $Rd^2$ in the formula (d1-2) has no fluorine atom bonded thereto; $Yd^1$ represents a single bond or a divalent linking group; and $M^{m+}$ each independently represents a cation having a valency of m.

{Component (d1-1)}-Anion Moiety

In formula (d1-1), $Rd^1$ represents a cyclic group which may have a substituent, a chain-like alkyl group which may have a substituent or a chain-like alkenyl group which may have a substituent, and is the same groups as those defined above for $R^{101}$.

Among these, as the group for $Rd^1$, an aromatic hydrocarbon group which may have a substituent, an aliphatic cyclic group which may have a substituent and a chain-like hydrocarbon group which may have a substituent are preferable. As the substituents which these groups may have, a fluorine atom or a fluorinated alkyl group is preferable.

The aromatic hydrocarbon group is preferably a phenyl group or a naphthyl group.

Examples of the aliphatic cyclic group include groups in which one or more hydrogen atoms have been removed from a polycycloalkane such as adamantane, norbornane, isobornane, tricyclodecane or tetracyclododecane.

As the chain-like hydrocarbon group, a chain-like alkyl group is preferable. The chain-like alkyl group preferably has 1 to 10 carbon atoms, and specific examples thereof include a linear alkyl group such as a methyl group, an ethyl group, a propyl group, a butyl group, a pentyl group, a hexyl group, a heptyl group, an octyl group, a nonyl or a decyl group, and a branched alkyl group such as a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group or a 4-methylpentyl group.

In the case where the chain-like alkyl group is a fluorinated alkyl group having a fluorine atom or a fluorinated alkyl group, the fluorinated alkyl group preferably has 1 to 11 carbon atoms, more preferably 1 to 8 carbon atoms, and still more preferably 1 to 4 carbon atoms. The fluorinated alkyl group may contain an atom other than fluorine. Examples of the atom other than fluorine include an oxygen atom, a carbon atom, a hydrogen atom, a sulfur atom and a nitrogen atom.

As $Rd^1$, a fluorinated alkyl group in which part or all of the hydrogen atoms constituting a linear alkyl group have been substituted with fluorine atom(s) is preferable, and a fluorinated alkyl group in which all of the hydrogen atoms constituting a linear alkyl group have been substituted with fluorine atoms (i.e., a linear perfluoroalkyl group) is more preferable.

Specific examples of preferable anion moieties for the component (d1-1) are shown below.

[Chemical Formula 42]

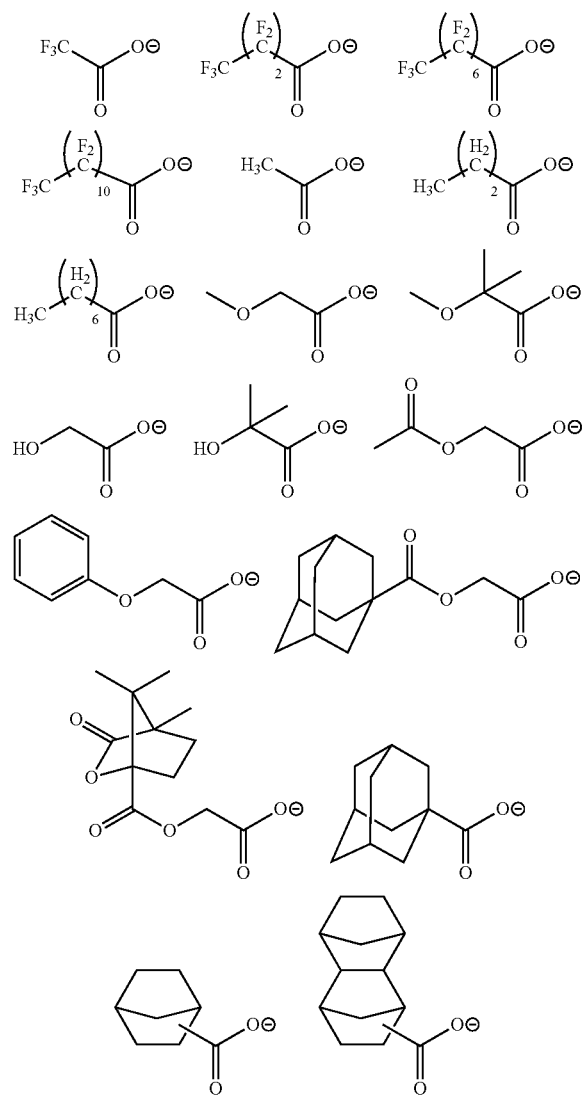

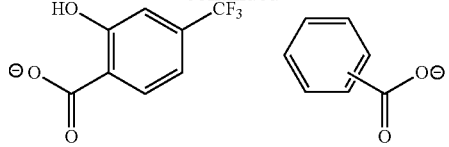

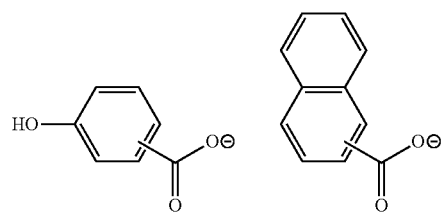

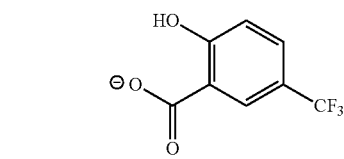

-Cation Moiety

In formula (d1-1), $M^{m+}$ represents an organic cation having a valency of m.

The organic cation for $M^{m+}$ is not particularly limited, and examples thereof include the same cation moieties as those represented by the aforementioned formulas (ca-1) to (ca-4), and cation moieties represented by the aforementioned formulas (ca-1-1) to (ca-1-63) are preferable.

As the component (d1-1), one type of compound may be used, or two or more types of compounds may be used in combination.

{Component (d1-2)}-Anion Moiety

In formula (d1-2), $Rd^2$ represents a cyclic group which may have a substituent, a chain-like alkyl group which may have a substituent or a chain-like alkenyl group which may have a substituent, and is the same groups as those defined above for $R^{101}$, provided that, the carbon atom adjacent to the sulfur atom within $Rd^2$ group has no fluorine atom bonded thereto (i.e., the carbon atom adjacent to the sulfur atom within $Rd^2$ group does not substituted with a fluorine atom). As a result, the anion of the component (d1-2) becomes an appropriately weak acid anion, thereby improving the quenching ability of the component (D).

As $Rd^2$, an aliphatic cyclic group which may have a substituent is preferable, and a group in which one or more hydrogen atoms have been removed from adamantane, norbornane, isobornane, tricyclodecane, tetracyclododecane or camphor (which may have a substituent) is more preferable.

The hydrocarbon group for $Rd^2$ may have a substituent. As the substituent, the same groups as those described above for substituting the hydrocarbon group (e.g., aromatic hydrocarbon group, aliphatic hydrocarbon group) for $Rd^1$ in the formula (d1-1) can be mentioned.

Specific examples of preferable anion moieties for the component (d1-2) are shown below.

[Chemical Formula 43]

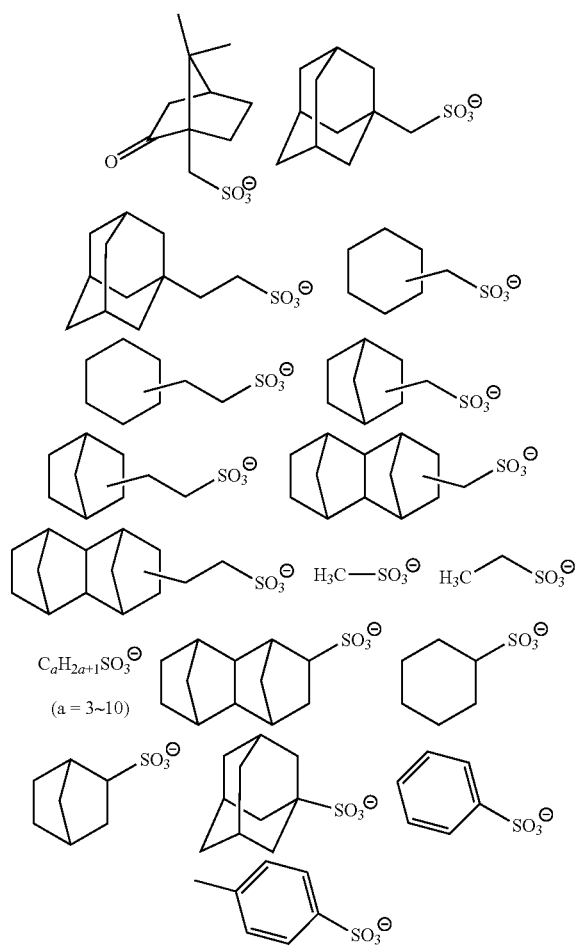

-Cation Moiety

In formula (d1-2), $M^{m+}$ is an organic cation having a valency of m, and is the same as defined for $M^{m+}$ in the aforementioned formula (d1-1).

As the component (d1-2), one type of compound may be used, or two or more types of compounds may be used in combination.

{Component (d1-3)}-Anion Moiety

In formula (d1-3), $Rd^3$ represents a cyclic group which may have a substituent, a chain-like alkyl group which may have a substituent or a chain-like alkenyl group which may have a substituent, and is the same groups as those defined above for $R^{101}$, and a cyclic group containing a fluorine atom, a chain-like alkyl group or a chain-like alkenyl group is preferable. Among these, a fluorinated alkyl group is preferable, and more preferably the same fluorinated alkyl groups as those described above for $Rd^1$.

In formula (d1-3), $Rd^4$ represents a cyclic group which may have a substituent, a chain-like alkyl group which may have a substituent or a chain-like alkenyl group which may have a substituent, and is the same groups as those defined above for $R^{101}$.

Among these, an alkyl group which may have substituent, an alkoxy group which may have substituent, an alkenyl group which may have substituent or a cyclic group which may have substituent is preferable.

The alkyl group for $Rd^4$ is preferably a linear or branched alkyl group of 1 to 5 carbon atoms, and specific examples include a methyl group, an ethyl group, a propyl group, an isopropyl group, an n-butyl group, an isobutyl group, a tert-butyl group, a pentyl group, an isopentyl group, and a neopentyl group. Part of the hydrogen atoms within the alkyl group for $Rd^4$ may be substituted with a hydroxy group, a cyano group or the like.

The alkoxy group for $Rd^4$ is preferably an alkoxy group of 1 to 5 carbon atoms, and specific examples thereof include a methoxy group, an ethoxy group, an n-propoxy group, an iso-propoxy group, an n-butoxy group and a tert-butoxy group. Among these, a methoxy group and an ethoxy group are preferable.

As the alkenyl group for $Rd^4$, the same groups as those described above for $R^{101}$ can be mentioned, and a vinyl group, a propenyl group (an allyl group), a 1-methylpropenyl group and a 2-methylpropenyl group are preferable. These groups may have an alkyl group of 1 to 5 carbon atoms or a halogenated alkyl group of 1 to 5 carbon atoms as a substituent.

As the cyclic group for $Rd^4$, the same groups as those described above for $R^{101}$ can be mentioned. Among these, as the cyclic group, an alicyclic group (e.g., a group in which one or more hydrogen atoms have been removed from a cycloalkane such as cyclopentane, cyclohexane, adamantane, norbornane, isobornane, tricyclodecane or tetracyclododecane) or an aromatic group (e.g., a phenyl group or a naphthyl group) is preferable. When $Rd^4$ is an alicyclic group, the resist composition can be satisfactorily dissolved in an organic solvent, thereby improving the lithography properties. Alternatively, when $Rd^4$ is an aromatic group, the resist composition exhibits an excellent photoabsorption efficiency in a lithography process using EUV or the like as the exposure source, thereby resulting in the improvement of the sensitivity and the lithography properties.

In formula (d1-3), $Yd^1$ represents a single bond or a divalent linking group.

The divalent linking group for $Yd^1$ is not particularly limited, and examples thereof include a divalent hydrocarbon group (aliphatic hydrocarbon group, or aromatic hydrocarbon group) which may have a substituent and a divalent linking group containing a hetero atom. As such groups, the same divalent linking groups as those described above for $Ya^{21}$ in the formula (a2-1) can be mentioned.

As $Yd^1$, a carbonyl group, an ester bond, an amide bond, an alkylene group or a combination of these is preferable. As the alkylene group, a linear or branched alkylene group is more preferable, and a methylene group or an ethylene group is still more preferable.

Specific examples of preferable anion moieties for the component (d1-3) are shown below.

[Chemical Formula 44]

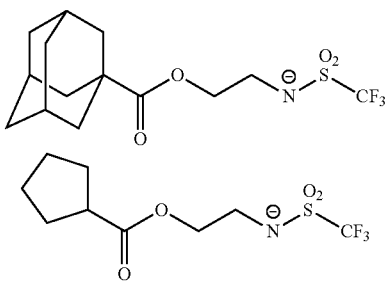

95
-continued
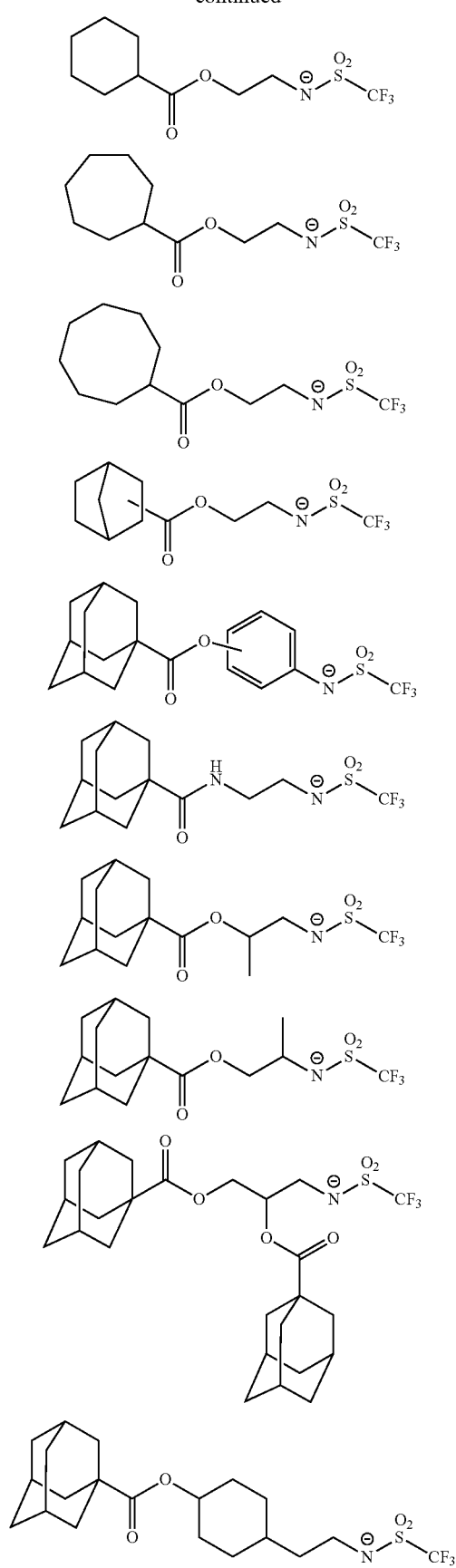
96
-continued
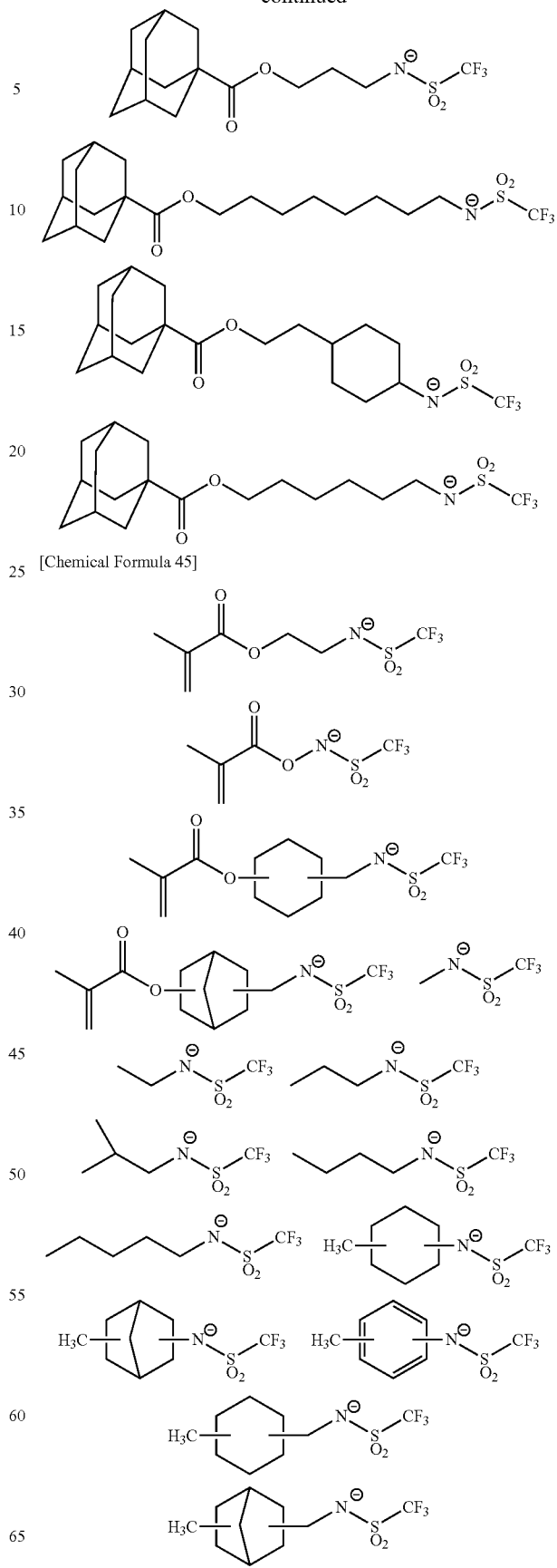
[Chemical Formula 45]

-continued

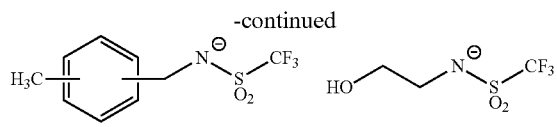

-Cation Moiety

In formula (d1-3), $M^{m+}$ is an organic cation having a valency of m, and is the same as defined for $M^{m+}$ in the aforementioned formula (d1-1).

As the component (d1-3), one type of compound may be used, or two or more types of compounds may be used in combination.

As the component (D1), one type of the aforementioned components (d1-1) to (d1-3), or at least two types of the aforementioned components (d1-1) to (d1-3) can be used in combination.

The amount of the component (D1) relative to 100 parts by weight of the component (A) is preferably within a range from 0.5 to 10 parts by weight, more preferably from 0.5 to 8 parts by weight, and still more preferably from 1 to 8 parts by weight.

When the amount of the component (D1) is at least as large as the lower limit of the above-mentioned range, excellent lithography properties and excellent resist pattern shape can be obtained. On the other hand, when the amount of the component (D1) is no more than the upper limit of the above-mentioned range, sensitivity can be maintained at a satisfactory level, and through-put becomes excellent.

The production methods of the components (d1-1) and (d1-2) are not particularly limited, and the components (d1-1) and (d1-2) can be produced by conventional methods.

The amount of the component (D1) relative to 100 parts by weight of the component (A) is preferably within a range from 0.5 to 10.0 parts by weight, more preferably from 0.5 to 8.0 parts by weight, and still more preferably from 1.0 to 8.0 parts by weight. When the amount of at least as large as the lower limit of the above-mentioned range, excellent lithography properties and excellent resist pattern shape can be obtained. On the other hand, when the amount of the component (D) is no more than the upper limit of the above-mentioned range, sensitivity can be maintained at a satisfactory level, and through-put becomes excellent.

(Component (D2))

The component (D) may contain a nitrogen-containing organic compound (D2) (hereafter, referred to as component (D2)) which does not fall under the definition of component (D1).

The component (D2) is not particularly limited, as long as it functions as an acid diffusion control agent, and does not fall under the definition of the component (D1). As the component (D2), any of the conventionally known compounds may be selected for use. Among these, an aliphatic amine, particularly a secondary aliphatic amine or tertiary aliphatic amine is preferable.

An aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group of no more than 12 carbon atoms (i.e., alkylamines or alkylalcoholamines), and cyclic amines.

Specific examples of alkylamines and alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decylamine, and tri-n-dodecylamine; and alkyl alcohol amines such as diethanolamine, triethanolamine, diisopropanolamine, triisopropanolamine, di-n-octanolamine, and tri-n-octanolamine. Among these, trialkylamines of 5 to 10 carbon atoms are preferable, and tri-n-pentylamine and tri-n-octylamine are particularly desirable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amines include tris(2-methoxymethoxyethyl)amine, tris {2-(2-methoxyethoxy) ethyl}amine, tris {2-(2-methoxyethoxymethoxy) ethyl}amine, tris{2-(1-methoxyethoxy)ethyl}amine, tris {2-(1-ethoxyethoxy)ethyl}amine, tris{2-(1-ethoxypropoxy) ethyl}amine, tris[2-{2-(2-hydroxyethoxy)ethoxy}ethyl] amine and triethanolamine triacetate, and triethanolamine triacetate is preferable.

Further, as the component (D2), an aromatic amine may be used.

Examples of aromatic amines include aniline, pyridine, 4-dimethylaminopyridine, pyrrole, indole, pyrazole, imidazole and derivatives thereof, as well as diphenylamine, triphenylamine, tribenzylamine, 2,6-diisopropylaniline and N-tert-butoxycarbonylpyrrolidine.

As the component (D2), one type of compound may be used alone, or two or more types may be used in combination.

The component (D2) is typically used in an amount within a range from 0.01 to 5.0 parts by weight, relative to 100 parts by weight of the component (A). When the amount of the component (D) is within the above-mentioned range, the shape of the resist pattern and the post exposure stability of the latent image formed by the pattern-wise exposure of the resist layer are improved.

As the component (D), one type of compound may be used, or two or more types of compounds may be used in combination.

When the resist composition of the present invention contains the component (D), the amount of the component (D) relative to 100 parts by weight of the component (A) is preferably within a range from 0.1 to 15 parts by weight, more preferably from 0.3 to 12 parts by weight, and still more preferably from 0.5 to 12 parts by weight. When the amount of the component (D) is at least as large as the lower limit of the above-mentioned range, various lithography properties (such as LWR) of the resist composition are improved. Further, a resist pattern having an excellent shape can be obtained. On the other hand, when the amount of the component (D) is no more than the upper limit of the above-mentioned range, sensitivity can be maintained at a satisfactory level, and through-put becomes excellent.

<Optional Components>
[Component (E)]

In the present invention, in the resist composition, for preventing any deterioration in sensitivity, and improving the resist pattern shape and the post exposure stability of the latent image formed by the pattern-wise exposure of the resist layer, at least one compound (E) (hereafter referred to as the component (E)) selected from the group consisting of an organic carboxylic acid, or a phosphorus oxo acid or derivative thereof can be added.

Examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid and phosphinic acid. Among these, phosphonic acid is particularly desirable.

Examples of oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters and phenylphosphinic acid.

As the component (E), one type may be used alone, or two or more types may be used in combination.

The component (E) is typically used in an amount within a range from 0.01 to 5.0 parts by weight, relative to 100 parts by weight of the component (A).

[Component (F)]

In the present invention, the resist composition of the present invention may contain a fluorine additive (hereafter, referred to as "component (F)") for imparting water repellency to the resist film.

As the component (F), for example, a fluorine-containing polymeric compound described in Japanese Unexamined Patent Application, First Publication No. 2010-002870, Japanese Unexamined Patent Application, First Publication No. 2010-032994, Japanese Unexamined Patent Application, First Publication No. 2010-277043, Japanese Unexamined Patent Application, First Publication No. 2011-13569, and Japanese Unexamined Patent Application, First Publication No. 2011-128226 can be used.

Specific examples of the component (F) include polymers having a structural unit (f1) represented by general formula (f1-1) shown below. As the polymer, a polymer (homopolymer) consisting of a structural unit (f1) represented by formula (f1-1) shown below; a copolymer of a structural unit (f-1) represented by formula (f1-1) shown below and the aforementioned structural unit (a1); and a copolymer of a structural unit (f1) represented by formula (f1-1) shown below, a structural unit derived from acrylic acid or methacrylic acid and the aforementioned structural unit (a1) are preferable. As the structural unit (a1) to be copolymerized with a structural unit (f1) represented by formula (f1-1) shown below, a structural unit derived from 1-ethyl-1-cyclooctyl (meth)acrylate or a structural unit represented by the aforementioned formula (a1-2-01) is preferable.

[Chemical Formula 46]

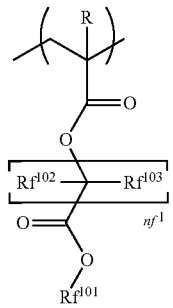

(f1-1)

In the formula, R is the same as defined above; $Rf^{102}$ and $Rf^{103}$ each independently represents a hydrogen atom, a halogen atom, an alkyl group of 1 to 5 carbon atoms, or a halogenated alkyl group of 1 to 5 carbon atoms, provided that $Rf^{102}$ and $Rf^{103}$ may be the same or different; $nf^1$ represents an integer of 1 to 5; and $Rf^{101}$ represents an organic group containing a fluorine atom.

In formula (f1-1), R is the same as defined above. As R, a hydrogen atom or a methyl group is preferable.

In formula (f1-1), examples of the halogen atom for $Rf^{102}$ and $Rf^{103}$ include a fluorine atom, a chlorine atom, a bromine atom and an iodine atom, and a fluorine atom is particularly desirable. Examples of the alkyl group of 1 to 5 carbon atoms for $Rf^{102}$ and $Rf^{103}$ include the same alkyl group of 1 to 5 carbon atoms as those described above for R, and a methyl group or an ethyl group is preferable. Specific examples of the halogenated alkyl group of 1 to 5 carbon atoms represented by $Rf^{102}$ or $Rf^{103}$ include groups in which part or all of the hydrogen atoms of the aforementioned alkyl groups of 1 to 5 carbon atoms have been substituted with halogen atoms. Examples of the halogen atom include a fluorine atom, a chlorine atom, a bromine atom and an iodine atom, and a fluorine atom is particularly desirable. Among these, as $Rf^{102}$ and $Rf^{103}$, a hydrogen atom, a fluorine atom or an alkyl group of 1 to 5 carbon atoms is preferable, and a hydrogen atom, a fluorine atom, a methyl group or an ethyl group is more preferable.

In formula (f1-1), $nf^1$ represents an integer of 1 to 5, preferably an integer of 1 to 3, and more preferably 1 or 2.

In formula (f1-1), $Rf^{101}$ represents an organic group containing a fluorine atom, and is preferably a hydrocarbon group containing a fluorine atom.

The hydrocarbon group containing a fluorine atom may be linear, branched or cyclic, and preferably has 1 to 20 carbon atoms, more preferably 1 to 15 carbon atoms, and most preferably 1 to 10 carbon atoms.

It is preferable that the hydrocarbon group having a fluorine atom has 25% or more of the hydrogen atoms within the hydrocarbon group fluorinated, more preferably 50% or more, and most preferably 60% or more, as the hydrophobicity of the resist film during immersion exposure is enhanced.

Among these, as $Rf^{101}$, a fluorinated hydrocarbon group of 1 to 5 carbon atoms is preferable, and a methyl group, —$CH_2$—$CF_3$, —$CH_2$—$CF_2$—$CF_3$, —$CH(CF_3)_2$, —$CH_2$—$CH_2$—$CF_3$, and —$CH_2$—$CH_2$—$CF_2$—$CF_2$—$CF_2$—$CF_3$ are most preferable.

The weight average molecular weight (Mw) (the polystyrene equivalent value determined by gel permeation chromatography) of the component (F) is preferably 1,000 to 50,000, more preferably 5,000 to 40,000, and most preferably 10,000 to 30,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory.

Further, the dispersity (Mw/Mn) of the component (F) is preferably 1.0 to 5.0, more preferably 1.0 to 3.0, and most preferably 1.2 to 2.5.

As the component (F), one type may be used alone, or two or more types may be used in combination.

The component (F) is typically used in an amount within a range from 0.5 to 10 parts by weight, relative to 100 parts by weight of the component (A).

In the present invention, if desired, other miscible additives can also be added to the resist composition. Examples of such miscible additives include additive resins for improving the performance of the resist film, dissolution inhibitors, plasticizers, stabilizers, colorants, halation prevention agents, and dyes.

[Component (S)]

In the present invention, the resist composition can be prepared by dissolving the materials for the resist composition in an organic solvent (hereafter, frequently referred to as "component (S)").

The component (S) may be any organic solvent which can dissolve the respective components to give a uniform solution, and one or more kinds of any organic solvent can be appropriately selected from those which have been conventionally known as solvents for a chemically amplified resist.

Examples thereof include lactones such as γ-butyrolactone; ketones such as acetone, methyl ethyl ketone (MEK), cyclohexanone, methyl-n-pentyl ketone (2-heptanone), methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene; and dimethylsulfoxide (DMSO).

These solvents can be used individually, or in combination as a mixed solvent.

Among these, PGMEA, PGME, γ-butyrolactone and EL are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2.

Specifically, when EL or cyclohexanone is mixed as the polar solvent, the PGMEA:EL or cyclohexanone weight ratio is preferably from 1:9 to 9:1, and more preferably from 2:8 to 8:2. Alternatively, when PGME is mixed as the polar solvent, the PGMEA:PGME weight ratio is preferably from 1:9 to 9:1, more preferably from 2:8 to 8:2, and still more preferably 3:7 to 7:3.

Further, as the component (S), a mixed solvent of at least one of PGMEA and EL with γ-butyrolactone is also preferable. The mixing ratio (former:latter) of such a mixed solvent is preferably from 70:30 to 95:5.

The amount of the component (S) is not particularly limited, and is appropriately adjusted to a concentration which enables coating of a coating solution to a substrate In general, the organic solvent is used in an amount such that the solid content of the resist composition becomes within the range from 1 to 20% by weight, and preferably from 2 to 15% by weight.

Firstly, a resist composition is applied to a neutralization film containing a surface treating agent using a spinner or the like, and a bake treatment (post applied bake (PAB)) is conducted at a temperature of 80 to 150° C. for 40 to 120 seconds, preferably 60 to 90 seconds, to form a resist film.

Following selective exposure of the thus formed resist film, either by exposure through a mask having a predetermined pattern formed thereon (mask pattern) using an exposure apparatus such as an ArF exposure apparatus, an electron beam lithography apparatus or an EUV exposure apparatus, or by patterning via direct irradiation with an electron beam without using a mask pattern, baking treatment (post exposure baking (PEB)) is conducted under temperature conditions of 80 to 150° C. for 40 to 120 seconds, and preferably 60 to 90 seconds.

Next, the resist film is subjected to a developing treatment.

The developing treatment is conducted using an alkali developing solution in the case of an alkali developing process, and a developing solution containing an organic solvent (organic developing solution) in the case of a solvent developing process.

After the developing treatment, it is preferable to conduct a rinse treatment. The rinse treatment is preferably conducted using pure water in the case of an alkali developing process, and a rinse solution containing an organic solvent in the case of a solvent developing process.

In the case of a solvent developing process, after the developing treatment or the rinsing, the developing solution or the rinse liquid remaining on the pattern can be removed by a treatment using a supercritical fluid.

After the developing treatment or the rinse treatment, drying is conducted. In the present invention, bake treatment (post bake) is preferably conducted following the developing. In this manner, a resist pattern can be obtained. In the present invention, the bake treatment after developing is preferably conducted at a temperature of 180° C. of higher, more preferably 190° C. or higher, and most preferably 200° C. or higher.

In the present invention, by conducting the bake treatment after developing at a high temperature of 180° C. or higher, it is considered that, in the step of forming a layer containing a block copolymer in which a plurality of polymers are bonded to cover the pattern and the neutralization film (this step is described later), resistance to the solvent for the layer containing a block copolymer may be imparted to the resist pattern.

By imparting resistance to the solvent for the layer containing a block copolymer to the resist pattern, it is considered that, it becomes possible to apply the block copolymer to an upper portion of the resist pattern, and the block copolymer may be phase-separated even on the resist pattern.

Further, by the bake treatment at a high temperature, the resist pattern appropriately flows. As a result, the height of the resist pattern 3 from the substrate surface (or the surface of the neutralization film) (described later) and the shape of the resist pattern 3 is optimized, and it is considered that a phase-separated structure of the block copolymer may be formed on the resist pattern 3.

The wavelength to be used for exposure is not particularly limited and the exposure can be conducted using radiation such as ArF excimer laser, KrF excimer laser, $F_2$ excimer laser, extreme ultraviolet rays (EUV), vacuum ultraviolet rays (VUV), electron beam (EB), X-rays, and soft X-rays. The resist composition of the present invention is effective to KrF excimer laser, ArF excimer laser, EB and EUV.

The exposure of the resist film can be either a general exposure (dry exposure) conducted in air or an inert gas such as nitrogen, or immersion exposure (immersion lithography).

In immersion lithography, the region between the resist film and the lens at the lowermost point of the exposure apparatus is pre-filled with a solvent (immersion medium) that has a larger refractive index than the refractive index of air, and the exposure (immersion exposure) is conducted in this state.

The immersion medium preferably exhibits a refractive index larger than the refractive index of air but smaller than the refractive index of the resist film to be exposed. The refractive index of the immersion medium is not particularly limited as long as it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is pertluorotributylamine (boiling point 174° C.).

As the immersion medium, water is preferable in terms of cost, safety, environment and versatility.

As an example of the alkali developing solution used in an alkali developing process, a 0.1 to 10% by weight aqueous solution of tetramethylammonium hydroxide (TMAH) can be given.

As the organic solvent contained in the organic developing solution used in a solvent developing process, any of the conventional organic solvents can be used which are capable of dissolving the component (A) (prior to exposure). Specific examples of the organic solvent include polar solvents such as ketone solvents, ester solvents, alcohol solvents, amide solvents and ether solvents, and hydrocarbon solvents.

If desired, the organic developing solution may have a conventional additive blended. Examples of the additive include surfactants. The surfactant is not particularly limited, and for example, an ionic or non-ionic fluorine and/or silicon surfactant can be used.

When a surfactant is added, the amount thereof based on the total amount of the organic developing solution is generally 0.001 to 5% by weight, preferably 0.005 to 2% by weight, and more preferably 0.01 to 0.5% by weight.

As the organic solvent contained in the organic solvent used for developing, any of the conventional organic solvents can be used which are capable of dissolving the base component (A) (prior to exposure) can be appropriately selected. Specific examples of the organic solvent include ketone solvents, ester solvents and nitrile solvents. As an ester solvent, butyl acetate is preferable. As a ketone solvent, methyl amyl ketone (2-heptanone) is preferable.

A ketone solvent is an organic solvent containing C—C(=O)—C within the structure thereof. An ester solvent is an organic solvent containing C—C(=O)—O—C within the structure thereof. An alcohol solvent is an organic solvent containing an alcoholic hydroxy group within the structure thereof, and an "alcoholic hydroxy group" refers to a hydroxy group bonded to a carbon atom of an aliphatic hydrocarbon group. An amide solvent is an organic solvent containing an amide group within the structure thereof. An ether solvent is an organic solvent containing C—O—C within the structure thereof. Some organic solvents have a plurality of the functional groups which characterizes the aforementioned solvents within the structure thereof. In such a case, the organic solvent can be classified as any type of the solvent having the characteristic functional group. For example, diethylenegycol monomethylether can be classified as either an alcohol solvent or an ether solvent. A hydrocarbon solvent consists of a hydrocarbon, and does not have any substituent (atom or group other than hydrogen and carbon).

Specific examples of ketone solvents include 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonylalcohol, acetylcarbinol, acetophenone, methyl naphthyl ketone, isophorone, propylenecarbonate, γ-butyrolactone and methyl amyl ketone (2-heptanone).

Examples of ester solvents include methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate and propyl-3-methoxypropionate.

Examples of nitrile solvents include acetonitrile, propionitrile, valeronitrile, butyronitrile and the like.

If desired, the organic developing solution may have a conventional surfactant blended as an additive.

The developing treatment can be performed by a conventional developing method. Examples thereof include a method in which the substrate is immersed in the developing solution for a predetermined time (a dip method), a method in which the developing solution is cast up on the surface of the substrate by surface tension and maintained for a predetermined period (a puddle method), a method in which the developing solution is sprayed onto the surface of the substrate (spray method), and a method in which the developing solution is continuously ejected from a developing solution ejecting nozzle while scanning at a constant rate to apply the developing solution to the substrate while rotating the substrate at a constant rate (dynamic dispense method).

The rinse treatment using a rinse liquid (washing treatment) can be conducted by a conventional rinse method. Examples of the rinse method include a method in which the rinse liquid is continuously applied to the substrate while rotating it at a constant rate (rotational coating method), a method in which the substrate is immersed in the rinse liquid for a predetermined time (dip method), and a method in which the rinse liquid is sprayed onto the surface of the substrate (spray method).

Furthermore, in the present invention, a guide pattern may be formed by nanoimprint lithography. Nanoimprint lithography is a method in which a mold having a desired pattern formed is pressed on a base having a resin layer on the surface thereof, so as to transfer the mold pattern on the resin layer.

Examples of the method of forming a guide pattern by nanoimprint include methods described in Japanese Unexamined Patent Application, First Publication No. 2007-072374, Japanese Unexamined Patent Application, First Publication No. 2007-329276 and Japanese Unexamined Patent Application, First Publication No. 2008-246876.

<<Method of Forming Pattern>>

A second aspect of the present invention is a method of forming a pattern containing a block copolymer, the method including: a step of forming a layer containing a block copolymer having a plurality of blocks bonded and a purity of 98% or more, a step of phase-separating the layer containing the block copolymer, and a step of selectively removing a phase of at least one block of the plurality of blocks constituting the block copolymer from the layer containing the block copolymer.

In the method of forming a pattern according to the second aspect, prior to the [step of forming a layer containing a block copolymer having a plurality of blocks bonded and a purity of 98% or more on a substrate], it is preferable to conduct the [step of applying a neutralization film to a substrate to form a layer of the neutralization film] and/or the [guide pattern formation step].

In the method of forming a pattern according to the second aspect, the step of forming a guide pattern may be conducted prior to or after the [step of applying a neutralization film to a substrate to form a layer of the neutralization film], and preferable after the [step of applying a neutralization film to a substrate to form a layer of the neutralization film].

In the method of forming a pattern according to the second aspect, the [step of forming a layer containing a block copolymer having a plurality of blocks bonded and a purity of 98% or more on a substrate], the [step of phase-separating a layer containing a block copolymer], the [step of applying a neutralization film to a substrate to form a layer of the neutralization film] and the [guide pattern formation step] are the same as defined for the first aspect described above.

The method of forming a pattern according to the second aspect includes a [step of selectively removing a phase of at least one block of the plurality of blocks constituting the block copolymer from the layer containing the block copolymer].

In the present embodiment, after the [step of phase-separating a layer containing a block copolymer], is preferable to form a pattern by selectively removing a phase of at least one block of the plurality of blocks constituting the block copolymer from the layer containing the block copolymer.

Specifically, for example, after forming a phase-separated structure, from the layer containing a block copolymer on the substrate, at least a portion of the block within the $P_B$ block phase (phase 3a in FIG. 1) is selectively removed (decomposition into low molecules), so as to form a pattern. By selectively removing a portion of the block $P_B$ in advance, the solubility in a developing solution can be enhanced. As a result, the phase constituted of the block $P_B$ can be more reliably removed by selective removing than the phase constituted of the block $P_A$.

The selective removal treatment is not particularly limited, as long as it is a treatment capable of decomposing and removing the $P_B$ block without affecting the $P_A$ block. The selective removal treatment can be appropriately selected from any methods for removing a resin film, depending on the types of the $P_A$ block and the $P_B$ block. Further, when a neutralization film is formed on the surface of the substrate in advance, the neutralization film is removed together with the phase of the $P_B$ block. Examples of the removal treatment include an oxygen plasma treatment, an ozone treatment, a UV irradiation treatment, a heat decomposition treatment and a chemical decomposition treatment.

The substrate having a pattern formed by the phase-separation of the layer containing the block copolymer as described above may be used as it is, or a further heat treatment may be conducted to modify the shape of the polymeric nano structure on the substrate. The heat treatment is preferably conducted at a temperature at least as high as the glass transition temperature of the block copolymer used and lower than the heat decomposition temperature. Further, the heat treatment is preferably conducted in a low reactive gas such as nitrogen.

<<Method of Forming Fine Pattern>>

A third aspect of the present invention is a method of forming a fine pattern, the method including an etching step in which etching of a substrate is conducted using a pattern formed by the method of the second aspect as a mask.

[Etching Step]

The etching step is a step in which etching of the substrate is conducted using the pattern formed by the phase-separated structure as a mask.

The etching method is not particularly limited, but is preferably dry etching, more preferably oxygen ($O_2$) plasma etching or etching using $CF_4$ gas, $CHF_3$ gas or $Ar/CF_4$ gas in terms of efficiency. Among these examples, oxygen plasma etching is preferable.

The conditions of dry etching are not particularly limited, and can be appropriately selected depending on the material of the pattern formed by the phase-separated structure, and the height of the pattern from the substrate surface. For example, in the case of using oxygen plasma treatment, the pressure during the oxygen plasma treatment is preferably 1.33 to 66.5 Pa (10 to 50 mtorr), and more preferably 13.3 to 26.6 Pa (100 to 200 mtorr). Further, the plasma power during the oxygen plasma treatment is preferably 5 to 500 W, and more preferably 5 to 50 W. Furthermore, the treatment time during the oxygen plasma treatment is preferably 1 to 100 seconds, and more preferably 2 to 60 seconds. Furthermore, the oxygen plasma treatment temperature is preferably −30 to 300° C., more preferably 0 to 100° C., and most preferably room temperature (5 to 40° C.). The plasma apparatus usable in the oxygen plasma treatment is not particularly limited, and for example, PE-2000 Plasma etcher (manufactured by South Bay Technology, USA) may be used.

According to the present invention, a pattern with reduced pattern defects (e.g., a hole pattern with improved CDU and open area ratio; and a line pattern with improved LWR) can be formed. The reason for this is presumed that, by using a block copolymer having a plurality of blocks bonded and a purity of 98% or more, impurities which cause pattern defects (e.g., residue of blocks constituting the block copolymer, and by-products generated in the preparation of the block copolymer) are reduced.

EXAMPLES

The present invention will be described more specifically with reference to the following examples, although the scope of the present invention is by no way limited by these examples.

[Preparation of Block Copolymer (1)]

<PS-PMMA Block Copolymers 1 to 4>

A PS-PMMA block copolymer was purified by washing with cyclohexane the number of times indicated in Table 1, so as to obtain PS-PMMA block copolymers 1 to 4 (hereafter, referred to as "BCP 1 to 4"). The purity of the block copolymer after the purification was determined by liquid chromatography.

TABLE 1

| | Number of purification | Purity (%) | PS/PMMA | Mn | PDI |
|---|---|---|---|---|---|
| BCP1 | 0 | 95.4 | 72.8/27.2 | 87900 | 1.06 |
| BCP2 | 1 | 97.5 | 72.3/27.7 | 90600 | 1.04 |
| BCP3 | 2 | 98.3 | 71.8/28.2 | 93300 | 1.03 |
| BCP4 | 3 | 99.2 | 71.4/28.6 | 96000 | 1.02 |

<POSS-PMMA Block Copolymers 5 to 8>

A POSS-PMMA block copolymer shown below was purified by washing with methanol the number of times indicated in Table 2, so as to obtain POSS-PMMA block copolymers 5 to 8 (hereafter, referred to as "BCP 5 to 8"). The purity of the block copolymer after the purification was determined by liquid chromatography.

[Chemical Formula 47]

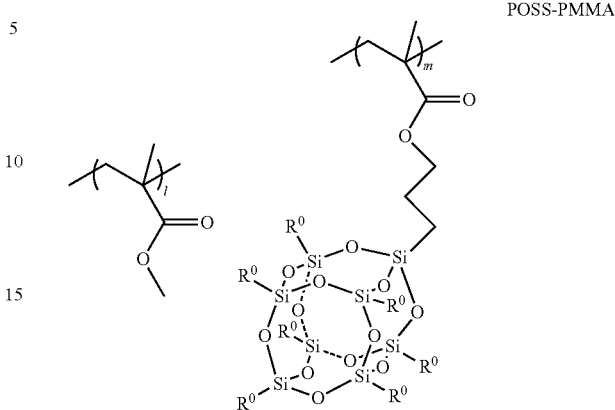

POSS-PMMA

TABLE 2

| | Number of purification | Purity (%) | l/m | Mn | PDI |
|---|---|---|---|---|---|
| BCP5 | 0 | 95.4 | 79.9/20.1 | 17200 | 1.07 |
| BCP6 | 1 | 97.5 | 79.5/20.5 | 17600 | 1.05 |
| BCP7 | 2 | 98.2 | 79.3/20.7 | 18000 | 1.04 |
| BCP8 | 3 | 99.2 | 79.1/20.9 | 18900 | 1.04 |

Examples 1 and 2, Comparative Examples 1 and 2

To a silicon substrate, as an undercoat agent, a resin composition (a copolymer of styrene/3,4-epoxycyclohexyl-methane methacrylate/propyltrimethoxysilane methacrylate=88/17/5 with Mw=43, 400 and Mw/Mn=1.77) adjusted to a concentration of 0.5 to 1.0% by weight with PGMEA was applied using a spinner, followed by baking at 250° C. for 1 minute and dried, thereby forming a layer of the undercoat agent with a film thickness of 10 nm on the substrate.

Subsequently, a BCP shown in Table 1 was spin-coated on the silicon substrate under conditions for obtaining a film thickness of 20 nm. Thereafter, a heat treatment was conducted at 240° C. for 60 seconds while flowing nitrogen, thereby forming a phase-separated structure.

The substrate having the phase-separated structure formed was subjected to an oxygen plasma treatment (200 mL/min, 40 Pa, 40° C., 200 W, 20 seconds) using TCA-3822 (manufactured by Tokyo Ohka Kogyo Co., Ltd.) so as to selectively remove the PMMA phase. The surface of the obtained substrate was observed using a scanning electron microscope SU8000 (manufactured by Hitachi High-Technologies).

As a result, in Examples 1 and 2 and Comparative Examples 1 and 2, a hole pattern having a hole diameter of 22 nm was formed.

[Evaluation of In-Plane Uniformity (CDU) of Pattern Size]

With respect to each CH pattern obtained above, 100 holes in the CH pattern were observed from the upper side thereof using a measuring scanning electron microscope (SEM) (product name: S-9380, manufactured by Hitachi High-Technologies Corporation; acceleration voltage: 300V), and the hole diameter (nm) of each hole was measured. From the results, the value of 3 times the standard deviation G (i.e., 3G) was determined. The results are indicated under "CDU (nm)" in Table 3.

The smaller the thus determined 36 value is, the higher the level of the dimension uniformity (CD uniformity) of the plurality of holes formed in the resist film.

Further, with respect to a plurality of guide holes constituting the hole pattern, the ratio of guide holes formed with a satisfactory circular hole was determined as the open area ratio of holes. The results are shown in Table 3.

TABLE 3

| | BCP | CDU (nm) | Open area ratio (%) |
|---|---|---|---|
| Example 1 | BCP3 | 4.0 | 85 |
| Example 2 | BCP4 | 3.8 | 98 |
| Comparative Example 1 | BCP1 | 4.7 | 72 |
| Comparative Example 2 | BCP2 | 4.5 | 76 |

Examples 3 and 4, Comparative Examples 3 and 4

100 Parts by weight of polymeric compound (A) shown below, 10.00 parts by weight of compound (13) shown below, 1.2 parts by weight of tripentylamine, 2.0 parts by weight of salicylic acid and 3.0 parts by weight of fluorine-containing polymeric compound (F) were mixed and dissolved in propylene glycol monomethyl ether acetate (PGMEA) to obtain a solid content of 5% by weight, thereby preparing a resist composition.

An organic anti-reflection film composition (product name: ARC29, manufactured by Brewer Science Ltd.) was applied to an 8-inch silicon wafer using a spinner, and the composition was then baked on a hot plate at 205° C. for 60 seconds, thereby forming an organic anti-reflection film having a film thickness of 82 nm.

Then, the resist composition obtained above was applied to the undercoat agent using a spinner, and was then prebaked (PAB) on a hotplate at 85° C. for 60 seconds and dried, thereby forming a resist film having a film thickness of 50 nm.

Subsequently, the resist film was selectively irradiated with an ArF excimer laser (193 nm) through a mask pattern (6% half tone), using an exposure apparatus NSR-S609B (manufactured by Nikon Corporation, NA (numerical aperture)= 1.07, 2/3 annular illumination).

Next, post exposure bake (PEB) was conducted at 115° C. for 60 seconds, and a negative-tone development was conducted at 23° C. for 20 seconds using butyl acetate, followed by drying by shaking.

As a result, a trench guide pattern with a width of 70 nm was formed.

[Chemical Formula 48]

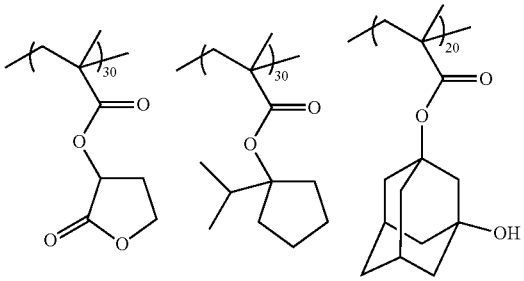

Polymeric compound (A)

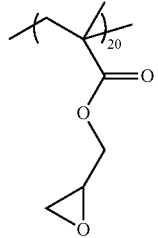

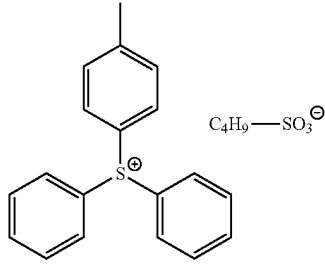

Compound (B)

Flourine-containing polymeric compound (F)

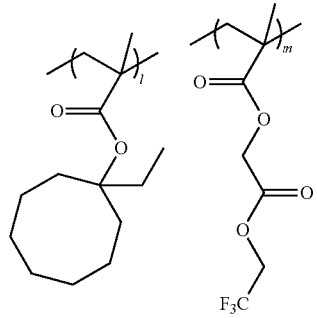

l/m = 77/23 (molar ratio), Mw = 23,100, Mw/Mn = 1.78

Subsequently, BCP 5 to 8 shown in Table 2 was spin-coated on the silicon substrate having the resist pattern formed thereon under conditions for obtaining a film thickness of 15 nm.

Thereafter, a heat treatment was conducted at 180° C. for 1 hour while flowing nitrogen, thereby forming a phase-separated structure. The substrate having the phase-separated structure formed was subjected to an oxygen plasma treatment (200 mL/min, 40 Pa, 40° C., 200 W, 20 seconds) using TCA-3822 (manufactured by Tokyo Ohka Kogyo Co., Ltd.) so as to selectively remove the PMMA phase. The surface of the obtained substrate was observed using a scanning electron microscope SU8000 (manufactured by Hitachi High-Technologies).

As a result, in Examples 3 and 4 and Comparative Examples 3 and 4, a 1:1 line and space pattern (LS pattern) having a line width of 9 nm and a pitch of 18 nm was formed.

[Evaluation of Line Width Roughness (LWR)]

With respect to each of the above SL patterns, the space width at 400 points in the lengthwise direction of the space were measured using a measuring scanning electron microscope (SEM) (product name: S-9380, manufactured by Hitachi High-Technologies Corporation; acceleration voltage: 300V). From the results, the value of 3 times the standard deviation s (i.e., 3 s) was determined, and the average of the 3 s values at 400 points was calculated as a yardstick of LWR. The results are shown in Table 4.

The smaller this 3 s value is, the lower the level of roughness of the line width, indicating that an SL pattern with a uniform width was obtained.

TABLE 4

|  | BCP | LWR (nm) |
|---|---|---|
| Example 3 | BCP7 | 3.3 |
| Example 4 | BCP8 | 3 |
| Comparative Example 3 | BCP5 | 4.6 |
| Comparative Example 4 | BCP6 | 4 |

<PTMSS-b-PMMA Block Copolymers 9 to 12>

A PTMSS-B-PMMA [poly(4-trimethylsilylstyrene)-b-polymethylmethacrylate] block copolymer shown below was purified by washing with cyclohexane the number of times indicated in Table 5, so as to obtain PTMSS-b-PMMA block copolymers 9 to 12 (hereafter, referred to as "BCP 9 to 12"). The purity of the block copolymer after the purification was determined by liquid chromatography.

[Chemical Formula 49]

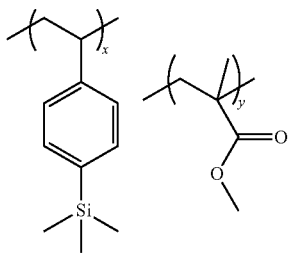

TABLE 5

|  | Number of purification | Purity (%) | x/y | Mn | PDI |
|---|---|---|---|---|---|
| BCP9 | 0 | 94.8 | 65.0/35.0 | 19100 | 1.06 |
| BCP10 | 1 | 96.9 | 63.6/36.4 | 18700 | 1.04 |
| BCP11 | 2 | 98.1 | 62.9/37.1 | 18000 | 1.03 |
| BCP12 | 3 | 99.3 | 62.1/37.9 | 17500 | 1.02 |

<PS-b-PLA Block Copolymers 13 to 16>

A PS-b-PLA (polystyrene-b-polylactic acid) block copolymer was purified by washing with cyclohexane the number of times indicated in Table 6, so as to obtain PS-b-PLA block copolymers 13 to 16 (hereafter, referred to as "BCP 13 to 16"). The purity of the block copolymer after the purification was determined by liquid chromatography.

[Chemical Formula 50]

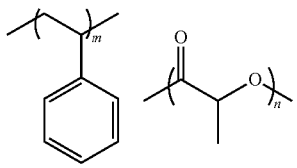

TABLE 6

|  | Number of purification | Purity (%) | m/n | Mn | PDI |
|---|---|---|---|---|---|
| BCP13 | 0 | 95.2 | 53.8/46.2 | 13800 | 1.08 |
| BCP14 | 1 | 96.5 | 53.1/46.9 | 13100 | 1.06 |
| BCP15 | 2 | 98.2 | 52.8/47.2 | 12500 | 1.04 |
| BCP16 | 3 | 99.8 | 51.8/48.2 | 12000 | 1.02 |

Examples 5 and 6, Comparative Examples 5 and 6

To a silicon substrate, as an undercoat agent, a resin composition (a copolymer of styrene/3,4-epoxycyclohexylmethane methacrylate/propyltrimethoxysilane methacrylate=88/17/5 with Mw=43, 400 and Mw/Mn=1.77) adjusted to a concentration of 0.5 to 1.0% by weight with PGMEA was applied using a spinner, followed by baking at 250° C. for 1 minute and dried, thereby forming a layer of the undercoat agent with a film thickness of 10 nm on the substrate.

Subsequently, a BCP shown in Table 5 was spin-coated on the silicon substrate under conditions for obtaining a film thickness of 15 nm. Thereafter, a heat treatment was conducted at 200° C. for 1 hour while flowing nitrogen, thereby forming a phase-separated structure. The substrate having the phase-separated structure formed was subjected to an oxygen plasma treatment (200 mL/min, 40 Pa, 40° C., 200 W, 20 seconds) using TCA-3822 (manufactured by Tokyo Ohka Kogyo Co., Ltd.) so as to selectively remove the PMMA phase. The surface of the obtained substrate was observed using a scanning electron microscope SU8000 (manufactured by Hitachi High-Technologies).

As a result, in Examples 5 and 6 and Comparative Examples 5 and 6, a hole pattern having a hole diameter of 22 nm was formed.

[Evaluation of In-Plane Uniformity (CDU) of Pattern Size]

With respect to the above CH patterns, the CDU and the open area ratio were evaluated in the same manner as in Examples 1 and 2 and Comparative Examples 1 and 2. The results are shown in Table 7.

TABLE 7

|  | BCP | CDU (nm) | Open area ratio (%) |
|---|---|---|---|
| Example 5 | BCP11 | 3.8 | 87 |
| Example 6 | BCP12 | 3.2 | 98 |
| Comparative Example 5 | BCP9 | 4.9 | 73 |
| Comparative Example 6 | BCP10 | 4.4 | 78 |

Examples 7 and 8, Comparative Examples 7 and 8

A trench guide pattern with a width of 70 nm was formed on a substrate in the same manner as in Examples 3 and 4 and Comparative Examples 3 and 4.

Subsequently, BCP 13 to 16 shown in Table 6 was spin-coated on the silicon substrate having the resist pattern formed thereon under conditions for obtaining a film thickness of 15 nm.

Thereafter, a heat treatment was conducted at 150° C. for 3 hours while flowing nitrogen, thereby forming a phase-separated structure. The substrate having the phase-separated structure formed was subjected to an oxygen plasma treatment (200 mL/min, 40 Pa, 40° C., 200 W, 20 seconds) using TCA-3822 (manufactured by Tokyo Ohka Kogyo Co., Ltd.) so as to selectively remove the PMMA phase. The surface of the obtained substrate was observed using a scanning electron microscope SU8000 (manufactured by Hitachi High-Technologies).

As a result, in Examples 7 and 8 and Comparative Examples 7 and 8, a 1:1 line and space pattern (LS pattern) having a line width of 9 nm and a pitch of 18 nm was formed.

[Evaluation of Line Width Roughness (LWR)]

With respect to the above LS patterns, LWR was evaluated in the same manner as in Examples 3 and 4 and Comparative Examples 3 and 4. The results are shown in Table 8.

TABLE 8

|  | BCP | LWR (nm) |
| --- | --- | --- |
| Example 7 | BCP15 | 3.0 |
| Example 8 | BCP16 | 2.6 |
| Comparative Example 7 | BCP13 | 4.3 |
| Comparative Example 8 | BCP14 | 3.7 |

As seen from the results shown above, by using a block copolymer having a purity of 98% or more, a pattern with reduced pattern defects could be formed.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method of forming a structure containing a phase-separated structure, the method comprising:
   purifying a block copolymer to a purity of 98% or more by washing the block copolymer with an alcohol or a saturated hydrocarbon at least twice,
   forming a layer containing the block copolymer on a substrate, and
   phase-separating the layer containing the block copolymer, wherein the block copolymer is at least one member selected from the group consisting of:
   a block copolymer consisting of a structural unit having an aromatic group and a block of a structural unit derived from an (α-substituted) acrylate ester;
   a block copolymer consisting of a block of a structural unit having an aromatic group and a block of a structural unit derived from lactic acid; and
   a block copolymer consisting of a block of a structural unit containing a polyhedral oligomeric silsesquioxane structure and a block of a structural unit derived from an (α-substituted) acrylate ester.

2. The method according to claim 1, which further comprises, prior to forming a layer containing the block copolymer, applying a neutralization film to a substrate to form a layer of the neutralization film.

3. The method according to claim 1, which further comprises, prior to forming a layer containing the block copolymer, forming a guide pattern.

4. The method according to claim 2, which further comprises, prior to forming a layer containing a block copolymer and after applying a neutralization film, a step of forming a guide pattern.

5. The method according to claim 1, wherein the block copolymer has a purity of 99% or more.

6. The method according to claim 1, further comprising:
   selectively removing a phase of at least one block of the plurality of blocks constituting the block copolymer from the layer containing the block copolymer, so as to form a pattern of the layer containing the block copolymer.

7. The method according to claim 6, which further comprises, prior to forming a layer containing a block copolymer, applying a neutralization film to a substrate to form a layer of the neutralization film.

8. The method according to claim 6, which further comprises, prior to forming a layer containing the block copolymer, forming a guide pattern.

9. The method according to claim 7, which further comprises, prior to forming a layer containing the block copolymer and applying a neutralization film, forming a guide pattern.

10. The method according to claim 6, wherein the block copolymer has a purity of 99% or more.

11. The method according to claim 6, further comprising:
    etching the substrate using the pattern formed of the layer containing the block copolymer.

* * * * *